(12) United States Patent
Mazur et al.

(10) Patent No.: US 10,254,478 B2
(45) Date of Patent: Apr. 9, 2019

(54) INTEGRATED IMPEDANCE-MATCHED PHOTONIC ZERO-INDEX METAMATERIALS

(71) Applicant: President And Fellows of Harvard College, Cambridge, MA (US)

(72) Inventors: Eric Mazur, Concord, MA (US); Yang Li, Somerville, MA (US); Orad Reshef, Ottawa (CA); Marko Loncar, Cambridge, MA (US); Shota Kita, Cambridge, MA (US); Philip Alejandro Munoz, Cambridge, MA (US); Daryl Vulis, Cambridge, MA (US)

(73) Assignee: President And Fellows Of Harvard College, Cambridge, MA (US)

( * ) Notice: Subject to any disclaimer, the term of this patent is extended or adjusted under 35 U.S.C. 154(b) by 0 days.

(21) Appl. No.: 15/223,680

(22) Filed: Jul. 29, 2016

(65) Prior Publication Data

US 2017/0160473 A1    Jun. 8, 2017

Related U.S. Application Data

(63) Continuation-in-part of application No. PCT/US2015/014105, filed on Feb. 2, 2015.
(Continued)

(51) Int. Cl.
*G02B 6/12* (2006.01)
*H01S 5/18* (2006.01)
(Continued)

(52) U.S. Cl.
CPC ........... *G02B 6/1225* (2013.01); *G02B 1/005* (2013.01); *G02B 1/007* (2013.01); *G02B 6/136* (2013.01); *H01S 5/105* (2013.01); *H01S 5/183* (2013.01)

(58) Field of Classification Search
USPC .......................................................... 385/14
See application file for complete search history.

(56) References Cited

U.S. PATENT DOCUMENTS 6,597,851 B2 * 7/2003 Johnson ................ B82Y 20/00
257/21
7,689,068 B1 * 3/2010 Wang ..................... B82Y 20/00
385/129
(Continued)

FOREIGN PATENT DOCUMENTS

WO    2013191745 A1    12/2013

OTHER PUBLICATIONS

Pendry et al., "Magnetism from conductors and enhanced nonlinear phenomena," IEEE Transactions on Microwave Theory and Techniques, vol. 47, pp. 2075-2084, Nov. 1999.
(Continued)

*Primary Examiner* — Akm E Ullah
(74) *Attorney, Agent, or Firm* — Reza Mollaaghababa; Thomas J. Engellenner; Pepper Hamilton LLP

(57) ABSTRACT

In one aspect, a composition of matter is disclosed, which comprises a photonic crystal comprising a plurality of 2D or 3D periodically repeating structures, where the structures are configured and arranged relative to one another such that the photonic crystal exhibits a Dirac cone at the center of the Brillouin zone of its reciprocal lattice, e.g., at one frequency in the optical regime. In some embodiments, the structures are formed of a dielectric material. In another aspect, a photonic structure is disclosed, which comprises a substrate, a plurality of periodically repeating cavities formed in said substrate, where the cavities are sized and arranged relative to one another such that said photonic structure exhibits a substantially vanishing refractive index (preferably a zero refractive index) for at least one wavelength of electromagnetic radiation propagating through said photonic structure,
(Continued)

for example, for at least one wavelength of the electromagnetic radiation in a range of about 400 nm to about 100 microns.

13 Claims, 44 Drawing Sheets

Related U.S. Application Data

(60) Provisional application No. 61/934,511, filed on Jan. 31, 2014.

(51) Int. Cl.
    *G02B 6/122*     (2006.01)
    *G02B 6/136*     (2006.01)
    *G02B 1/00*     (2006.01)
    *H01S 5/10*     (2006.01)
    *H01S 5/183*     (2006.01)

(56) References Cited

U.S. PATENT DOCUMENTS

| | | | | |
|---|---|---|---|---|
| 2002/0059897 | A1* | 5/2002 | John | B82Y 20/00 |
| | | | | 117/84 |
| 2006/0274189 | A1* | 12/2006 | Mouli | G02B 1/005 |
| | | | | 348/340 |
| 2013/0279850 | A1* | 10/2013 | Bravo-Abad | G02B 6/1225 |
| | | | | 385/31 |
| 2014/0064310 | A1* | 3/2014 | Chua | H01S 5/18 |
| | | | | 372/45.01 |
| 2018/0106933 | A1* | 4/2018 | Chanda | G02B 5/12 |

OTHER PUBLICATIONS

Pendry et al., "Controlling electromagnetic fields," Science, vol. 312, pp. 1780-1782, Jun. 2006.
Raghu et al., "Analogs of quantum-Hall-effect edge states in photonic crystals," Physical Review A, vol. 78, p. 033834, Sep. 2008.
Sakoda, "Universality of mode symmetries in creating photonic Dirac cones," Journal of the Optical Society of America B-Optical Physics, vol. 29, pp. 2770-2778, Oct. 2012.
Sakoda, "Double Dirac cones in triangular-lattice metamaterials," Optics Express, vol. 20, pp. 9925-9939, Apr. 2012.
Sakoda, "Dirac cone in two- and three-dimensional metamaterials," Optics Express, vol. 20, pp. 3898-3917, Feb. 2012.
Sakoda, "Proof of the universality of mode symmetries in creating photonic Dirac cones," Optics Express, vol. 20, pp. 25181-25194, Oct. 2012.
Schurig et al., J. B. Pendry, A. F. Starr, et al., "Metamaterial electromagnetic cloak at microwave frequencies," Science, vol. 314, pp. 977-980, Nov. 2006.
Sepkhanov et al., "Extremal transmission at the Dirac point of a photonic band structure," Physical Review A, vol. 75, p. 063813, Jun. 2007.
Shelby et al., "Experimental verification of a negative index of refraction," Science, vol. 292, pp. 77-79, Apr. 2001.
Shore et al., "Traveling waves on two- and three-dimensional periodic arrays of lossless scatterers," Radio Science, vol. 42, p. 40, Dec. 2007.
Silveirinha et al., "Tunneling of electromagnetic energy through subwavelength channels and bends using ε-near-zero materials," Physical Review Letters, vol. 97, p. 157403, Oct. 2006.
Simovski et al., "Local constitutive parameters of metamaterials from an effective-medium perspective," Physical Review B, vol. 75, p. 195111, May 2007.
Simovski, "On electromagnetic characterization and homogenization of nanostructured metamaterials," Journal of Optics, vol. 13, p. 013001, Jan. 2011.
Smith et al., "Limitations on subdiffraction imaging with a negative refractive index slab," Applied Physics Letters, vol. 82, pp. 1506-1508, Mar. 2003.
Smolyaninova et al., "Experimental observation of the trapped rainbow," Applied Physics Letters, vol. 96, p. 211121, May 2010.
Soref, "Silicon-based optoelectronics," Proceedings of the IEEE, vol. 81, pp. 1687-1706, Dec. 1991.
Soukoulis et al., "Optical metamaterials—more bulky and less lossy," Science, vol. 330, pp. 1633-1634, Dec. 2010.
Soukoulis et al., "Past achievements and future challenges in the development of three-dimensional photonic metamaterials," Nature Photonics, vol. 5, pp. 523-530, Sep. 2011.
Tsakmakidis et al., "'Trapped rainbow' storage of light in metamaterials," Nature, vol. 450, pp. 397-401, Nov. 2007.
Valentine et al., "Three-dimensional optical metamaterial with a negative refractive index," Nature, vol. 455, pp. 376-379, Sep. 2008.
Valentine et al., "An optical cloak made of dielectrics," Nature Materials, vol. 8, pp. 568-571, Jul. 2009.
Vesseur et al., "Experimental verification of n=0 structures for visible light," Physical Review Letters, vol. 110, p. 013902, Jan. 2013.
Vora et al., "Fabrication of disconnected three-dimensional silver nanostructures in a polymer matrix," Applied Physics Letters, vol. 100, p. 063120, Feb. 2012.
Vora et al., "A method to fabricate disconnected silver nanostructures in 3D," Journal of visualized experiments, vol. 69, p. e4399, 2012.
Wang et al., and S. Y. Zhu, "Realization of Dirac point with double cones in optics," Optics Letters, vol. 34, pp. 1510-1512, May 2009.
Wei, et al., "Acoustic total transmission and total reflection in zero-index metamaterials with defects," Applied Physics Letters, vol. 102, p. 174104, Apr. 2013.
Wu et al., "Effective medium theory for magnetodielectric composites: Beyond the long-wavelength limit," Physical Review B, vol. 74, p. 085111, Aug. 2006.
Wu et al., "Optical MEMS for lightwave communication," Journal of Lightwave Technology, vol. 24, pp. 4433-4454, Dec. 2006.
Wu et al., "Total reflection and cloaking by zero index metamaterials loaded with rectangular dielectric defects," Applied Physics Letters, vol. 102, p. 183105, May 2013.
Wyant, "Rotating diffraction grating laser-beam scanner," Applied Optics, vol. 14, pp. 1057-1058, May 1975.
Yang et al., "Electro-optic Kerr effect in polymer-stabilized isotropic liquid crystals," Applied Physics Letters, vol. 98, p. 023502, Jan. 2011.
Yariv et al., Optical Waves in Crystals: Propagation and Control of Laser Radiation. Hoboken, NJ: Wiley-Interscience, Chapter 6, pp. 155-219, 2003.
Yu et al., "Light propagation with phase discontinuities: generalized laws of peflection and refraction," Science, vol. 334, pp. 333-337, Oct. 2011.
Zhang, "Observing zifferbewegung for photons near the Dirac point of a two-dimensional photonic crystal," Physical Review Letters, vol. 100, p. 113903, Mar. 2008.
Zhao et al., "Experimental demonstration of isotropic negative permeability in a three-dimensional dielectric composite," Physical Review Letters, vol. 101, p. 027402, Jul. 2008.
Zhao et al., "Trapped rainbow effect in visible light left-handed heterostructures," Applied Physics Letters, vol. 95, p. 071111, Aug. 2009.
Zhao et al., "Mie resonance-based dielectric metamaterials," Materials Today, vol. 12, pp. 60-69, Dec. 2009.
International Search Report and Written Opinion received in PCT/US2015/014105, dated Nov. 18, 2015; 14 pages.
Alloatti et al., "42.7 Gbit/s electro-optic modulator in silicon technology. Opt Express. Jun. 6, 2011;19(12):11841-11851." (Abstract Only).
Alu et al., Dielectric Sensing in ε-near-zero narrow waveguide channels, Physical Review B, vol. 78, p. 045102, Jul. 2008.
Alu et al., Boosting Molecular Fluorescence with a Plasmonic Nanolaunche, Physical Review Letters, vol. 103, p. 043902, Jul. 2009.

(56) References Cited

OTHER PUBLICATIONS

Argyropoulos et al., "Boosting optical nonlinearities in epsilon-near-zero plasmonic channels," Physical Review B, vol. 85, p. 045129, Jan. 2012.
Balakrishnan et al., "Electro-optic polymers for high speed modulators," in IEEE/LEOS Benelux Chapter, Mons, 2005.
Cai et al., "Optical Cloaking with metamaterials," Naure Photonics, vol. 1, pp. 224-227, Apr. 2007.
Catchpole et al., "Plasmonic solar cells," Optics Express, vol. 16, pp. 21793-21800, Dec. 2008.
Chan et al., "Dirac dispersion and zero-index in two dimensional and three dimensional photonic and phononic systems," Progress in Electromagnetics Research B, vol. 44, pp. 163-190, 2012.
Chan et al., "Dirac dispersion in two-dimensional photonic crystals," Advances in OptoElectronics, vol. 2012, ID313984 pp. 1-11, Sep. 2012.
Chen et al., "Electromagnetic wave interactions with a metamaterial cloak," Physical Review Letters, vol. 99, p. 063903, Aug. 2007.
D'Aguanno et al., "Field localization and enhancement near the Dirac point of a finite defectless photonic crystal," Physical Review B, vol. 87, p. 085135, Feb. 2013.
Dekker et al., "Ultrafast nonlinear all-optical processes in silicon-on-insulator waveguides," Journal of Physics D-Applied Physics, vol. 40, pp. R249-R271, Jul. 2007.
Diem et al., "Transmission in the vicinity of the Dirac point in hexagonal photonic crystals," Physica B-Condensed Matter, vol. 405, pp. 2990-2995, Jul. 2010.
Edwards et al., "Experimental verification of epsilon-near-zero metamaterial coupling and energy squeezing using a microwave waveguide," Physical Review Letters, vol. 100, p. 033903, Jan. 2008.
Eleftheriades et al., "Planar negative refractive index media using periodically L-C loaded transmission lines," IEEE Transactions on Microwave Theory and Techniques, vol. 50, pp. 2702-2712, Dec. 2002.
Engheta, "Pursuing near-zero response," Science, vol. 340, pp. 286-287, Apr. 2013.
Fan et al., "Self-assembled plasmonic nanoparticle clusters," Science, vol. 328, pp. 1135-1138, May 2010.
Fang et al., "Sub-diffraction-limited optical imaging with a silver superlens," Science, vol. 308, pp. 534-537, Apr. 2005.
Gabrielli et al., "Silicon nanostructure cloak operating at optical frequencies," Nature Photonics, vol. 3, pp. 461-463, Aug. 2009.
Gan et al., ""Rainbow" trapping and releasing at telecommunication wavelengths," Physical Review Letters, vol. 102, p. 056801, Feb. 2009.
Ginn et al., "Realizing optical magnetism from dielectric metamaterials," Physical Review Letters, vol. 108, p. 097402, Feb. 2012.
Grbic et al., "Overcoming the diffraction limit with a planar left-handed transmission-line lens," Physical Review Letters, vol. 92, p. 117403, Mar. 2004.
Gu et al., "Giant and high-resolution beam steering using slow-light waveguide amplifier," Optics Express, vol. 19, pp. 22675-22683, Nov. 2011.
Guo et al., "Dirac point and cloaking based on honeycomb lattice photonic crystal," Applied Physics Express, vol. 6, p. 042003, Apr. 2013.
Haldane et al., "Possible realization of directional optical waveguides in photonic crystals with broken time-reversal symmetry," Physical Review Letters, vol. 100, p. 013904, Jan. 2008.
Hao et al., "Super-reflection and cloaking based on zero index metamaterial," Applied Physics Letters, vol. 96, p. 101109, Mar. 2010.
Holloway et al., "A double negative (DNG) composite medium composed of magnetodielectric spherical particles embedded in a matrix," IEEE Transactions on Antennas and Propagation, vol. 51, pp. 2596-2603, Oct. 2003.

Huang et al., "Dirac cones induced by accidental degeneracy in photonic crystals and zero-refractive-index materials," Nature Materials, vol. 10, pp. 582-586, Aug. 2011.
International Preliminary Report on Patentability received in PCT/US2015/014105, dated Aug. 11, 2016; 10 pages.
Iyer et al., "Multilayer negative-refractive-index transmission-line (NRI-TL) metamaterial free-space lens at X-band," IEEE Transactions on Antennas and Propagation, vol. 55, pp. 2746-2753, Oct. 2007.
Jacobsen et al., "Strained silicon as a new electro-optic material," Nature, vol. 441, pp. 199-202, May 2006.
Johnson et al., "Block-iterative frequency-domain methods for Maxwell's equations in a planewave basis," Optics Express, vol. 8, pp. 173-190, Jan. 2001.
Kurosaka, S. Iwahashi, Y. Liang, K. Sakai, E. Miyai, W. Kunishi, et al., "On-chip beam-steering photonic-crystal lasers," Nature Photonics, vol. 4, pp. 447-450, Jul. 2010.
Li et al., "Hiding under the carpet: a new strategy for cloaking," Physical Review Letters, vol. 101, p. 203901, Nov. 2008.
Li et al., "Traveling waves on three-dimensional periodic arrays of two different magnetodielectric spheres arbitrarily arranged on a simple tetragonal lattice," IEEE Transactions on Antennas and Propagation, vol. 60, pp. 2727-2739, Jun. 2012.
Li et al., "Effects of parameter variations on negative effective constitutive parameters of non-metallic metamaterials," Journal of Applied Physics, vol. 113, p. 063501, Feb. 2013.
Li, et al., "Selection rule for Dirac-like points in two-dimensional dielectric photonic crystals," Optics Express, vol. 21, pp. 7699-7711, Mar. 2013.
Liang et al., "Space-coiling metamaterials with double negativity and conical dispersion," Scientific Reports, vol. 3, p. 1614, Apr. 2013.
Liu, et al., "A high-speed silicon optical modulator based on a metal-oxide-semiconductor capacitor," Nature, vol. 427, pp. 615-618, Feb. 2004.
Liu, et al., "Experimental demonstration of electromagnetic tunneling through an epsilon-near-zero metamaterial at microwave frequencies," Physical Review Letters, vol. 100, p. 023903, Jan. 2008.
Liu, et al., "Three-dimensional photonic metamaterials at optical frequencies," Nature Materials, vol. 7, pp. 31-37, Jan. 2008.
Liu, et al., "Broadband ground-plane cloak," Science, vol. 323, pp. 366-369, Jan. 2009.
Liu et al., "Dirac cones at k=0 in acoustic crystals and zero refractive index acoustic materials," Applied Physics Letters, vol. 100, p. 071911, Feb. 2012.
Ma et al., "Experimental verification of supercoupling and cloaking using mu-near-zero materials based on a waveguide," Applied Physics Letters, vol. 103, p. 021908, Jul. 2013.
Martinu et al., "Plasma deposition of optical films and coatings: A review," Journal of Vacuum Science & Technology A, vol. 18, pp. 2619-2645, Nov.-Dec. 2000.
Matsuda et al., "Laser printer scanning system with a parabolic-mirror," Applied Optics, vol. 17, pp. 878-884, Mar. 1978.
Mei et al., "First-principles study of Dirac and Dirac-like cones in phononic and photonic crystals," Physical Review B, vol. 86, p. 035141, Jul. 2012.
Nguyen et al., "Total transmission and total reflection by zero index metamaterials with defects," Physical Review Letters, vol. 105, p. 233908, Dec. 2010.
Ochiai et al., "Photonic analog of graphene model and its extension: Dirac cone, symmetry, and edge states," Physical Review B, vol. 80, p. 155103, Oct. 2009.
Pendry, "Negative refraction makes a perfect lens," Physical Review Letters, vol. 85, pp. 3966-3969, Oct. 2000.
Pendry et al., "Extremely low frequency plasmons in metallic mesostructures," Phys. Rev. Lett., vol. 76, pp. 4773-4776, Jun. 1996.

\* cited by examiner

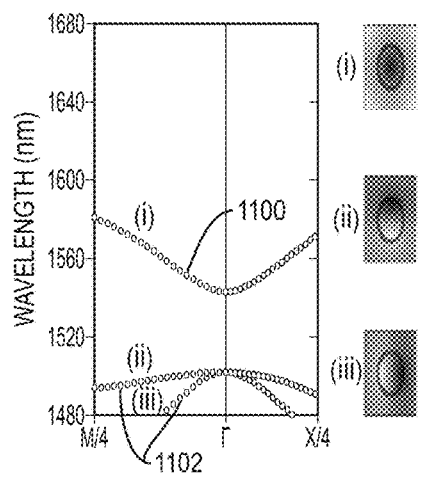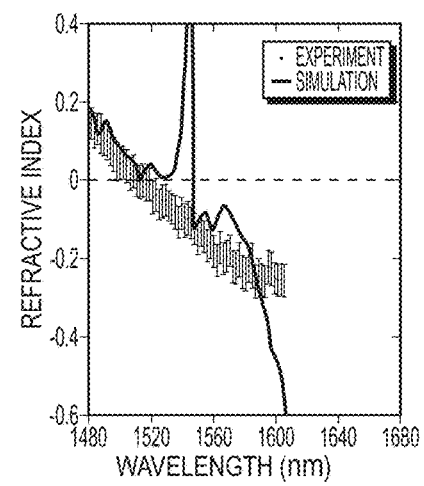
FIG. 11A   FIG. 11B
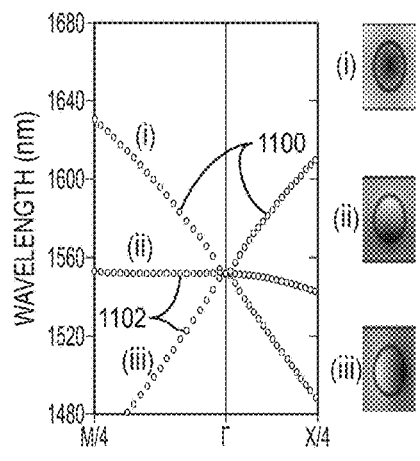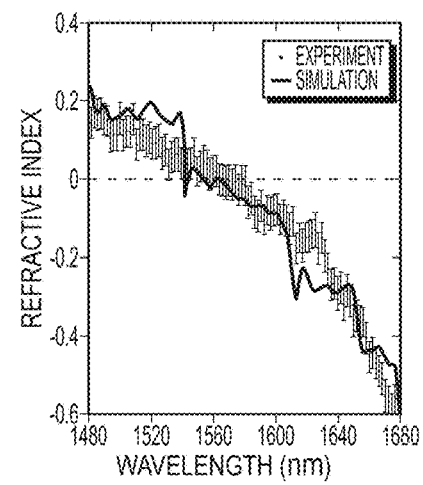
FIG. 11C   FIG. 11D
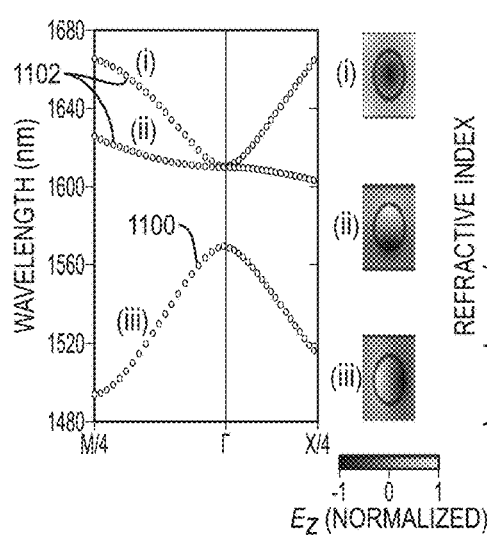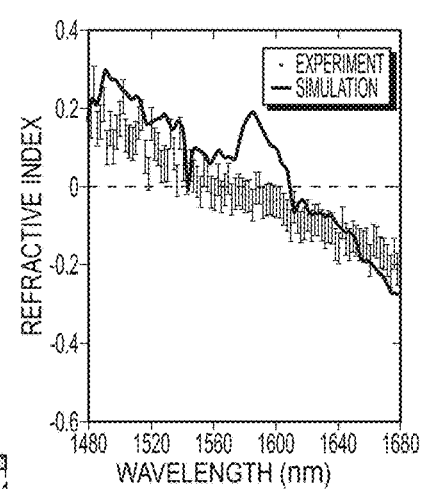
FIG. 11E   FIG. 11F TUNING BOTH a AND r SIMULTANEOUSLY

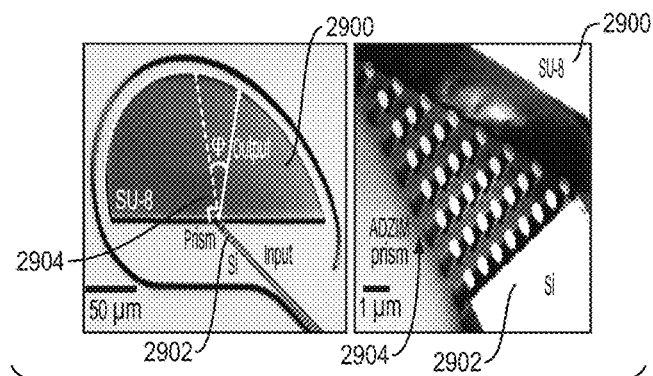 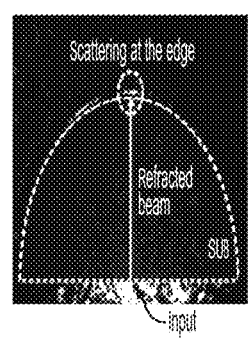
FIG. 30A  FIG. 30B
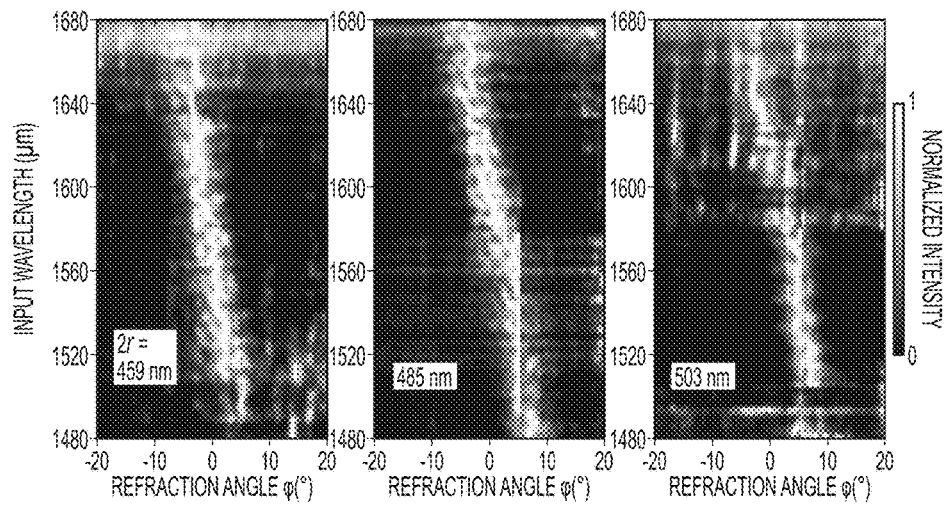
FIG. 30C
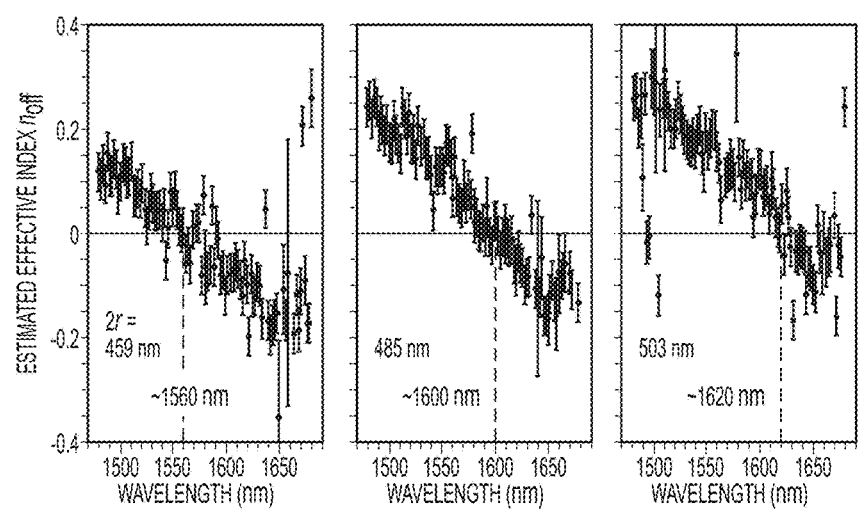
FIG. 30D

INTEGRATED IMPEDANCE-MATCHED PHOTONIC ZERO-INDEX METAMATERIALS

CROSS-REFERENCE TO RELATED APPLICATION

The present application claims the benefit of priority of International Application No. PCT/US2015/014105 entitled "Integrated Impedance-Matched Photonic Zero-Index Metamaterials," filed on Feb. 2, 2015, which in turn claims the benefit of priority of U.S. Provisional Application No. 61/934,511 filed Jan. 31, 2014, all of which are hereby incorporated by reference in their entirety.

FEDERALLY SPONSORED RESEARCH

This invention was made with Government support under grant DMR-1201976 awarded by National Science Foundation (NSF). The Government has certain rights in the invention.

BACKGROUND

The present invention relates generally to photonic crystals that exhibit a substantially vanishing refractive index and a finite impedance, and more particularly to photonic crystals that exhibit such properties for one or more frequencies in the optical regime.

The field of metamaterials has received a great deal of attention and has progressed rapidly over the last decade The earliest and most cited property of metamaterials, i.e., negative refractive index, has already been demonstrated in potential applications in superlens imaging and rainbow-trapping. Another exotic property, zero refractive index, can be employed in supercoupling and cloaking applications. For example, using an anisotropic positive refractive index from zero to one, a cloak can be built based on transformation optics.

At present, the negative/zero/positive refractive index is usually achieved by following well-established physical principles: 1) plasmonics; 2) metallic resonators; 3) periodically L-C loaded transmission lines; and 4) dielectric resonators.

For example, in some conventional metamaterials, to realize a zero refractive index for a specific wavelength $\lambda$, a periodic array of scatters is employed, each of which generates an electric or magnetic flux loop. The scatters are configured such that the flux loops are canceled by those of neighboring scatters due to multiple interferences, thus achieving $\varepsilon_{eff}=0$ or $\mu_{eff}=0$ effectively, resulting in a zero effective index ($n_{eff}=(\varepsilon_{eff}\cdot\mu_{eff})^{1/2}=0$). However, such structures exhibit infinite or zero impedance $(\mu_{eff}/\varepsilon_{eff})^{1/2}$ for the propagation of electromagnetic waves. As such, In electromagnetic waves cannot be coupled into such conventional zero-index metamaterials (ZIM) from free space or waveguide structures without implementing a specific impedance matching technique.

Thus, the conventional metamaterials can have certain shortcomings. For example, the negative (zero) refractive index provided by plasmonics, metallic, and Mie-resonance-based non-metallic metamaterials is usually associated with high losses and mismatched impedance. These drawbacks decrease the performance of those metamaterials dramatically so as to limit their potential applications.

Accordingly, there is a need for enhanced metamaterials exhibiting, e.g., zero or negative, indices of refraction, and concurrently exhibiting a finite impedance.

SUMMARY

In one aspect, a composition of matter is disclosed, which comprises a photonic crystal comprising a plurality of 2D or 3D periodically repeating structures, where the structures are configured and arranged relative to one another such that the photonic crystal exhibits a Dirac cone at the center of the Brillouin zone of its reciprocal lattice, e.g., at one frequency in the optical regime. In some embodiments, the structures are formed of a dielectric material.

In some embodiments, the repeating structures comprise a 2D arrangement of a plurality of pillars. In some embodiments, the pillars can comprise silicon. In some cases, the pillars are disposed within a resin, e.g., an SU-8 resin. In another embodiment, the repeating structures can comprise a 3D arrangement of metal (e.g., silver) domains distributed with a polymeric crystal.

In another aspect, an integrated photonic device is disclosed, which comprises a substrate, a photonic crystal disposed on said substrate, where the photonic crystal exhibits a Dirac cone at the center of the Brillouin zone of its reciprocal lattice, e.g., at a frequency in the optical regime. An input waveguide is disposed on the substrate, where the input waveguide includes an input port for receiving radiation (e.g., from an external source or an internal source, such as a laser, incorporated within the device) and an output port optically coupled to the photonic crystal for transmitting at least a portion of said received radiation to the photonic crystal. The photonic device further includes an output waveguide that is disposed on the substrate, where the output waveguide has an input port for receiving at least a portion of the radiation exiting the photonic crystal. The output port of the output waveguide can be configured for optical coupling to a downstream component of the photonic device.

In some embodiments, the substrate can comprise silicon. Further, in some cases, a layer of silicon oxide can be disposed on a top surface of the substrate to electrically insulate the components of the photonic device from the substrate.

In some embodiments of the integrated photonic device, the photonic crystal comprises a 2D arrangement of pillars. In some embodiments, the pillars can be disposed in a resin. By way of example, the pillars can be formed of silicon and the resin can be a resin commonly known as SU-8.

In some embodiments of the photonic integrated circuit in which the photonic crystal comprises a 2D arrangement of pillars, the input waveguide is configured to transmit the radiation into the photonic crystal in plane of said pillars. Further, the output waveguide can be configured to receive the radiation through the photonic crystal in plane of the pillars.

Embodiments of in-plane, on-chip, integrated photonic devices according to the present teachings can provide many advantages, including, for example: 1) such a planar photonic device can allow for light to experience the negative/zero/positive index over a long distance, as it propagates in a plane parallel to the substrate, which increases the interaction length and allows the rich physics of negative/zero/positive index and Dirac-cone to be fully leveraged; 2) such an in-plane photonic device can be implemented in a variety of different shapes so as to explore the abundant physics of negative/zero/positive index and Dirac-cone freely as well as to realize numerous on-chip devices; 3) such an integrated photonic device can be fabricated using standard planar processes over a large area with high fidelity; 4) such an in-plane photonic device can efficiently couple to optical waveguides to interface with standard integrated photonic circuits.

In another aspect, purely dielectric metamaterials are provided that exhibit a Dirac cone (or near Dirac-cone) at the center of the Brillouin zone of their reciprocal lattice, e.g., at a frequency in the optical regime. These metamaterials can provide many unique advantages: 1) they do not exhibit conduction losses because the structure is purely dielectric; 2) they exhibit low losses because the Dirac cone can be far away from the Mie resonance region; 3) the Dirac cone can provide simultaneously zero effective permittivity and permeability at a particular frequency. The simultaneous zero effective permittivity and permeability yields finite characteristic impedance, which can allow the metamaterial to provide good impedance-matching to free space and standard optical waveguides. In this manner, metamaterials exhibiting negative/zero/positive refractive index can be provided.

In a related aspect, methods of designing and fabricating Dirac-cone metamaterials demonstrating negative/zero/positive refractive index in the optical regime are provided. These metamaterials can exhibit exotic material properties and interesting physical phenomena, which can be employed in a variety of potential applications, such as electro-optic modulation, beam-steering, super-coupling, cloaking, surface-emitting lasers, phase-matching for nonlinear optics, rainbow-trapping, optical/quantum devices, energy sensing, biomedical sensing, and seismology.

Departing from well-established physical principles utilized conventionally for designing metamaterials, the present teachings provide in many embodiments negative/zero/positive refractive index metamaterials based on a Dirac cone at the center of the Brillouin zone of a photonic crystal, e.g., a purely dielectric photonic crystal. Some of the advantages of the present teachings are as follows:

Loss:

in contrast to plasmonics and metallic resonators, many embodiments of the Dirac-cone metamaterials according to the present teachings do not involve any metallic constituents. This avoids parasitic metallic losses, especially in the optical regime. Also, as opposed to dielectric resonators, which usually achieve the negative/zero/positive refractive index around the Mie resonance (FIG. 1), Dirac-cone metamaterials can obtain negative/zero/positive refractive index far away from the Mie resonance. Considering that the effective constitutive parameters of a dielectric composite usually show a peak of loss around the Mie resonance and very low losses at any other frequency (FIG. 1), the negative/zero/positive refractive index provided by Dirac-cone metamaterials can be accompanied by a very low loss.

Impedance Matching of Zero-Refractive-Index:

conventional metamaterials achieve zero-refractive-index by having either effective relative permittivity $\in_r^{eff}$ or effective relative permeability $\mu_r^{eff}$ that is equal or near zero. This corresponds to an effective characteristic impedance $\eta_{eff}$ of either infinity or zero, which results in impedance mismatch relative to free space and standard optical waveguides. On the other hand, because $\in_r^{eff}$ and $\mu_r^{eff}$ of Dirac-cone metamaterials according to the present teachings can approach zero simultaneously and linearly at the Dirac point (FIG. 5a), the impedance $\eta_{eff}$ of such a metamaterial has a finite value. This results in a good impedance match to free space and standard optical waveguides (See, e.g., FIG. 5d).

Feasibility in Optical Region:

The metamaterials according to the present teachings can be fabricated so as to obtain the desired refractive index, e.g., at one or more wavelengths in a range of about 400 nm to about 1 cm, e.g., in a range of about 400 nm to about 100 µm. For example, as discussed in more detail below, in some embodiments, a (two-dimensional) 2D Dirac-cone metamaterial can include a 2D square array of silicon pillars, which is easy to fabricate using standard planar processes (See, e.g., FIG. 3).

Isotropy:

Because the zero refractive index provided by Dirac-cone metamaterials is obtained at the Dirac point at the center of the Brillouin zone, it is isotropic. And, because the negative/positive refractive index of a Dirac-cone metamaterial is achieved in the vicinity of the Dirac point at the zone center, it is approximately isotropic.

Considering loss, impedance matching, feasibility and isotropy, the Dirac cone approach shows distinct advantages when compared with the well-established physical principles to achieve negative/zero/positive refractive index. By way of illustration, Table 1 below summarizes some of the advantages of the Dirac cone approach in accordance with the present teachings relative to conventional approaches employed for forming metamaterials:

TABLE 1

| Physical principles | Loss | Impedance matching of zero-refractive-index | Feasibility in optical regime | Isotropy |
| --- | --- | --- | --- | --- |
| Plasmonics | High | Poor | Good | Fair |
| Metallic resonators | High | Poor | Good | Poor |
| Periodically L-C loaded transmission lines | Low | Poor | Poor | Fair |
| Dielectric resonators | Medium | Poor | Poor | Good |
| Dirac cone | Low | Good | Good | Good |

In some embodiments, by tuning the radius and pitch of a photonic crystal that includes an array of dielectric pillars, a Dirac-cone can be formed at the center of the Brillouin zone. The photonic crystal can be a square array, a triangular array, or any other two dimensional (2D) or three-dimensional (3D) photonic crystal. The dielectric materials of the pillars can be silicon, silicon nitride, or any other dielectric materials. In many embodiments, the pillars are formed using a dielectric material that exhibits a real dielectric constant contrast relative to a medium surrounding the pillars that is greater than about 1. Since the effective wavelength of the photonic crystal approaches infinity at the center of the Brillouin zone, the photonic crystal can be treated as a homogeneous bulk metamaterial in the vicinity of the Dirac-point. The effective permittivity and permeability of the Dirac-cone metamaterials can approach zero simultaneously and linearly at the Dirac-point. Consequently, the effective impedance of such a metamaterial has a finite value, which provides good impedance matching to free-space and standard optical waveguides. Compared with other types of metamaterials, Dirac-cone metamaterials according to the present teachings have at least following advantages: 1) low loss; 2) good impedance matching to free space and standard optical waveguides; 3) feasibility of fabrication in optical regime.

As discussed in more detail below, a Dirac-cone metamaterial according to the present teachings can include silicon pillars disposed in an SU-8 resin matrix. In some embodiments, a metamaterial according to the present teachings can include a square array of silicon pillars disposed in an SU-8 matrix with gold mirrors disposed on top and bottom of the matrix. These structures can be formed as in-plane structures, which can provide at least the following benefits: 1) consistent unit cells; 2) ease of fabrication; 3) broad application in integrated on-chip optics.

The Dirac-cone metamaterials according to the present teachings can have a number of applications. For example, the zero-index of Dirac-cone metamaterials can be used to achieve phase-matching for nonlinear optics. In some embodiments in which a Dirac-cone metamaterial according to the present teachings is used as the propagation medium, the wave oscillations can cease in the metamaterial and all of the wavelets add up in-phase in all directions. By way of example, for four-wave mixing (inputs and output are at nearby wavelengths), a Dirac-cone metamaterial with a single Dirac-point, which shows zero index near the operating wavelength of the four-wave mixing, can be used. For second harmonic generation, where the input and output radiations are at quite different wavelengths, a Dirac-cone metamaterial with double Dirac-points, which shows zero-indices at the input and output wavelengths of the second harmonic generation, can be utilized.

Another application is for photonic crystal surface-emitting lasers (PCSELs). By replacing the quadratic-dispersion band edges of the regular PCSELs with the linear-dispersion bands provided by the Dirac-cone metamaterials, the mode spacing can be increased by order of magnitude and the distributed in-plane feedback can be eliminated. It paves the way to achieve larger-area and higher-power single-mode PCSELs. In another application, the Dirac-cone metamaterials according to the present teachings can be used for electro-optic modulation. Because the existence of a Dirac cone at the center of the Brillouin zone is very sensitive to the refractive indices of the constituents, the existence of the Dirac cone can be controlled by tuning refractive indices of one or more constituents of the metamaterial, e.g., the refractive indices of the silicon and SU-8 using an applied electric field. When the Dirac cone exists, the metamaterial can show a pass-band around the Dirac point, otherwise, a bandgap opens up around the wavelength of the original Dirac point. If the operating wavelength of the incident light is around the Dirac point, the applied electric field determines whether or not incident light is transmitted through the modulator.

By way of example, such an amplitude modulator can be used for data transmission, where transmitted light corresponds to a '1' bit while no light corresponds to a '0' bit. Because the existence of a Dirac cone at the center of the Brillouin zone is very sensitive to the refractive indices of the constituents, such a modulator has the potential to achieve an ultralow drive voltage. Further, in some embodiments, such a modulator can achieve a device footprint as small as 3×3 $\mu m^2$. In some embodiment, high electro-optic coefficient polymers can be employed to enhance the performance of such a modulator.

In another application, the metamaterials according to the present teachings can be employed to fabricate a zero-index coupler with in-phase outputs. By way of example, as discussed in more detail below, such a coupler can be designed by using a Dirac-cone metamaterial according to the present teachings as the waveguide and a 2D photonic bandgap structure as the side-wall. Such a coupler can operate around the wavelength of the Dirac-point to achieve zero-index. Such a coupler can have an arbitrary shape and can provide an in-phase output to all output channels.

In one aspect, a photonic structure is disclosed, which comprises a plurality of periodically repeating structures, said structures being configured and arranged relative to one another so as to form a photonic crystal exhibiting a Dirac cone at the center of the Brillouin zone of its reciprocal lattice for at least one wavelength in the optical regime. In some embodiments, the Dirac cone is at a wavelength in a range of about 400 nm to about 100 µm. In some embodiments, such a photonic crystal can exhibit a band structure characterized by at least two substantially degenerate states having vanishing wavevectors.

In some embodiments, the repeating structures of the photonic crystal comprise a plurality of pillars. In some embodiments, the pillars have substantially cylindrical shapes with a radius of about ⅛ of said at least one wavelength, i.e., at the wavelength at which the photonic crystal exhibits the Dirac cone. Further, in some embodiments, the pillars can have a maximum height of about ⅓ of said at least one wavelength. In some embodiments, the pillars can have a height in a range of about 30% to about 60% of the wavelength at the Dirac cone or near Dirac-cone, e.g., at the operating wavelength.

In some embodiments, the pillars can exhibit a periodicity in each of two orthogonal dimensions in a plane perpendicular to their heights characterized by a lattice constant (a) such that a ratio of radius of said pillars to said lattice constant (r/a) is in a range of about 0.2 to about 0.3. In some embodiments, the diameter of the pillars is greater than about 100 nm.

In some embodiments, the pillars comprise a dielectric material exhibiting a real refractive index contrast relative to a material surrounding the pillars that is greater than about 1.

The pillars can be formed of a variety of different materials. By way of example, the pillars can comprise any of silicon, diamond, $TiO_2$, silicon nitride, aluminum oxide, InGaAsP, GaN, and InGaN.

In some embodiments, the pillars are disposed on a surface of an underlying dielectric substrate. The real refractive index of the material of which the substrate is formed is typically less than the real refractive index of the material of which the pillars are formed. By way of example, the dielectric substrate can comprises any of $SiO_2$, sapphire, InP, and polymeric resins, such as PDMS, Cytop, SU-8, and PMMA.

In some embodiments, a top metallic layer is disposed on top surfaces of said pillars. In addition, in some embodiments, a bottom metallic layer is disposed on at least a portion of said surface of the dielectric substrate on which the pillar are disposed. In some embodiments, each of said top and bottom metallic layers has a thickness in a range of about 50 nm to about 100 nm. By way of example, the metallic layers can comprise any of gold and silver.

In some embodiments, the pillars can be sandwiched between two metallic layers. Such metallic layers can have a thickness in a range of about 50 nm to about 100 nm.

The photonic structure exhibits a substantially vanishing real refractive index at said at least one wavelength while concurrently exhibiting a non-zero real impedance at that wavelength. In some embodiments, the non-zero impedance exhibited by the photonic crystal can be tuned by adjusting the pitch and the radius of the pillars.

In some embodiments, the photonic structure exhibits a Q factor greater than about 20, and in some cases greater than about 1500, for at least two substantially degenerate states having a vanishing wavevector. Further, in some embodiments, the photonic crystal exhibits an imaginary refractive index less than about 0.1 at said at least one wavelength (i.e., at the wavelength at which the photonic crystal exhibits the Dirac cone).

In some embodiments, the pillars are disposed in a resin. By way of example, the resin can be any of SU8, Cytop, PMMA (polymethymethacrylate), and PDMS (polydimethylsiloxane).

In a related aspect, a photonic crystal is disposed, which comprises a plurality of periodically repeating structures, said structures being configured and arranged relative to one another so as to form a band structure providing at least two substantially degenerate states at the center of the Brillouin zone of a reciprocal lattice of the photonic crystal for at least one wavelength in the optical regime.

In another aspect, an integrated photonic device is disclosed, which comprises a substrate, a photonic crystal disposed on said substrate, said photonic crystal exhibiting a Dirac cone at the center of the Brillouin zone of its reciprocal lattice for at least one wavelength in the optical regime, an input port for receiving radiation and an output port optically coupled to said photonic crystal for transmitting at least a portion of said received radiation to said photonic crystal, and an output waveguide disposed on said substrate, said output waveguide having an input port for receiving at least a portion of the radiation transmitted through the photonic crystal.

In some embodiments, the output port of the output waveguide is configured for optical coupling to a downstream component of the photonic device.

In some embodiments of the integrated photonic device, the substrate comprises a dielectric substrate, such as silicon. In some embodiments, another dielectric substrate, such as silicon dioxide, sapphire, or InP, is disposed between a top surface of the substrate and the photonic crystal.

In some embodiments of the integrated photonic device, the pillars comprise any of silicon, diamond, $TiO_2$, silicon nitride, gallium arsenide, aluminum oxide, InGaAsP, GaN, and InGaN.

In some embodiments, the integrated photonic device further comprises a resin in which said pillars are disposed. The real refractive index contrast between the pillars and the resin can be greater than 1.

In some embodiments of the photonic crystal, the input waveguide is configured to transmit said radiation into the photonic crystal in plane of said pillars. In some such embodiments, the output waveguide is configured to receive the radiation transmitted through the photonic crystal in plane of said pillars.

In a related aspect, a photonic structure is disclosed, which comprise a plurality of periodically repeating structures, said structures being configured and arranged relative to one another so as to form a photonic crystal, where said photonic structure exhibits a substantially vanishing real refractive index and a non-zero impedance for at least one wavelength in the optical regime.

In some embodiments, the periodically repeating structures comprise a plurality of pillars. In some such embodiments, the photonic structure exhibits a Q factor that is greater than 20, and in some cases greater than 1500, at said wavelength.

In another aspect, a photonic structure is disclosed, which comprises a substrate, a plurality of periodically repeating cavities formed in said substrate, where the cavities are sized and arranged relative to one another such that said photonic structure exhibits a substantially vanishing refractive index (preferably a zero refractive index) for at least one wavelength of electromagnetic radiation propagating through said photonic structure, for example, for at least one wavelength of the electromagnetic radiation in a range of about 400 nm to about 100 microns. Further, the photonic structure can exhibit a non-zero real impedance at that wavelength. For example, the photonic structure can exhibit a substantially vanishing permittivity (preferably zero permittivity) and a substantially vanishing permeability (preferably zero permeability) at said wavelength.

In some cases, the photonic structure can exhibit an imaginary refractive index less than about 0.05 for the wavelength at which it exhibits a substantially vanishing refractive index.

The cavities can be arranged to form any of a two-dimensional or a three-dimensional lattice, and a variety of different lattice types. For example, the cavities can be arranged to form a square, a rectangular, or a hexagonal lattice, among others. In some embodiments, the cavities are substantially cylindrical. In some cases, such cylindrical cavities have a radius in a range of about $\lambda/20$ to about $\lambda/2$, in which $\lambda$ is the operating wavelength. In some embodiments, the cavities can be filled with a gas, such as air.

The substrate in which the cavities are disposed can be formed of a variety of different dielectric materials. In some cases, the substrate is a semiconductor. Some examples of suitable materials include, without limitation, silicon, diamond, $TiO_2$, aluminum oxide, silicon nitride ($Si_3N_4$), InGaAsP, GaN, and InGaN. In some embodiments, the substrate can have a thickness in a range of about 100 nm to about 2 microns.

In some embodiments, the substrate is disposed on an underlying electrically insulating layer. In some cases, the underlying layer can be an oxide, e.g., $SiO_2$ or $TiO_2$. For example, the substrate can be a silicon layer and the underlying layer can be an $SiO_2$ layer.

In some embodiments, the photonic structure can include an input waveguide for coupling electromagnetic radiation into the photonic structure and an output waveguide for coupling radiation out of the photonic structure.

In a related aspect, a photonic structure is disclosed, which includes a substrate and a plurality of cavities distributed within the substrate according to any of a two-dimensional or a three-dimensional periodic pattern so as to form a photonic crystal exhibiting any of a Dirac cone or near Dirac cone at the center of Brillouin zone of its reciprocal lattice for at least one wavelength of electromagnetic radiation, e.g., a wavelength in a range of about 400 nm to about 100 microns. The photonic structure can support three degenerate modes associated with the center of the Brillouin zone, where two of said modes are dipole modes and the other is a quadrupole mode.

Further understanding of various aspect of the present teachings can be obtained by reference to the following detailed description in conjunction with the associated drawings, which are described briefly below.

BRIEF DESCRIPTION OF THE DRAWINGS

FIGS. 11A-11F show the change in Dirac cone and extracted $n_{eff}$ with different pillar radii according to aspects of the present invention;

FIGS. 30A-30D show characterization of one embodiment of a super-robust AD-ZIM, including SEM images of a fabricated device according to aspects of the present invention, FIG. 31 schematically depicts a photonic structure according to an embodiment of the invention, which includes a substrate supporting a plurality of regularly-positioned cavities, FIG. 32 schematically depicts a photonic structure according to another embodiment of the invention, which also includes a substrate supporting a plurality of regularly-positioned cavities arranged differently than the cavities depicted in the embodiment of FIG. 31, FIG. 33A schematically depicts a hypothetical two-dimensional square array of holes in a silicon matrix, with a lattice constant (a) and a radius (r)

DETAILED DESCRIPTION

The present teachings relate generally to designing and fabricating optical metamaterials with negative/zero/positive refractive index based on a novel physical principle in photonics: a Dirac cone at the center of the Brillouin zone. It is a photonic analog of the gapless dispersion of graphene in the center of the Brillouin zone. In many embodiments of the present teachings, the metamaterials include purely dielectric constituents, and hence do not exhibit conduction losses. Furthermore, because in many embodiments the Dirac cone is far away from the Mie-resonance region, around which a peak of loss appears, the metamaterials according to the present teachings will show negative/zero/positive refractive index with an extremely low loss, e.g., characterized by an imaginary index of 0.03 or even 0.003. Also, as opposed to the zero-refractive-index provided by either permittivity or permeability near zero metamaterials, the metamaterials according to many embodiments of the present teachings can achieve zero-refractive-index at a particular frequency in the optical regime with both permittivity and permeability simultaneously zero. This double-zero property results in finite characteristic impedance. In contrast, the impedance exhibited by conventional metamaterials, which exhibit near zero permittivity (permeability), can be infinite or zero, thereby leading to significant impedance mismatch. Thus, the metamaterials according to the present teachings exhibiting zero-refractive-index overcome a big drawback of traditional single zero metamaterials.

As discussed in more detail below, in some embodiments, two dimensional (2D) Dirac-cone metamaterials according to the present teachings can be implemented by a 2D square array of silicon pillars, which can be fabricated by top-down methods. The negative/zero/positive refractive index of metamaterials according to the present teachings, such as the 2D embodiments, can be characterized by multiple methods, such as a prism-based method and an interferometry-based method. The negative/zero/positive refractive index metamaterials according to the present teachings with super low losses and good impedance matching can be used to demonstrate a number of interesting physical phenomena and can be employed in a number of potential applications, such as electro-optic modulation, beam-steering, super-coupling, cloaking, surface-emitting lasers, phase-matching for non-linear optics, and rainbow-trapping. Furthermore, such potential applications can be pursued in optical/quantum devices, energy sensing, biomedical sensing, and seismology.

Figure 1:
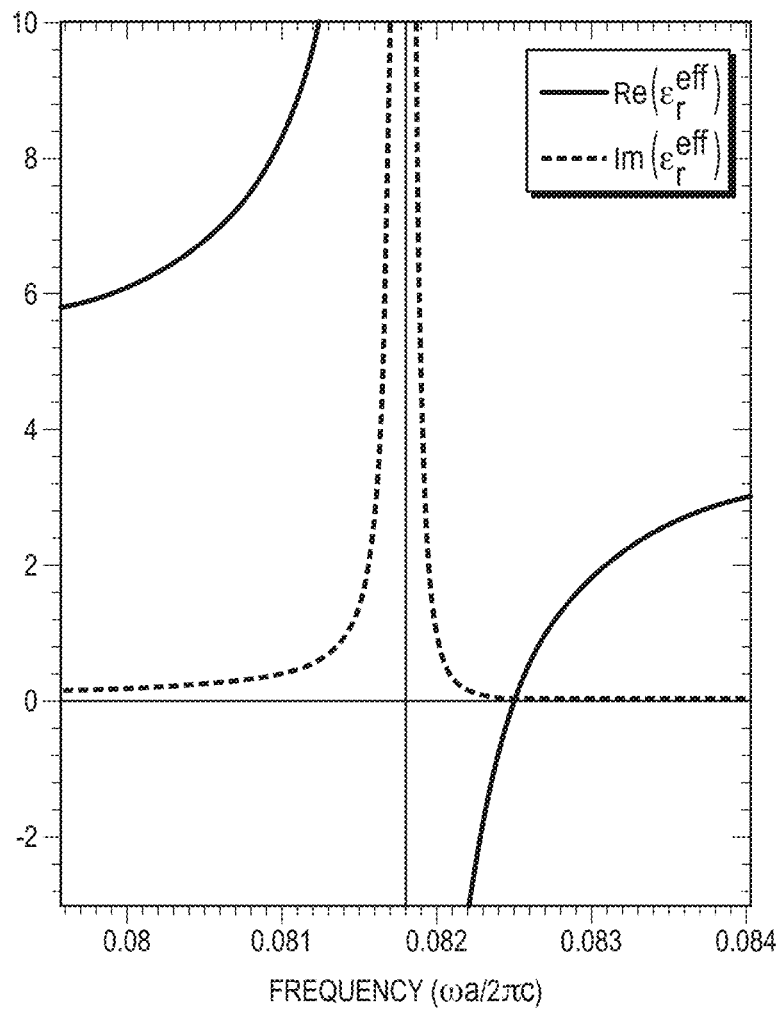
FIG. 1 shows the effective relative permittivity as a function of frequency for a dielectric resonator.
Figure 2:
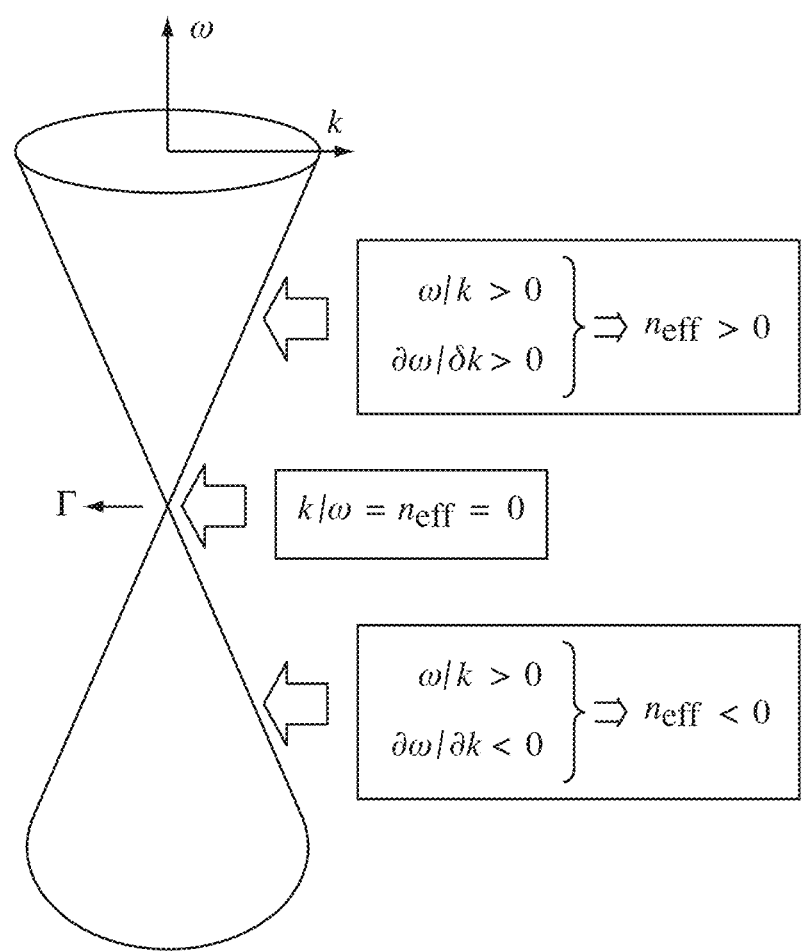
FIG. 2 is a schematic diagram of a Dirac cone, showing a negative/zero/positive index of refraction.

A photonic crystal can be treated as a homogeneous bulk metamaterial in the vicinity of the Dirac point because the homogenization criterion (effective wavelength $\lambda_{eff}$ inside a medium is much larger than the lattice constant) is met (basically, $\lambda_{eff} \rightarrow \infty$ at the Dirac point Γ as shown in FIG. 2). Such a photonic crystal can exhibit the following characteristics: 1) in the vicinity below the Dirac point, the fact that group velocity and phase velocity have opposite directions (backward wave) implies a negative refractive index ($n_{eff}<0$), as illustrated in FIG. 2; 2) at the Dirac point Γ, k=0 results in $n_{eff}=k/\omega=0$, as illustrated in FIG. 2; and 3) in the vicinity above the Dirac point, the fact that group velocity and phase velocity have the same directions (forward wave) induces positive refractive index ($n_{eff}>0$), as illustrated in FIG. 2. However, the Dirac cone usually appears at the zone boundary for many conventional photonic crystals, which cannot meet the homogeneous criteria. By carefully choosing the geometry and material parameters of a photonic crystal according to the present teachings, a Dirac cone can be formed at the zone center due to the accidental degeneracy, in which, for the 2D case, one monopole eigenstate and two double-degenerate dipole eigenstates have the same eigenfrequency. Although the Dirac cone at the zone center is actually a "Dirac-like cone" because its corresponding linear dispersions possess zero Berry phase and cannot be mapped into the massless Dirac Hamiltonian, it still can imply a homogeneous metamaterial with negative/zero/positive $n_{eff}$ as discussed previously. Furthermore, it has been proven that the presence of a Dirac cone at the zone center is only determined by the spatial symmetry of two modes rather than the detail of the 2D/3D photonic structure, which leads to a great degree of freedom to design a Dirac-cone metamaterial in view of the available fabrication and characterization techniques.

In the following discussion, the center of a Brillouin zone of a reciprocal lattice (also known as the Γ point) of a photonic crystal refers to a point in the Brillouin zone that corresponds to a vanishing wavevector, i.e., k=0. In the case of a two-dimensional photonic crystal, the center of the Brillouin zone is characterized by a wavevector having $k_x$=0 and $k_y$=0, where the photonic crystal exhibits periodicity in the x-y plane.

The term "optical regime" as used herein refers to a portion of the electromagnetic spectrum corresponding to vacuum wavelengths in a range of about 400 nm (nanometer) to about 1 cm (centimeter), e.g., in a range of about 400 nm to about 100 μm, or in a range of about 100 nm to about 25 μm.

The term "substantially" as used herein denotes a condition that is within 3% of a complete condition (state). For example, the term "substantially vanishing" denotes a variation of at most 3% from zero. The term "substantially degenerate" as used herein refer to at least two Block states of a photonic crystal that are characterized by k=0 and difference in frequency (i.e., a band gap) that is equal to or less than 3% of the center frequency between the two states. As discussed in more detail below, such substantial degeneracy can be achieved in some embodiments by a band structure exhibiting a near Dirac cone at k=0.

The term "near Dirac-cone" as used herein refers to having a wavelength difference between to states, which would be degenerate in case of a perfect Dirac-cone, of equal to or less than 3% of the operation frequency, i.e., 3% of the Dirac-cone wavelength.

The term "about" for modifying numerical values as used herein indicates a maximum variation of +/−5%.

Figure 3:
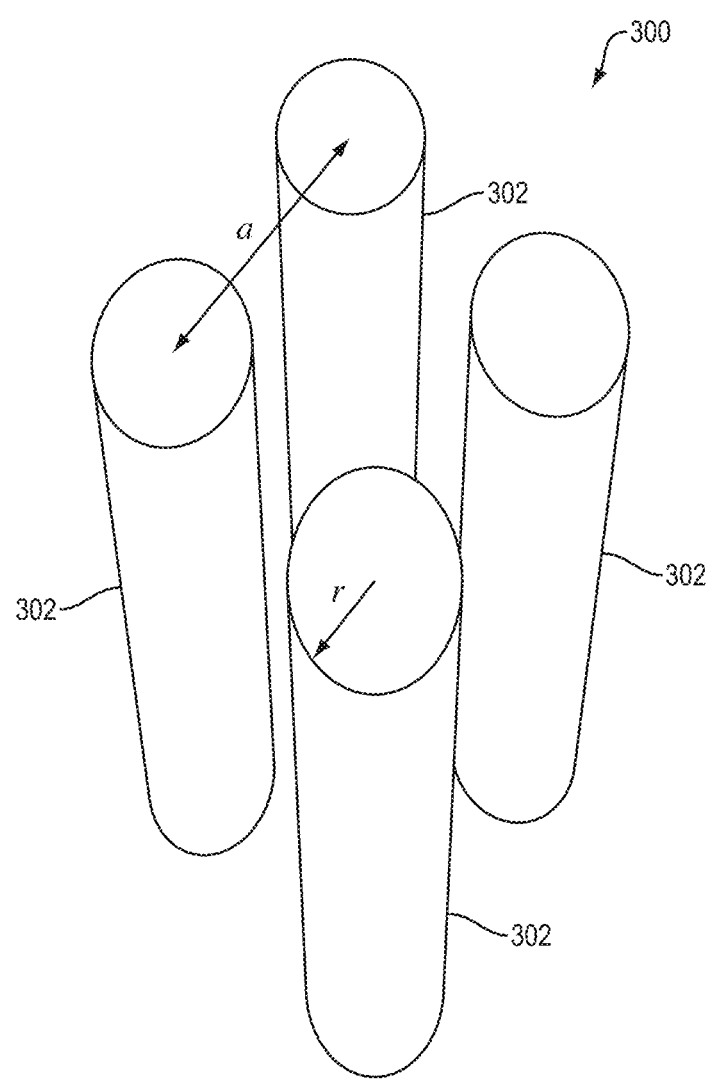
FIG. 3 is a schematic diagram showing an embodiment of a Dirac-cone metamaterial according to an embodiment of the present invention.
Figures 4A, 4B:
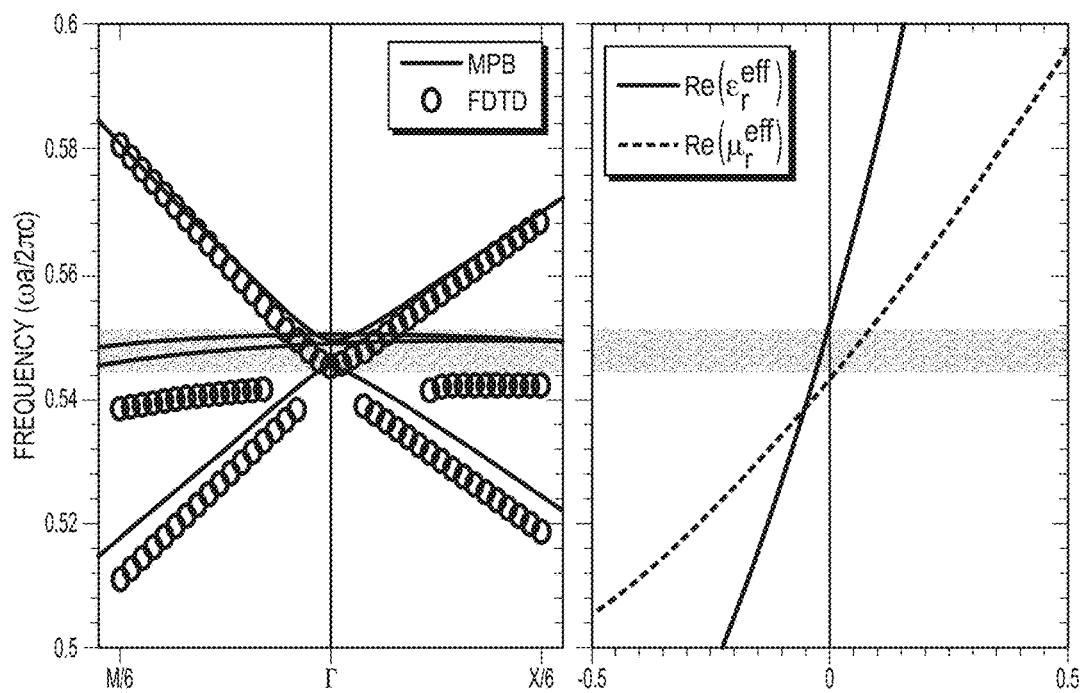
FIG. 4A shows the formation of a Dirac cone at the center of the Brillouin zone.
FIG. 4B shows the effective relative permittivity $\in_r^{eff}$ and effective relative permeability $\mu_r^{eff}$ for the structure corresponding to FIG. 4A.

FIG. 3 schematically depicts an embodiment of a Dirac-cone metamaterial according to the present teachings, which includes a 2D square array 300 of silicon pillars 302 with parameters a=856.1 nm, where a is the period of the array, and pillar radius r=170.6 nm at 1.55 μm. This structure can be readily fabricated by electron-beam (e-beam) lithography and ICP-RIE dry etching. The chosen values of the radius and the period of the array results in the formation of a Dirac cone at the center of the Brillouin zone (FIG. 4A). The effective relative permittivity $\in_r^{eff}$ and effective relative permeability $\mu_r^{eff}$ of this structure were calculated using an effective medium theory, which is still valid beyond the homogenization criterion ($k_{eff}a<1$)). As shown in FIG. 4B, the $\in_r^{eff}$ and $\mu_r^{eff}$ indeed show double-negative behavior below the Dirac point, double-zero at the Dirac point, and double-positive above the Dirac point, as mentioned before.

To further investigate the fundamental optical properties of 2D Dirac-cone metamaterials, complex $\in_r^{eff}$, $\mu_r^{eff}$, $n_{eff}$, and effective characteristic impedance $\eta_{eff}$, as well as the phase velocity $v_p$ and group velocity $v_g$ of the above 2D array of silicon pillars shown in FIG. 3 were calculated. The $v_p$ and $v_g$ were calculated using their original definitions: $v_p=\omega/k$ and $v_g=c/[n_{eff}+\omega(\partial n_{eff}/\partial \omega)]$. The parameters of this metamaterial were chosen as follows: a=856.1 nm and r=170.6 nm (FIG. 3) to make $\in_r^{eff}$ and $\mu_r^{eff}$ perfectly intersect at zero at 1.55 μm.

Figures 5A, 5B, 5C:
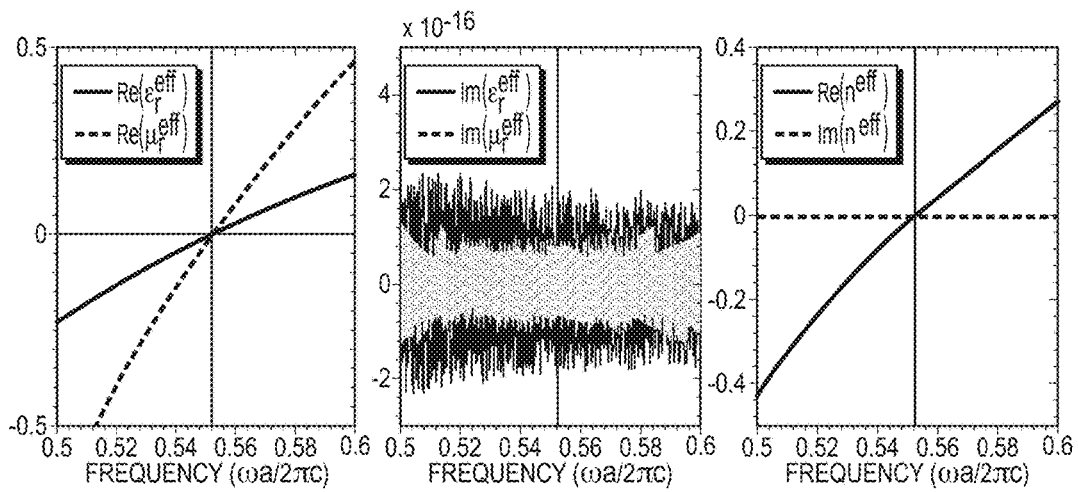
FIG. 5A shows the real parts of $\in_r^{eff}$ and $\mu_r^{eff}$ for the embodiment in FIG. 3.
FIG. 5B shows the imaginary parts of $\in_r^{eff}$ and $\mu_r^{eff}$ for the embodiment in FIG. 3.
FIG. 5C shows the real and imaginary parts of $n_{eff}$ for the embodiment in FIG. 3.
Figures 5D, 5E, 5F:
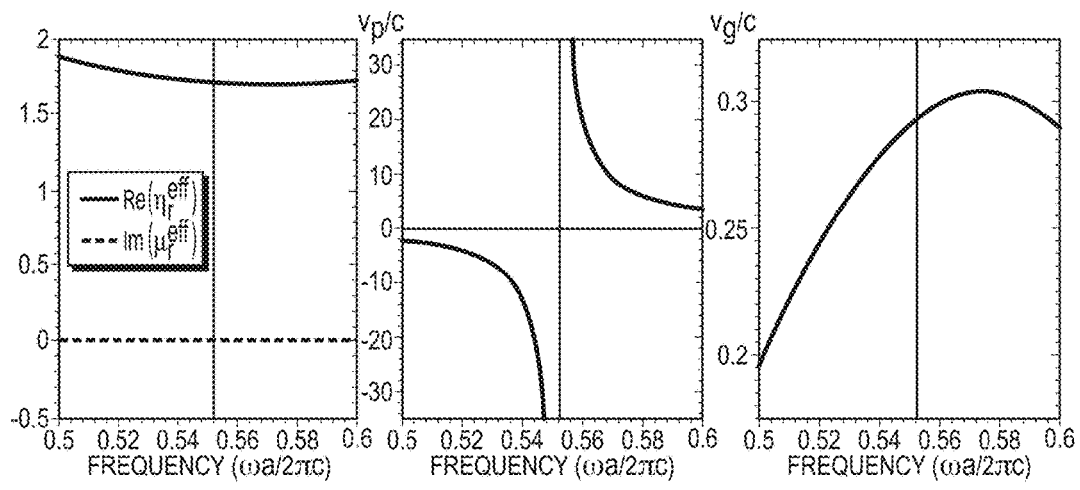
FIG. 5D shows the real and imaginary parts of the effective characteristic impedance $\eta_{eff}$, for the embodiment in FIG. 3.
FIG. 5E shows the phase velocity for the embodiment in FIG. 3.
FIG. 5F shows the group velocity for the embodiment in FIG. 3.

As shown in FIGS. 5A and 5B, the real parts of $\in_r^{eff}$ and $\mu_r^{eff}$ show double-negative, double-zero, and double-positive behaviors in the vicinity of the Dirac point while their imaginary parts are almost zero around the Dirac-point region. Furthermore, as shown in FIG. 5C, the real parts of $n_{eff}$ show negative, zero, and positive values corresponding to the double-negative, double-zero, and double-positive behaviors of $\in_r^{eff}$ and $\mu_r^{eff}$. Similarly, the imaginary parts of $n_{eff}$ are close to zero around the Dirac-point region. Hence, this 2D Dirac-cone metamaterial can show negative/zero/positive $n_{eff}$ with an extremely low loss. As shown in FIG. 5D, $\eta_{eff}$ has a value of 1.7 around the Dirac-point region, which results in a reflection coefficient of about 26% relative to free space. Thus, this 2D Dirac-cone metamaterial can provide a good impedance matching to free space and a variety of waveguide structures. As shown in FIGS. 5E and 5F, $v_p$ has a singularity at the Dirac point while $v_g$ is smaller than the vacuum light speed around the Dirac-point region. This slow light behavior can have potential applications in optical/quantum devices. Also note that the signs (directions) of $v_p$ and $v_g$ in the vicinity of Dirac point are in good agreement with those predicted in FIG. 2.

Figure 6A:
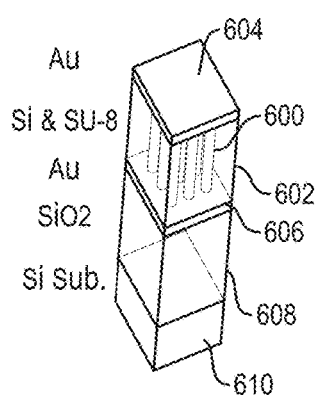
FIGS. 6A to 6E show various embodiments of Dirac-cone metamaterials according to various embodiments of the present invention.
Figure 6B:
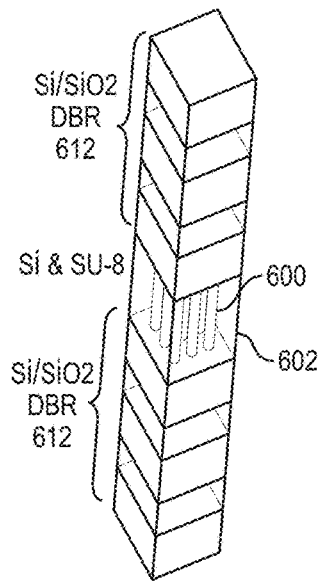

In some embodiments, the Dirac-cone metamaterials according to the present teachings are capable of effectively confining the light that enters the metamaterials. By way of example, FIG. 6A shows schematically an embodiment that includes a 2D array of silicon pillars 600 disposed on an underlying top surface of an $SiO_2$ layer 608 and within an SU-8 resin 602, e.g., the 2D arrangement of silicon pillars discussed above in connection with FIG. 3. An upper metallic, e.g., gold, layer 604 is disposed on top of the pillars and a lower metallic, e.g. gold, layer 606 is disposed on the top surface of the $SiO_2$ layer between the pillars. The underlying $SiO_2$ layer 608 is turn disposed on a silicon substrate 610. The metallic layers provide confinement of the light coupled into the region of the metamaterial in which the silicon pillars are disposed. This structure has the advantage of ease of fabrication. However, in some embodiments, the gold layers can introduce absorption losses. To reduce these losses, FIG. 6B schematically depicts another embodiment of a metamaterial according to the present teachings in which the gold layers are replaced with a pair of distributed Bragg reflectors (DBRs). More specifically, this embodiment includes a 2D array of silicon pillars 600 disposed in an SU-8 resin 602, e.g., the arrangement of 2D silicon pillars shown in FIG. 3, where resin, including the silicon pillars, is sandwiched between a pair of distributed Bragg reflectors 612. The DBRs provide confinement of radiation coupled into the region where the silicon pillars are disposed.

Figure 6C:
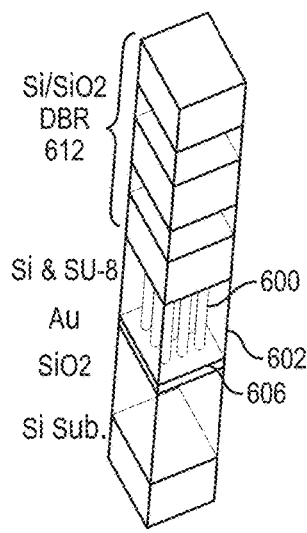

By way of another example, FIG. 6C depicts another embodiment of a metamaterial according to the present teachings, which includes a 2D array of silicon pillars 600 disposed in a resin 602 (e.g. SU-8 resin), e.g., the arrangement of the silicon pillars shown in FIG. 3, that is sandwiched between a lower metal layer (e.g., a gold layer) 606 and an upper distributed Brag reflector (DBR) 612. This hybrid structure can have the advantage of low loss and fabrication simplicity.

Figure 6D:
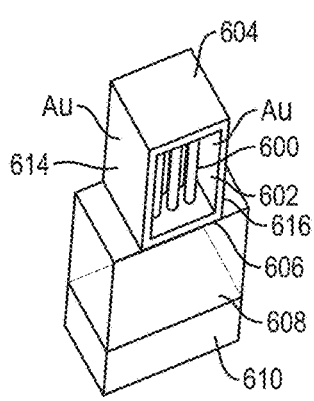
Figure 6E:
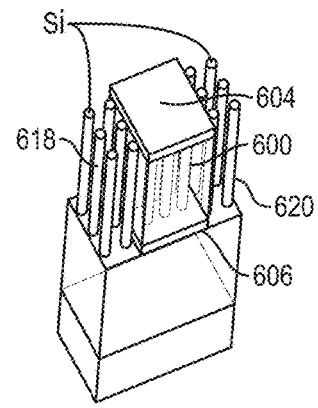

To further confine the light in the region in which the 2D array of pillars are disposed, FIG. 6D schematically depicts a metamaterial according to an embodiment of the present teachings, which includes in addition to an upper and a lower metallic layers 604 and 606, two metal (e.g., gold) lateral layers 614 and 616 that provide lateral mirrors for lateral confinement of the light. Similar to the embodiment shown in FIG. 6A, the lower metallic layer is disposed on an underlying $SiO_2$ layer 608, which is in turn disposed on a silicon substrate 610. By way of another example, FIG. 6E schematically depicts another embodiment of a metamaterial according to the present teachings, which includes a 2D array of pillars 600 disposed in a resin, e.g., the arrangement of silicon pillars shown in FIG. 3 above, and further includes a lower and an upper metal (e.g., gold) layers 604 and 606 that provide longitudinal (i.e., along a dimension parallel to the length of the pillars) light confinement. In addition, the exemplary metamaterial shown in FIG. 6E includes a pair of 2D photonic bandgap (PBG) structures 618 and 620 that function as lateral mirrors to provide transverse (i.e., along a dimension perpendicular to the length of the pillars) light confinement.

Figure 7:
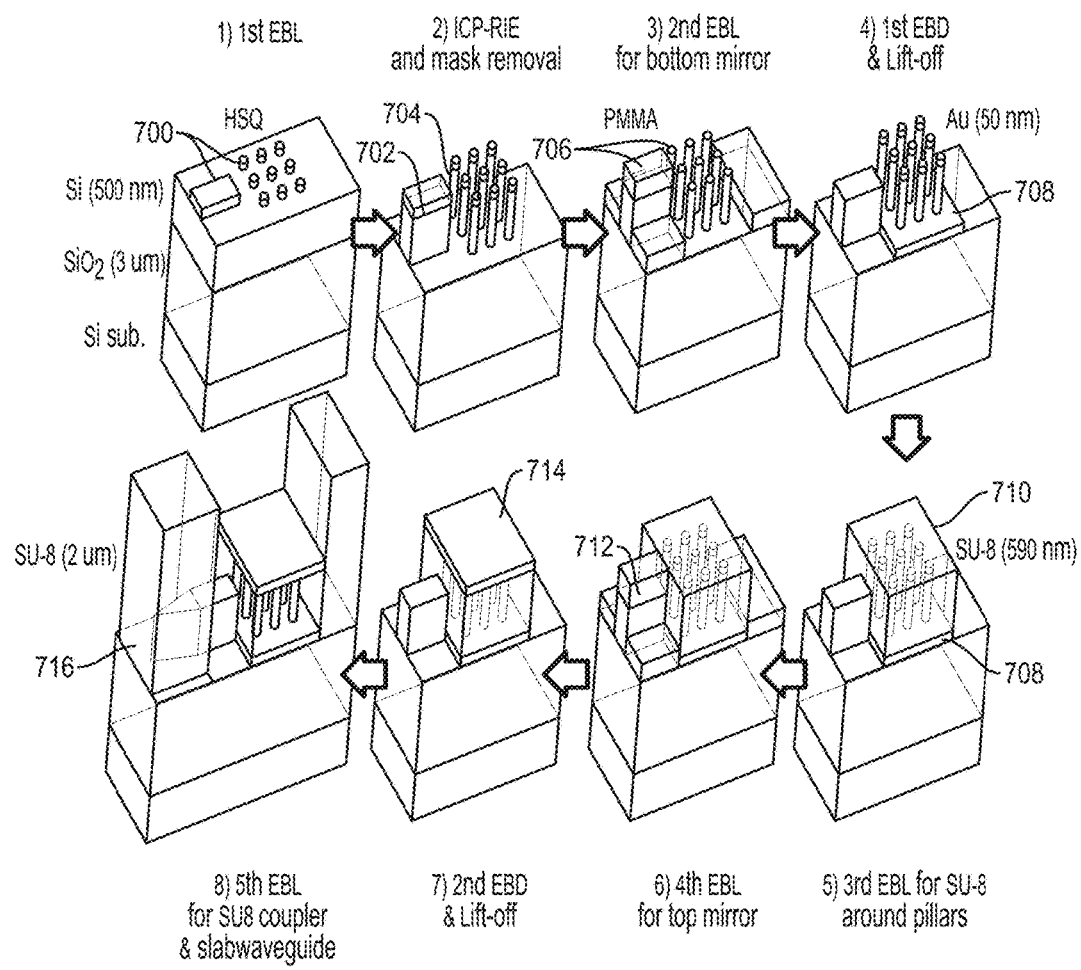
FIG. 7 shows various steps in an exemplary method for fabricating the metamaterial structure shown in FIG. 6A, according to aspects of the present invention.

FIG. 7 shows various steps in an exemplary method for fabricating an implementation of the metamaterial structure shown in FIG. 6A in which a plurality of silicon pillars is disposed on a surface of an underlying substrate with a lower gold layer disposed on the substrate surface and a top gold layer disposed on the top of the pillars.

In an initial step (1), an SOI (silicon-on-insulator) wafer (500 nm Si on 3000 nm $SiO_2$) is spin-coated with a negative tone resist (e.g., HSQ) 700. The waveguides and the pillars are patterned using e-beam lithography in the same step. An ICP-RIE dry etching is employed to form the waveguide 702 and pillar structures 704 (step 2), using the negative resist (e.g., HSQ) as a mask. In a wet etch step (3), the previous resist (HSQ) mask is removed. The sample is then spin-coated with a positive tone resist (PMMA) 706. The sample is patterned again using e-beam lithography, this time leaving gaps for where the metal layer (e.g., gold layer) would be. A layer of a metal (e.g., gold) is deposited using e-beam evaporation (step 4). Then a lift-off step is performed, leaving a layer 708 of metal (e.g., gold) at the base of the pillars. This serves as one of the mirrors of the waveguide. Another negative-tone resist 710, e.g., SU-8, is spin-coated (step 5). This resist will remain as part of the device and serves multiple roles: within the zero-index medium, it also supports the top layer of gold, and it can also be used as an off-chip coupler to help facilitate coupling into the waveguides (at the facet). These patterns can be written using e-beam lithography. In subsequent step (6), which is similar to step 3, PMMA 712 can be spin-coated and patterned using e-beam lithography, leaving a gap for subsequent gold deposition. In step (7), similar to step (4), a layer of a metal (e.g., gold) can be deposited using e-beam evaporation and lift-off, leaving a layer 714 of metal (e.g., gold) on the top of the pillars, serving as the second mirror. The gold layers can be extended, if desired, beyond the zero index pillar structure in order to wire-bond and tune the properties of the material. In step (8), similar to step (5), the SU-8 fiber coupler and output waveguide 716 are patterned using e-beam lithography.

Figure 8A:
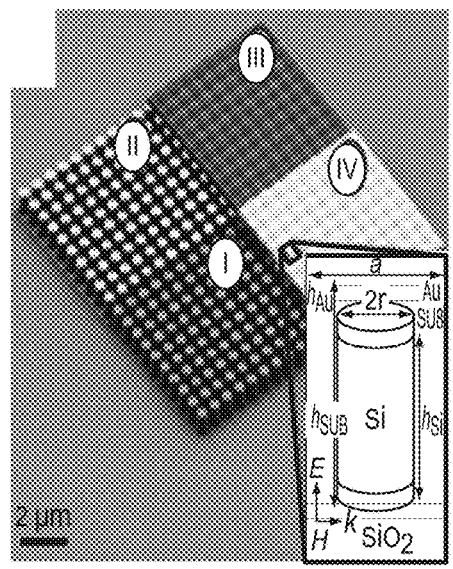
FIG. 8A shows scanning electron microscope (SEM) images of one embodiment of a metamaterial structure in four different fabrication stages according to aspects of the present invention.

By way of illustration, FIG. 8A shows scanning electron microscope (SEM) images of a metamaterial structure according to an embodiment of the present teachings in four different fabrication stages: I. Silicon pillars on a silicon-on-insulator (SOI) substrate; II. Silicon pillars with bottom gold layer; III. Silicon pillars in SU-8 matrix with bottom gold layer; IV. Silicon pillars in SU-8 matrix with top and bottom gold layers (completed structure). Inset of FIG. 8A shows a schematic three-dimensional view of one unit-cell of the metamaterial. The period and radius of the silicon pillars are a=690 nm and radius r=211 nm, respectively. The height of silicon pillars is $h_{Si}$=512 nm, the SU-8 layer thickness is $h_{SU-8}$=595 nm, and gold layer thickness is $h_{Au}$=50 nm.

Figure 8B:
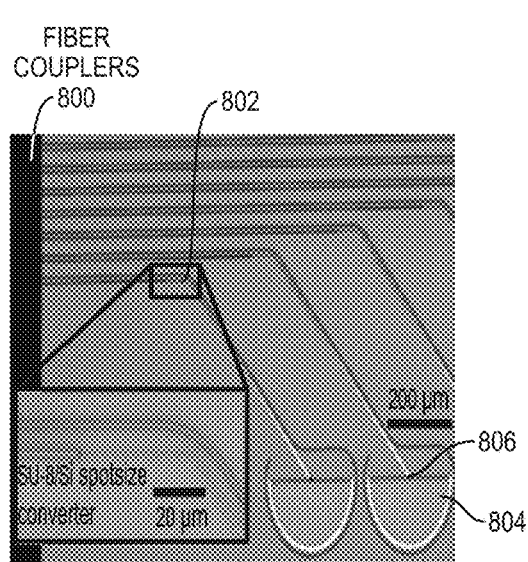
FIG. 8B shows an optical image of an embodiment of a photonic chip including the metamaterial structure of FIG. 8A according to aspects of the present invention.
Figure 8C:
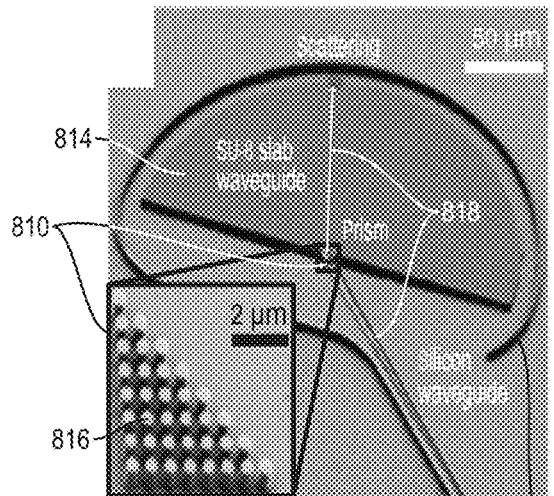
FIG. 8C shows an SEM image of the fabricated prism of FIG. 8A with silicon waveguide and SU-8 slab waveguide according to an embodiment of the present invention.
Figure 8D:
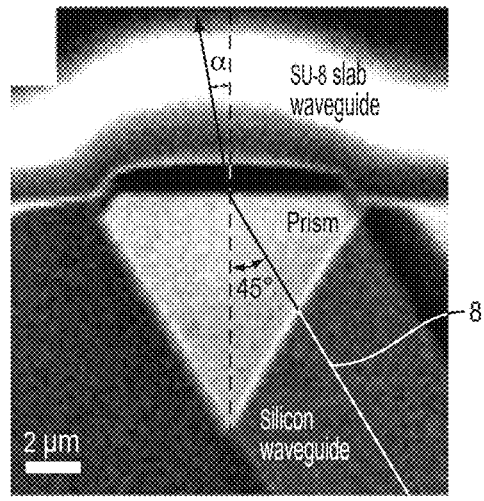
FIG. 8D shows an SEM image of the prism region for FIG. 8C, showing the path of a refracted beam.

Photonic crystals according to the present teachings can be employed to form a variety of photonic devices. By way of example, FIG. 8B shows an optical image of a photonic chip showing fiber couplers 800, spot-size converters 802, waveguides 804, and a Dirac-cone photonic crystal according to an embodiment of the present teachings with the pillars arranged in the form of prisms 806 corresponding to the metamaterial structure of FIG. 8A. FIG. 8C shows an SEM image of the fabricated prism 810 of FIG. 8A with silicon waveguide 812 and SU-8 slab waveguide 814. Inset of FIG. 8C schematically shows the prism 810, which is a right triangular array of pillars 816 measuring 8 unit cells across, without gold and SU-8 layers. FIG. 8D shows an SEM image of the prism region showing the path of a refracted beam 818 (also shown in FIG. 8C). The angle of refraction a is determined by measuring the position of the refracted beam at the curved output edge of SU-8 slab waveguide (shown as spot 820 in FIG. 8C).

Figure 9A:
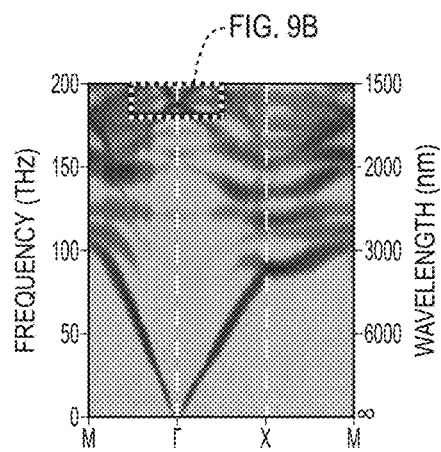
FIGS. 9A-9E show various material parameters of the Dirac-cone metamaterial of FIG. 8A with optimized parameters according to aspects of the present invention.
Figure 9B:
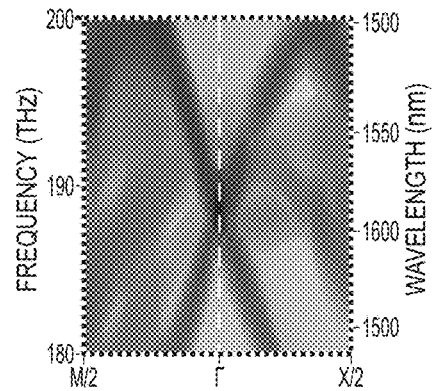
Figure 9C:
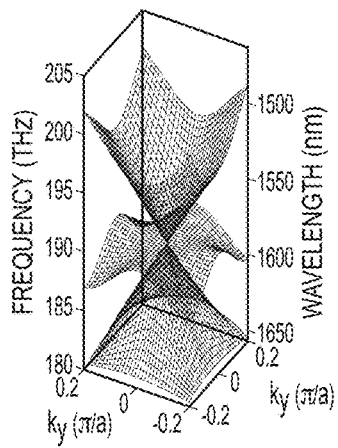
Figure 9D:
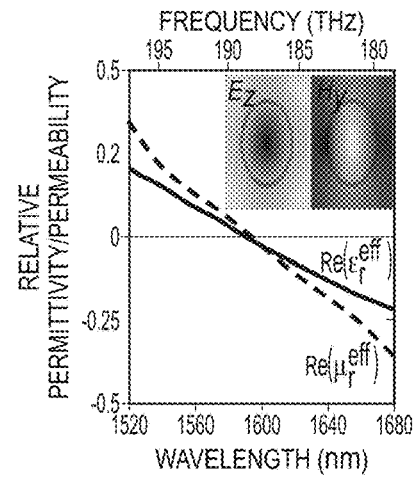
Figure 9E:
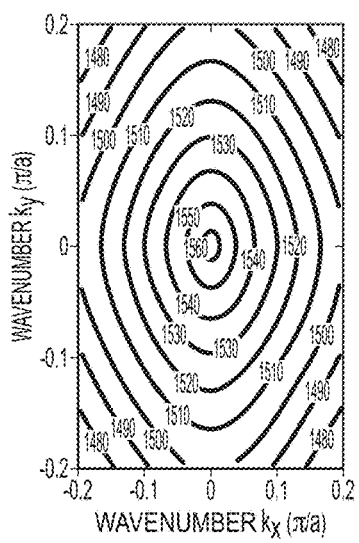

FIGS. 9A-9E show calculated material properties of the Dirac-cone metamaterial of FIG. 8A with optimized parameters. FIG. 9A shows the photonic band structure of the 3D Dirac-cone metamaterial of FIG. 8A for TM mode. FIG. 9B shows an expanded view of the marked region in FIG. 9A. Two linear dispersion bands intersect at the Γ point at λ=1590 nm, forming a Dirac-like cone. FIG. 9C shows 3D dispersion surfaces near the Dirac-point wavelength. The linear bands 900 and 902 form the cones, which meet at the Dirac point. The quadratic band 904 crossing the Dirac point is a quasi-longitudinal mode. FIG. 9D shows the effective relative permittivity and permeability of the metamaterial retrieved from numerically calculated reflection and transmission coefficients. Inset of FIG. 9D shows the electric and magnetic fields in a unit-cell at the Dirac-point wavelength, depicting an electric monopole and a transverse magnetic dipole behavior. FIG. 9E shows isofrequency contours of the Dirac-cone metamaterial. The nearly circular contours indicate that the index is nearly isotropic near the Γ point.

As discussed further below, it should be understood that photonic crystals fabricated based on the present teachings may exhibit a slight lifting of the degeneracy at the center of the Brillouin zone due to fabrication imperfections. Such lifting of the degeneracy can be equal to or less than about 3% of the central frequency of the band gap (in other words, 3% of the frequency of a Dirac-cone at the center of the Brillouin zone in absence of the lifting of the degeneracy). For example, such lifting of the degeneracy can be less than about 6 THz.

Figure 10A:
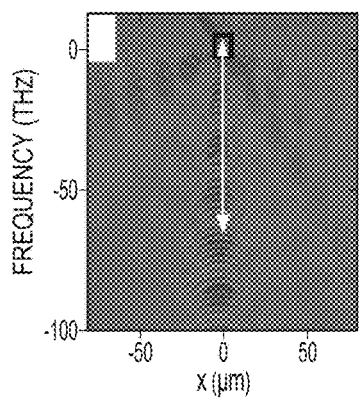
FIGS. 10A-10F show the finite-difference time-domain simulations and experimental results of the fabricated Dirac-cone metamaterial of FIG. 8A according to aspects of the present invention.
Figure 10B:
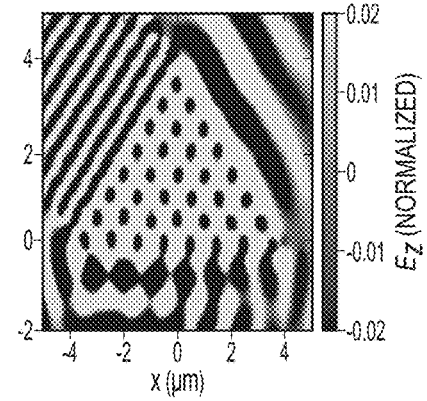
Figure 10C:
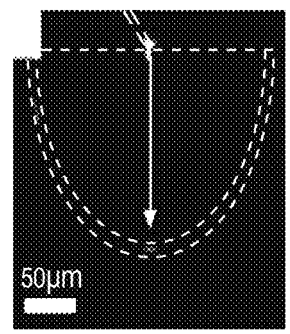
Figure 10D:
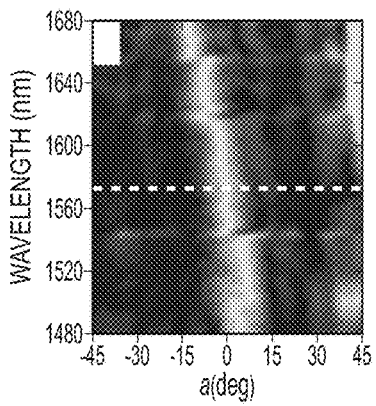
Figure 10E:
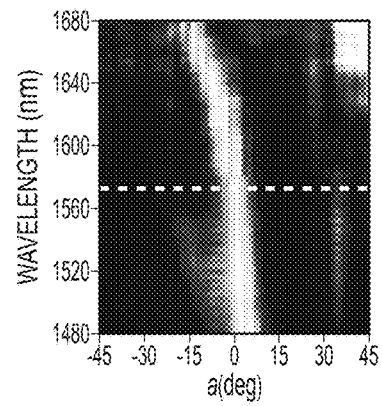
Figure 10F:
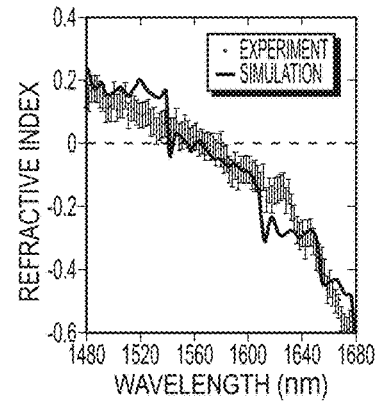

FIGS. 10A-10F show the finite-difference time-domain simulation and experimental results of the fabricated Dirac-cone metamaterial of FIG. 8A. FIG. 10A illustrates the simulated out-of-plane electric field in the prism and SU-8 slab waveguide region of FIG. 8A, showing that the two first order diffraction beams are on both sides (±70°) of the zero-order (refracted) beam, which is normal to the interface between prism and SU-8 slab waveguide. FIG. 10B shows field distribution in the prism region at 1570 nm, illustrating the nearly constant spatial phase distribution within the prism. FIG. 10C illustrates the near-infrared microscope image of the prism and SU-8 slab waveguide region at 1570 nm. The zero-order (refracted) beam and its first order diffraction beam are visible at the curved output edge of SU-8 slab waveguide at 0° and −70°, respectively. FIGS. 10D and 10E shows simulated and measured far-field patterns, respectively. The white dashed line indicates the wavelength, 1570 nm, at which the refracted beam crosses 0°. The image intensity has been normalized at each wavelength for clarity. FIG. 10E shows measured and simulated effective index of the Dirac-cone metamaterial. The dots indicate the measured refractive index, with error bars representing the uncertainties in the measurement. The measurement agrees well with the simulated effective index (solid line).

Theoretically, a photonic Dirac-cone has no bandgap at the Dirac-point wavelength. In some embodiments, the photonic Dirac-cone metamaterial may have no bandgap at the Dirac point wavelength. In other embodiments, due to fabrication imperfections, however, a tiny bandgap may open near the targeted Dirac-point wavelength of an experimentally fabricated Dirac-cone metamaterial. In this bandgap, the real index has a constant zero value. Given the error bars shown in FIG. 10D, the measured bandgap is at most 49 nm, centered at 1555.5 nm. To further confirm the fact that the measured zero index is induced by a Dirac-cone instead of a bandgap, the properties of two metamaterial structures in the form of two prisms with slightly smaller and larger pillar radii were simulated. FIGS. 11A-11F show the change in Dirac cone and extracted $n_{eff}$ with different pillar radii. FIG. 11A, FIG. 11C, and FIG. 11E illustrate the simulated band structures of metamaterials with r=167.5, 190, and 210.5 nm, respectively. The electric monopole mode is indicated by dots forming the curves 1100, and the transverse magnetic dipole modes are indicated by dots forming the curves 1102. Insets show $E_z$ profiles corresponding to each band at the $\Gamma$ point. FIG. 11B, FIG. 11D, and FIG. 11F show the effective indices $n_{eff}$ extracted from refractions through prisms with r=167.5, 190, and 210.5 nm, respectively. Simulations are shown by solid curves, and measured results are shown by dots with error bars. These results show that bandgaps of the prisms with smaller and larger radius become much wider and blue shifted and red shifted, respectively. This behavior is consistent with theoretical predictions.

Figure 12A:
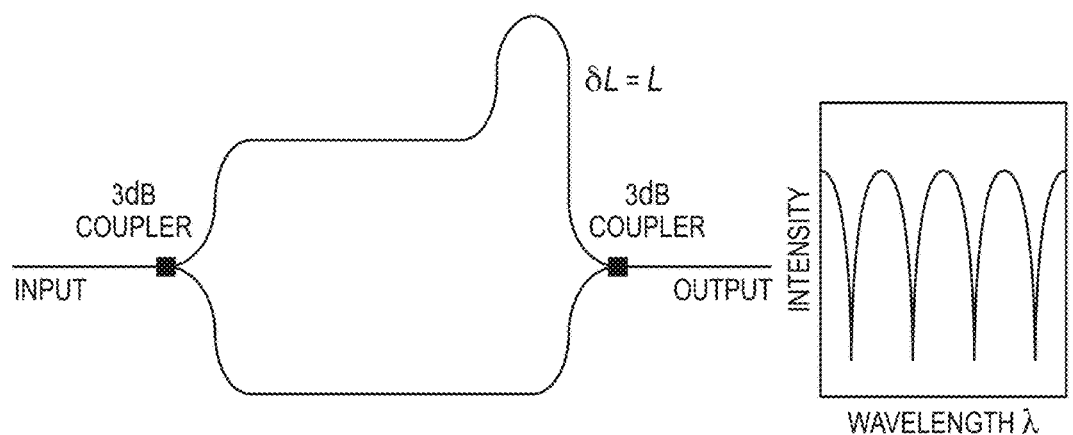
FIGS. 12A and 12B show one example of a Mach-Zehnder interferometer (MZI) that can be employed to demonstrate a zero refractive index of a metamaterial according to aspects of the present invention.
Figure 12B:
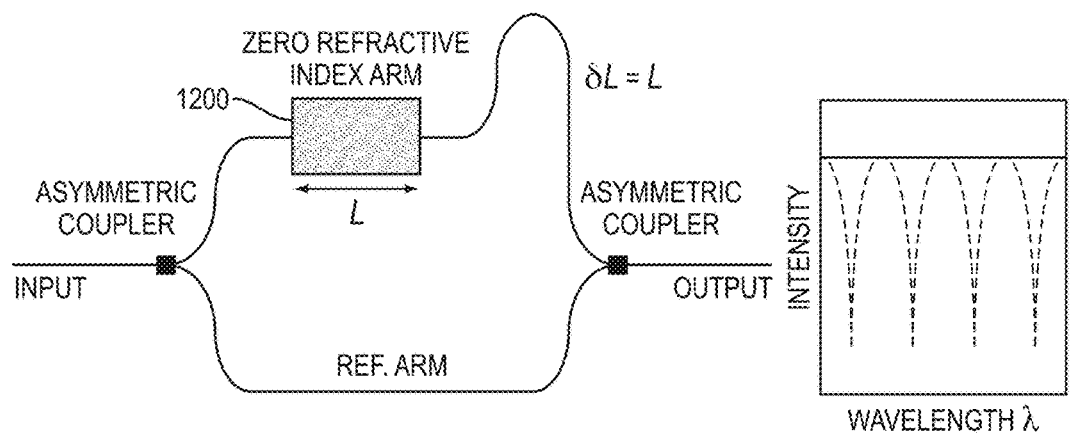

FIGS. 12A and 12B show schematically a Mach-Zehnder interferometer (MZI) that can be employed to demonstrate a zero refractive index of a metamaterial according to some embodiments of the present teachings. More specifically, FIG. 12A shows an asymmetric MZI without a zero-refractive-index arm, which can show intensity modulation as the length of that arm varies. FIG. 12B in turn shows an asymmetric MZI in which the non-reference arm includes a metamaterial 1200 exhibiting a zero refractive index according to embodiments disclosed herein. A change in the length of such a metamaterial does not result in observation of an intensity modulation since the phase difference between the two arms depends solely on the total phase that light has acquired while propagating in the metamaterial.

Applicants have discovered, via theoretical analysis of Dirac-cone metamaterials, that the existence of a Dirac cone at the center of the Brillouin zone of a metamaterial according to the present teachings can be sensitive to the variations in the geometry and material parameters of the constituents of the metamaterial. These variations can arise, e.g., from achievable tolerances in the fabrication process. To compensate for the fabrication tolerances so as to obtain the designed Dirac cone, in some embodiments, the following tunability methods can be employed. In one method, the refractive indices of the pillars and/or the material surrounding the pillars (e.g., silicon pillars and SU-8 in the embodiment of the FIG. 6A) can be adjusted (tuned) based on the electro-optic effect. By way of example, this tunability can be obtained by applying voltage to the gold thin films, which are used as electrodes, as shown, e.g., in FIGS. 6A and 7 (step 8). In another method, the geometric and material parameters of the constituents of the metamaterial can be tuned by adjusting the temperature. By way of example, in some embodiments, the metamaterial can be coupled to a temperature-controlling module, such as a Peltier thermoelectric cooler. In some cases, the temperature of a photonic crystal according to the present teachings can be adjusted to compensate for a lifting of degeneracy at k=0, which may have occurred due to fabrication imperfections.

The metamaterials according to the present teachings can exhibit interesting physical phenomena and can be employed in a variety of applications. By way of example, such metamaterials can be employed in electro-optic modulators. Based on the fact that electro-optically active materials have a birefringence that is proportional to the electric field, the electro-optic effect can be used to generate both amplitude and phase modulation of optical beams. The fundamental scheme of both kinds of modulation is that the refractive index of an electro-optically active material can be different along two axes perpendicular to the direction of light propagation. Typically, three criteria can be employed to evaluate the performance of an optical modulator: 1) drive voltage, which should be as low as possible; 2) modulation speed; 3) device footprint. In recent years, many crystal and silicon based electro-optic modulators have been proposed and have achieved good performance.

Figure 13A:
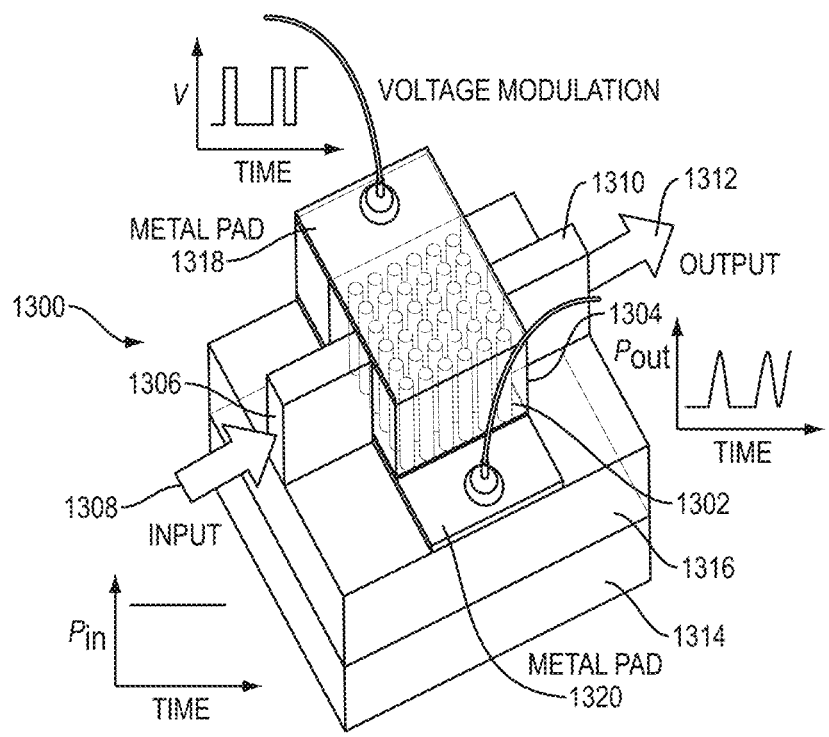
FIGS. 13A-13C show an electro-optic modulator having a 2D Dirac-cone metamaterial according to aspects of the present invention as well as frequency variations in ON and OFF states.

By way of example, FIG. 13A schematically depicts an electro-optic modulator according to an aspect of the present teachings, which is based on 2D Dirac-cone metamaterials disclosed in the present teachings. The exemplary electro-optic modulator is in the form of an integrated photonic device 1300, which includes a metamaterial comprising a 2D array of pillars 1302, e.g., the 2D arrangement of silicon pillars shown in FIG. 3, within an SU-8 matrix 1304. An input waveguide 1306 allows coupling input radiation 1308 into the metamaterial and an output waveguide 1310 receives the radiation 1312 exiting the metamaterial. The input waveguide 1308 couples the radiation into the metamaterial in plane of the array i.e., the pointing vector of the radiation is perpendicular to the length of the pillars. The input and output waveguides 1306 and 1310 and the metamaterial are disposed on an underlying substrate 1314, e.g., a silicon substrate coated with a layer of $SiO_2$ 1316, to form an integrated photonic device. Two metal pads 1318 and 1320 allow the application of a voltage across the metamaterial.

Figures 13B, 13C:
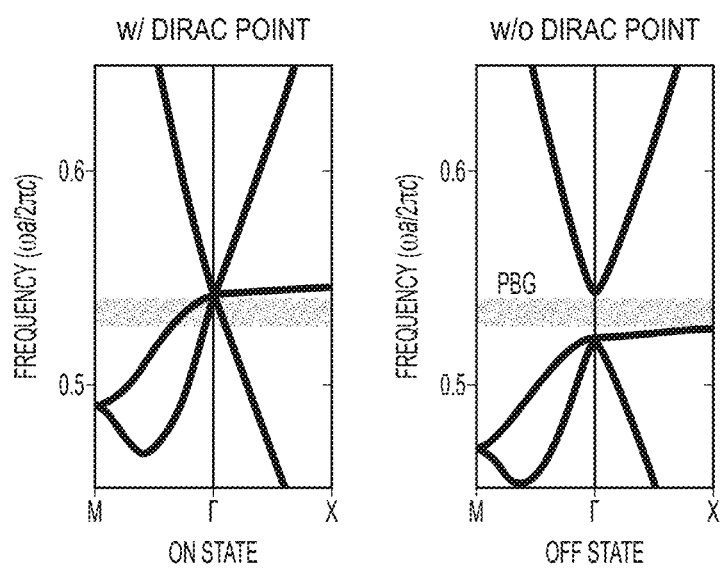

Because the existence of a Dirac cone at the center of the Brillouin zone can be very sensitive to the refractive indices of the constituents of the metamaterial. In some embodiments the existence of Dirac cone can be tuned by modulating the refractive indices of the silicon and SU-8 using an applied electric field. When the Dirac cone exists, the metamaterial shows a pass-band around the Dirac point, as shown in FIG. 13B, otherwise, a bandgap opens up around the wavelength of the original Dirac point, as shown in FIG. 13C. If the operating wavelength of the incident light is around the Dirac point, as shown by the gray regions in FIGS. 13B and 13C, the applied electric field determines whether or not incident light is transmitted through the modulator.

By way of example, such an amplitude modulator can be used for data transmission, where transmitted light corresponds to a '1' bit while no light corresponds to a '0' bit. Because the existence of a Dirac cone at the center of the Brillouin zone is very sensitive to the refractive indices of the constituents, the proposed modulator has the potential to achieve an ultralow drive voltage. In some embodiments, the electro-optic modulator can achieve a device footprint as small as 3.3×3.3 $\mu m^2$. To further improve the performance, high electro-optic coefficient polymers and shorter pillars can be employed.

In some embodiments, input laser light can be coupled into the above electro-optic modulator at proper wavelengths using lensed-fiber coupling. Then, the transmission levels of radiation through the electro-optic modulator can be observed for different biases. These results can then be utilized to find the operating points of the modulator. In some cases, the electro-optic modulator can be employed to modulate light using, for example, high-speed pseudo random binary signal generator, RF amplifier, O/E converter, and sampling oscilloscope. In some cases, an error detector can be used to evaluate the bit error.

In another embodiment, an on-chip beam-steering device that employs metamaterials according to the present teachings is disclosed. Although mechanical beam-steering has been widely used in sensing and imaging, conventional beam steering systems have limitations with regard to the speed and size of the system. An on-chip beam-steering device has a broad range of applications, such as laser printers and chip-to-chip optical communications. There are typically two criteria for evaluating the performance of a beam-steering technique: 1) the maximum beam-steering angle $\theta_{r\text{-}max}$, which has to be much larger than the beam divergence angle $\theta_{div}$; 2) the number of pixels that can be created in the far-field has to be larger than 1,000 to meet the requirement of practical applications.

Figure 14A:
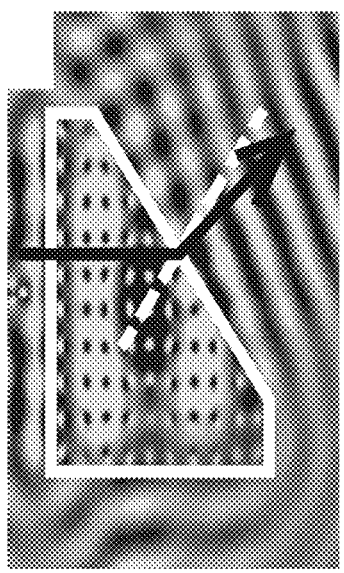
FIGS. 14A-14C show simulations of out of plane electric field distribution for a metamaterial in a triangular array, showing negative, zero, and positive refractive indices according to aspects of the present invention.
Figure 14B:
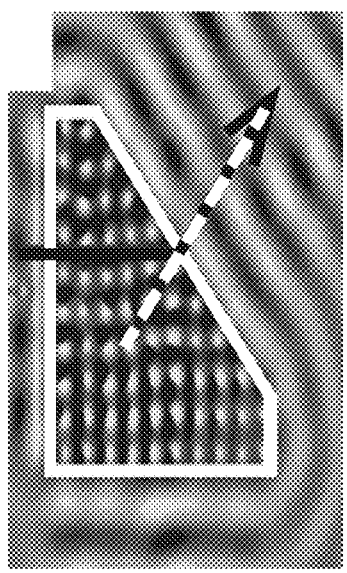
Figure 14C:
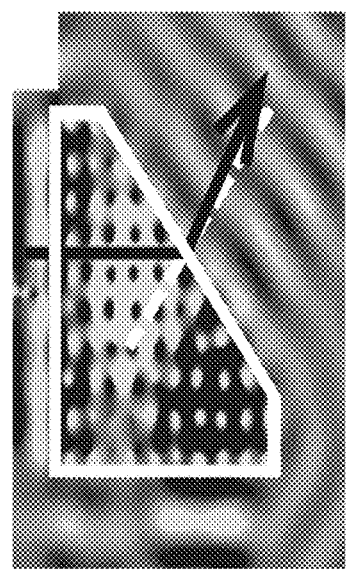

In some embodiments, beam-steering can be achieved by sweeping the operating wavelength of an input light around the Dirac point of a triangular-prism-shaped 2D Dirac-cone metamaterial in accordance with the present teachings (See for example FIGS. 14A-14C). Because this metamaterial can show a negative/zero/positive refractive index in the vicinity of the Dirac point, this method has the potential to yield a large $\theta_{r\text{-}max}$. In some embodiments, the beam-steering angles at different operating wavelengths can be measured using an optical camera. The number of pixels can then be calculated using, e.g., $\theta_{r\text{-}max}/\theta_{div}$.

FIGS. 14A to 14C show FDTD simulations of a theoretical metamaterial based on the structure of FIG. 3 with the following parameters for the 2D array of pillars: a=658 nm and r=170 nm. The metamaterial has the form of a triangular prism. The refractive index of the metamaterial around 1.55 µm can be determined by calculating the refraction angle of the light propagating through the prism by Snell's law. This provides a straightforward and unambiguous determination of the refractive index because the refraction angle depends only on the phase gradient that the light beam experiences when refracted from the angled output face of the prism. This is illustrated in FIGS. 14A to 14C by FDTD simulations of the out-of-plane electric fields distribution in the prism at 1.4 µm, 1.55 µm, and 1.7 µm, in which the metamaterial shows negative, zero, and positive refractive indices, respectively.

More specifically, FIG. 14A shows the phase-front of light at 1.4 µm, indicating positive refraction angle (positive-phase propagation) resulting from a positive refractive index. FIG. 14B shows zero refraction angle (zero phase propagation) due to a zero refractive index, and FIG. 14C shows a negative refraction angle (negative-phase propagation) resulting from a negative refractive index.

Another application of metamaterials according to the present teachings relates to super coupling. By using a channel that is filled with zero-refractive-index to connect two waveguides, the light can be efficiently transferred between these two waveguides regardless of the channel's shape and length. This phenomenon has three attractive features: 1) the light intensity is enhanced inside the narrow channel since the energy has to squeeze through this narrow channel without reflection; 2) the enhanced intensity keeps a uniform phase inside the channel due to fact that the wavelength in a zero-refractive-index metamaterial is infinitely long; and 3) this enhancement with its uniform phase inside the channel is independent of the shape and length of the channel. The potential applications of this phenomenon include: 1) boosting nonlinear effects and second-harmonic generation; 2) enhancing the photon density of state for emitters inside the zero-refractive-index structures; 3) sensing a defect inside the channel. By using the zero-refractive-index provided by a Dirac-cone metamaterial according to the present teachings for super-coupling, at least the following two advantages can be obtained when compared with using metallic, epsilon-near-zero metamaterials: 1) less energy losses along the channel because of the low-losses of the zero-refractive-index material; 2) less reflection at the boundary between waveguide and channel due to the fact that this zero-refractive-index is associated with a finite characteristic impedance.

Figure 15A:
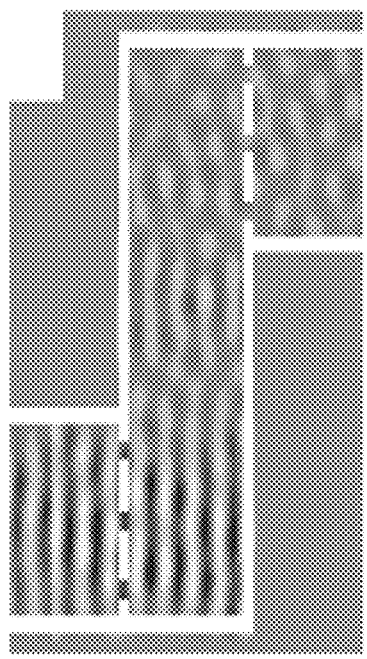
FIGS. 15A and 15B show simulations of out-of-plane electric field distribution in a 90 bending channel in which the channel is filled with air and a 2D Dirac-cone metamaterial respectively.
Figure 15B:
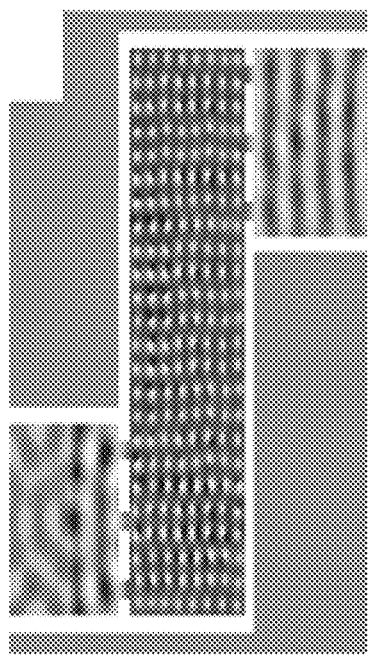

For example, a waveguide coupling structure according to some embodiments can include a 2D square array of silicon pillars. An example of such a structure is shown in FIG. 15, which includes gold layers as the top, bottom, and lateral walls of the waveguide (See FIG. 6 and the associated description for more details regarding this structure). As shown in FIG. 15A, electromagnetic waves can travel with little distortion through a waveguide that is filled with a Dirac-cone material according to the present teachings. More specifically, FIG. 15B is an FDTD simulation of out-of-plane electric field distribution in a 90-degree bending channel in which the channel is filled with a 2D Dirac-cone metamaterial according to an embodiment of the present teachings. The excitation at the bottom-right is plane wave and the boundaries of the channel are formed by gold. As a control, FIG. 15A shows simulation of out-of-plane electric field distribution in a 90-degree bending channel in a beam-steering system in which the channel is filled with air. The simulation shows that when the metamaterial is replaced with air, the incident waves are mostly reflected backwards by the 90 bending channel wall without super-coupling effect. In some embodiments, the performance of a waveguide coupling structure utilizing a Dirac-cone metamaterial according to the present teachings can be characterized by using the method similar to the one discussed above in connection with the electro-optic modulator.

Dirac-cone metamaterials according to the present teachings can have other applications. An axially varying heterostructure with a negative-refractive-index core can efficiently and coherently bring light to a complete standstill. Each wavelength component of the wave packet is stopped at a different core thickness, giving the spatial distribution of the spectrum and forming the "trapped rainbow" phenomenon. Compared with other methods of achieving slow light, this scheme has the advantages of broadband, high in-coupling efficiencies, and room temperature operation. Rainbow-trapping has been previously realized using tapered metamaterial waveguides with metallic structures.

In some embodiments, a negative-refractive-index Dirac-cone metamaterial according to the present teachings can be used as the core of a tapered waveguide to trap a rainbow. Compared with conventional methods, the use of negative-refractive-index Dirac-cone metamaterials according to the present teachings has the advantage of low-losses along the tapered waveguide.

More specifically, in some embodiments, a 2D Dirac-cone metamaterial with gradient geometric parameters can be utilized to achieve a negative-refractive-index over a broadband along the core of a tapered waveguide. In some embodiments, Dirac-cone metamaterials can be designed in accordance with the present teachings using effective-medium theory such that each metamaterial exhibits a negative-refractive-index at one of a plurality of different wavelengths. Then, the metamaterials can be arranged within the core of a tapered waveguide to achieve a particular value of negative-refractive-index at different core thicknesses corresponding to different operating wavelengths. The parameters of the entire waveguide can then be optimized using FDTD simulation. By way of example, the performance of such a tapered waveguide can be characterized by using an optical microscope to image the light propagation through the tapered waveguide from the open side of the waveguide.

Figure 16:
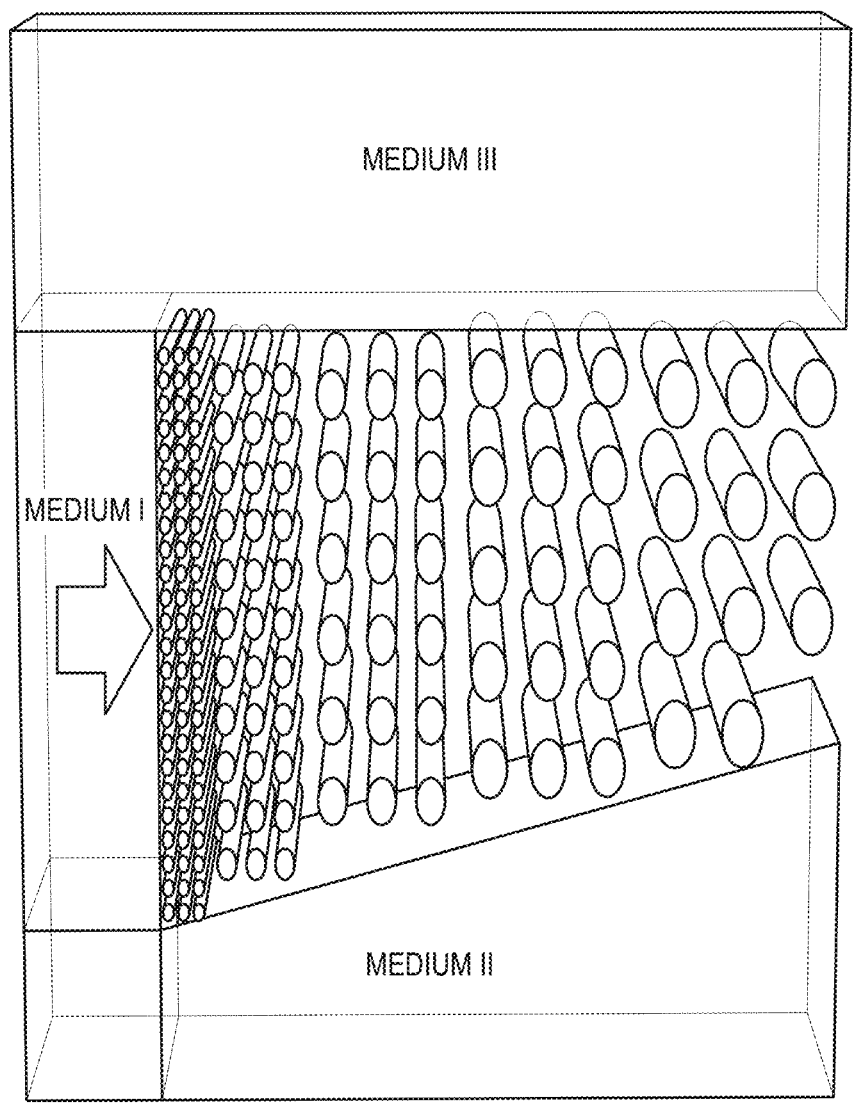
FIG. 16 shows one embodiment of Dirac-cone metamaterials used for rainbow trapping according to aspects of the present invention.

By way of further illustration, FIG. 16 schematically shows the use of Dirac-cone metamaterials according to the present teachings for rainbow trapping. The arrow indicates wave propagation direction. The media I, II, and III are three homogeneous and isotropic materials with respective refractive indices: $n_I > n_{II} > n_{III}$. A tapered waveguide include metamaterials according to the present teachings in the manner discussed above. A guided wave can propagate from a conventional waveguide formed of medium I to the negative-refractive-index medium, in which it propagates smoothly due to the slow reduction in the thickness of the waveguide core. The smaller wavelength components of the wave are trapped at the larger core thickness (left), while the larger components are trapped at the smaller core thickness (right).

Figure 17:
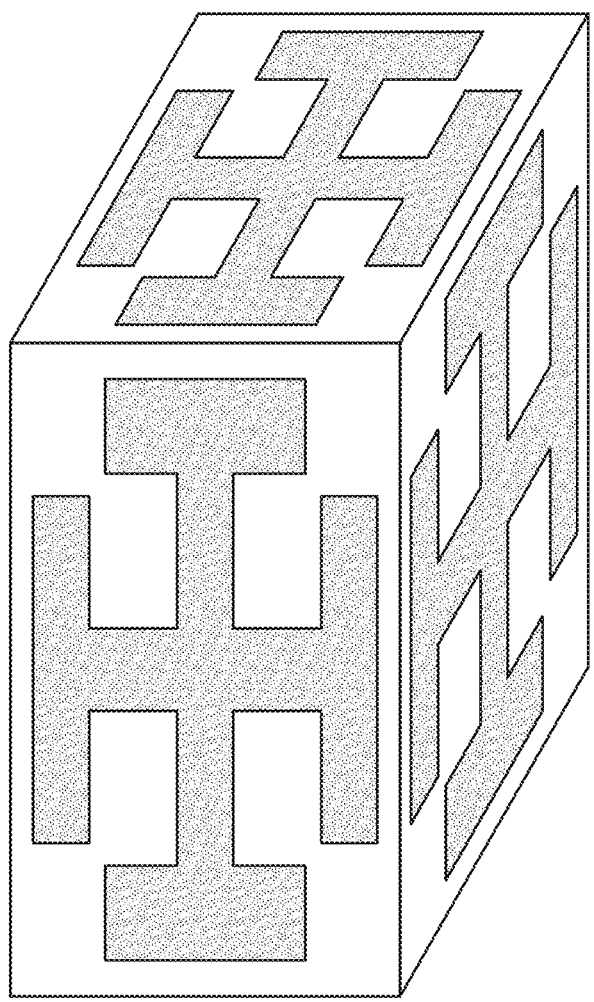
FIG. 17 is a unit cell of a 3D Dirac-cone metamaterial according to aspects of the present invention.

In another aspect, the present teachings provide 3-dimensional (3D) Dirac-cone metamaterials. The presence of a Dirac cone at the zone center is only determined by the spatial symmetry of two modes rather than the detail of the 2D/3D photonic structure. This provides the freedom to design a 3D Dirac-cone metamaterial using available fabrication and characterization techniques. In some embodiments, a cubic array of silver spheres or silver unit-cell with regular cube symmetry can be employed to form a 3D metamaterial according to the present teachings. In some embodiments, a 3D structure can be designed theoretically and optimized using, e.g. FDTD simulation taking into account the fabrication tolerance and material properties. By way of illustration, FIG. 17 schematically shows a unit cell of a 3D Dirac-cone metamaterial according to an embodiment of the present teachings, incorporating repeating patterns of silver.

In some embodiments, femtosecond laser direct-writing methods, such as those disclosed in published international patent application PCT/US2012/022036 entitled "Micro- and nano-fabrication of connected and disconnected metallic structures in three-dimensions using ultrafast laser pulses" (WO 2012100167), and articles entitled "Fabrication of disconnected three-dimensional silver nanostructures in a polymer matrix," published in Applied Physics Letters, vol. 100, p. 063120 (February 2012), and "A method to fabricate disconnected silver nanostructures in 3D," published in Journal of Visualized Experiments, vol. 69, p. e4399 (2012), all of which are herein incorporated by reference in their entirety, can be employed to fabricate 3D patterns of a metallic structure in a polymeric matrix. By way of example, using these femtosecond direct-writing methods silver nanostructures with a minimum feature size of about 80 nm and a minimum spacing of about 150 nm can be generated in a polymeric matrix.

Some embodiments of zero index materials (ZIM) based on photonic Dirac-cone achieved by the modal degeneracy at the center of Brillouin zone may be lossy, e.g., because of the radiation loss at $\Gamma$ point and/or material absorptions. Further, the existence of a Dirac-cone at $\Gamma$ point can be sensitive to structural parameters. This can yield to low fabrication yield due to tolerances in the fabrication process. Various embodiments disclosed herein address this issue. For example, in one embodiment, an on-chip low-loss zero index material (LLZIM) with single mirror above a pillar array is disclosed. In another embodiment, an all-dielectric zero index material (AD-ZIM) with super-robust photonic Dirac-cone, which can be obtained by designing the pitch and height of a dielectric pillar array, is disclosed. As described further below, the concept of the robustness is demonstrated for frequencies in the telecommunications regime by measuring the refraction angles in photonic crystal prims fabricated according to the present teachings.

Figures 18A, 18B, 18C:
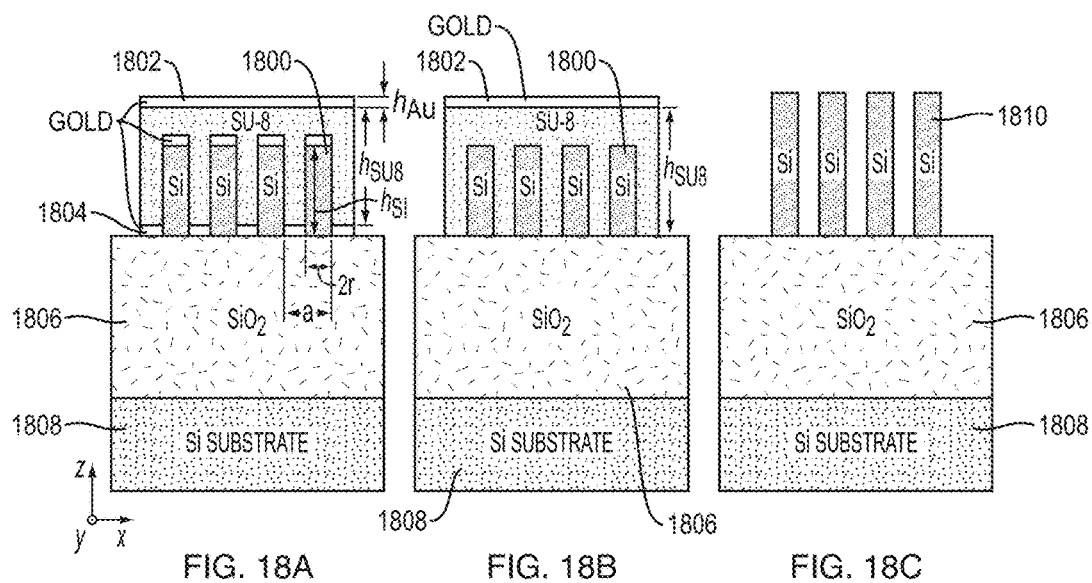
FIGS. 18A-18F show schematics of various embodiments of ZIM structures including LLZIM and AD-ZIM, and their representative xy mode distributions in single unit cell forming PDC at Γ point according to aspects of the present invention.

FIGS. 18A-18C schematically show exemplary embodiments of zero index photonic Dirac-cone (PDC) metamaterial structures according to the present teachings that and their representative xy mode distributions in single unit cell. Specifically, FIG. 18A shows a cross-sectional view of the structure shown and described above in relation to FIG. 6A, having pillars 1800 in SU-8 polymer, upper mirror 1802 (e.g. gold), lower mirror 1804, disposed on a $SiO_2$ layer 1806, which is in turn disposed on a silicon substrate 1808.

FIG. 18B shows a cross-sectional view of another embodiment of a ZIM structure with low loss, also referred to herein as low loss zero index metamaterial (LLZIM) having pillars 1800 in SU-8 polymer, a single upper mirror layer 1802, with the pillars being disposed on a $SiO_2$ layer 1806, which is in turn disposed on a Silicon substrate 1808.

FIG. 18C shows an embodiment of an AD-ZIM structure having dielectric pillars 1810 formed on a $SiO_2$ layer 1806, which is in turn disposed on a silicon substrate 1808.

Various structural parameters of the above embodiments can be adjusted so as to optimize those structures, e.g., to reduce loss, increase mode confinement, etc. As shown in FIG. 18A, some examples of such parameters include, without limitation, the lattice constant a, pillar radius r (or diameter 2r), pillar height $h_{Si}$, the gold mirror thickness $h_{Au}$, and the thickness of SU-8 polymer $h_{SU-8}$ in the case of the ZIM shown in FIG. 18A, where $h_{SU-8}$ corresponds to the distance between top and bottom mirrors 1802 and 1804. In the embodiment of FIG. 18B, $h_{SU-8}$ corresponds to the distance between the top mirror and the surface of $SiO_2$. The structure of LLZIM in FIG. 18B may be the same as the structure of the ZIM shown in FIG. 18A, without bottom mirrors. In the case of the ADZIM shown in FIG. 18C, all the mirrors and SU-8 polymer layer are removed, and in some embodiments, the pillar height $h_{Si}$ may be ~60% taller than the pillar heights in the other ZIMs.

Figures 18D, 18E, 18F:
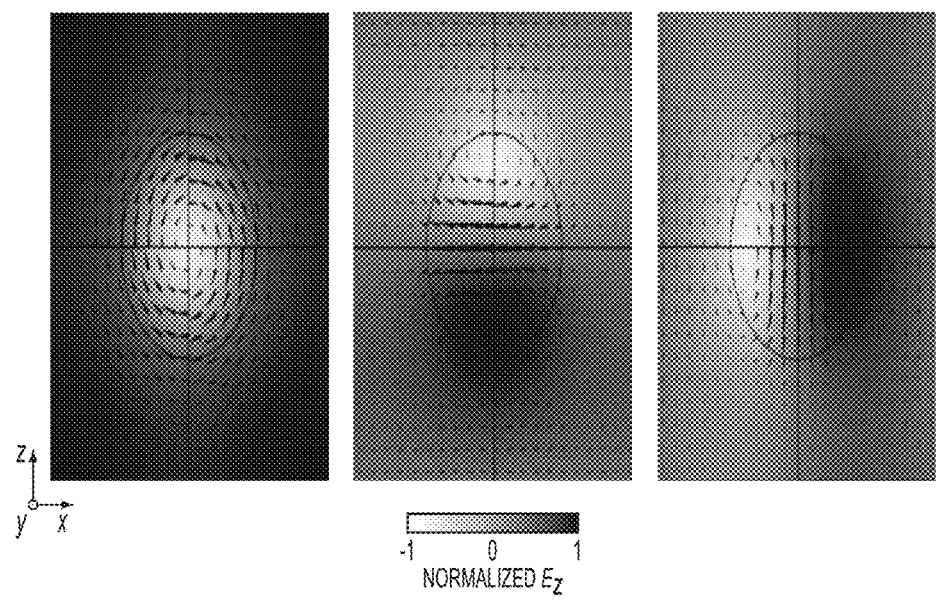

FIGS. 18D, 18E, and 18F show the xy electromagnetic mode distributions calculated in single unit cell with periodic boundary conditions for the ZIMs in FIGS. 18A, 18B, and 18C. These are the original modes giving the electric and magnetic flux loops around the pillar. The shading shows Ez, and the black arrows show the H vector. Specifically, FIG. 18D shows a magnetic loop mode named as "Monopole mode," FIG. 18E shows an electric loop mode named as "Dipole mode," and FIG. 18F shows another degenerate "Dipole mode" forming the flat band but cannot be excited in this measurement. Here, the results are shown with the input k vector $(k_x, k_y)$ of $(0, \pi/80a)$. Throughout this disclosure, the modes of FIGS. 18D and 18E are referred to as "Monopole mode" and "Dipole mode", respectively. The ZIM based on PDC is formed when the pillar geometry is optimized so that both modes are degenerated at $\Gamma$ point. In some embodiments, there may also be another degenerated "Dipole mode" with an orthogonal field distribution relative to that of the original Dipole mode as shown in FIG. 18F. This mode is always degenerate with the original Dipole mode at Γ point since their field distributions are essentially the same. In this case, this mode cannot be generated by applying a plane wave excitation since it has an odd distribution against the propagation direction y.

Figure 19A:
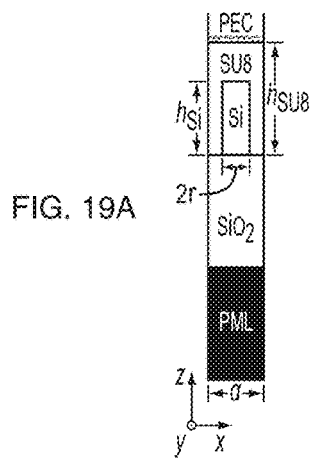
FIG. 19A is a schematic model of a unit cell with a PEC boundary at the top of the SU-8 layer.
Figure 19B:
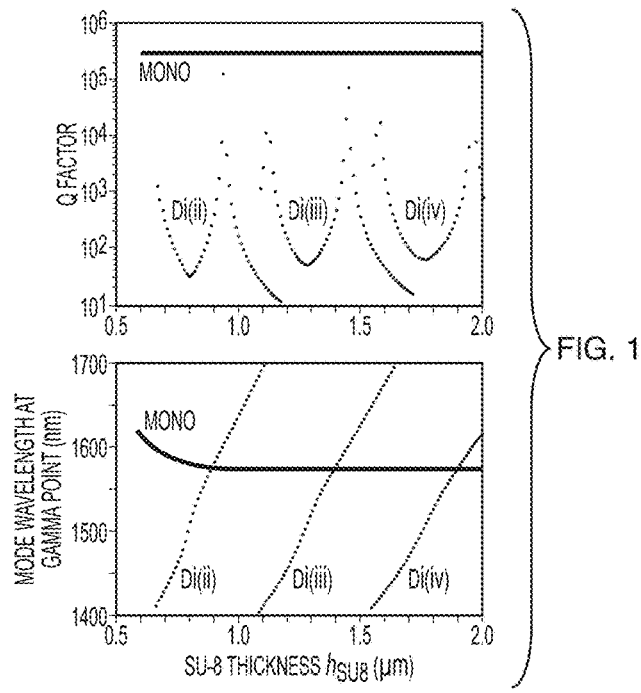
FIG. 19B shows simulated Q and λ as a function of $h_{SU-8}$ for the model in FIG. 19A.
Figure 19C:
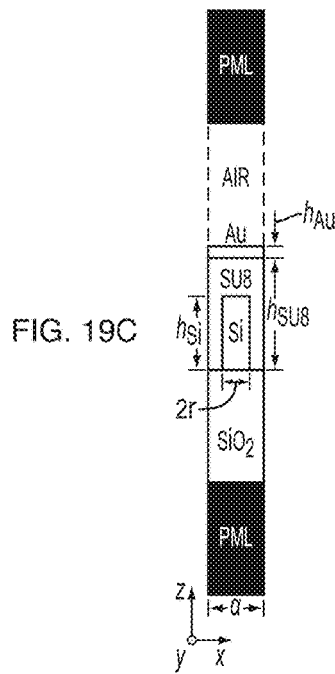
FIG. 19C is a schematic model of a unit cell with a realistic gold mirror having $h_{Au}$=100 nm.
Figure 19D:
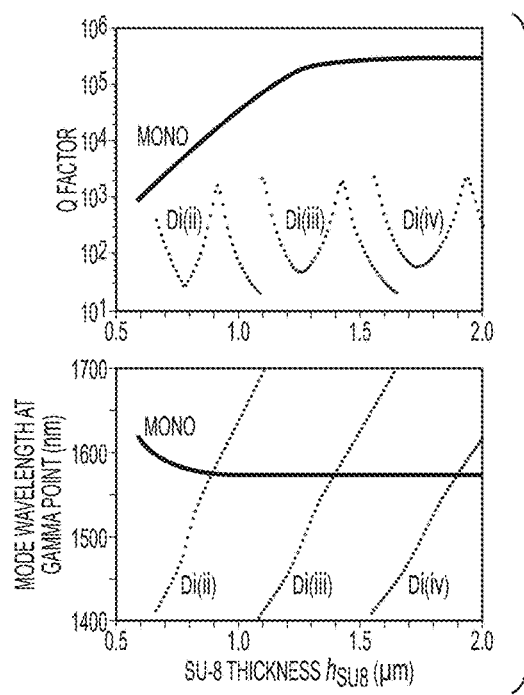
FIG. 19D shows simulated Q and λ as a function of $h_{SU-8}$ for the model in FIG. 19C.

Periodic structures with single mirror, as shown in FIG. 18B, can confine the scattered light by tuning the spacing between the mirror and the periodic structure. In this case, a confinement against out-of-plane direction can guide resonance modes in the photonic crystal (PhC). To verify this theory for LLZIM, a single unit cell was simulated with a Si pillar with $h_{Si}$=512 nm and perfect electric conductor (PEC) boundary at the top of the SU-8 layer as shown in FIG. 19A. FIG. 19B shows simulated quality factor (Q) and wavelength (λ) as a function of $h_{SU-8}$ for the model in FIG. 19A. FIG. 19C is a schematic model of a unit cell with a realistic gold mirror having $h_{Au}$=100 nm. FIG. 19D shows simulated Q and λ as a function of $h_{SU-8}$ for the model in FIG. 19C.

By applying this model with xy periodic boundary condition, Q factor and λ of both modes as a function of $h_{SU-8}$ for the model in FIG. 19A were calculated as shown in FIG. 19B. Here, structural parameters of a=800 nm and r=200 nm were used. These parameters are different from the optimized parameters described further below. In terms of the meaning of Q factor in this simulation, this Q is limited by the absorption loss of the material and that of perfect matching layer (PML) boundary ($Q_{abs}$), and the radiation loss that results from Γ point operation ($Q_v$)—therefore, Q can be expressed as $Q^{-1}=Q_{abs}^{-1}+Q_v^{-1}$.

The above simulations show that the monopole mode exhibits a substantially constant Q and λ as a function of $h_{SU-8}$ except for the region $h_{SU-8}$<0.9 μm. Without being limited to any particular theory, this is because the Monopole mode is one of the guided resonance modes in this type of pillar arrays, and hence it is not sensitive to the spacing or presence of the PEC boundary. In general, Q factor of guided resonance modes should be infinite, but in the unit cell, the evanescent tail of the mode is slightly absorbed by the bottom PML layer (thickness of $SiO_2$ layer is 2 μm, which is not large enough to neglect absorption by this layer), which results in a finite Q of around $10^5$. Herein, this high Q is indicative of a loss-less behavior of the guided resonance mode. On the other hand, for the Dipole mode, the clear phase interference effect is seen based on Fabry-Perot resonance between the mirror and the pillars. Such a Fabry-Perot resonance can result in a Q as high as that exhibited by the Monopole mode when $h_{SU-8}$ is properly selected. λ is also changing accordingly, and this λ change tunes the degree of the phase interference. Therefore, high Q can be realized by placing the single mirror at the appropriate position. For the next step, the PEC boundary was changed based on a realistic gold mirror with $h_{Au}$=100 nm, and 2 μm-thick air layer with the PML layer outside of the gold mirror as shown in FIG. 19C. The Q factor and λ of both modes as a function of $h_{SU-8}$ were calculated as shown in FIG. 19D. Because of the absorption loss of the gold, both Q factors are degraded. In the case of the Monopole mode, the absorption becomes almost comparable with the absorption of the PML layer when $h_{SU-8}$~1.5 μm. On the other hand, the Dipole mode shows similar fringes appearing in FIG. 19B, but the Q factor is limited to ~1600 because of the gold absorption. In some embodiments, the Q factor for a LLZIM may be improved more than 30 times compared to a ZIM according to aspects disclosed herein. But still the Dipole mode's wavelength $\lambda_{di}$ giving high Q does not match with the Monopole mode's wavelength $\lambda_{mono}$ in this simulation; accordingly, there is a need for them to be the same for optimized LLZIM.

Figure 20A:
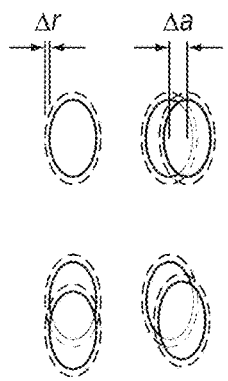
FIGS. 20A-20C show schematics illustrating optimization of one embodiment of an LLZIM according to the present teachings.
Figure 20B:
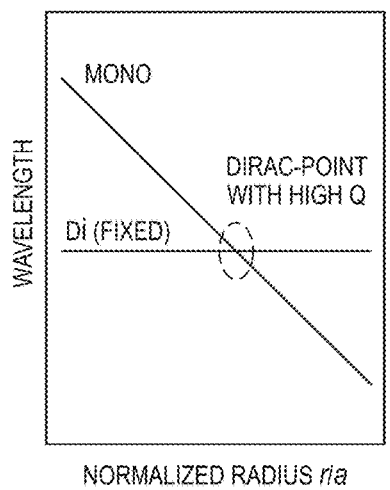
Figure 20C:
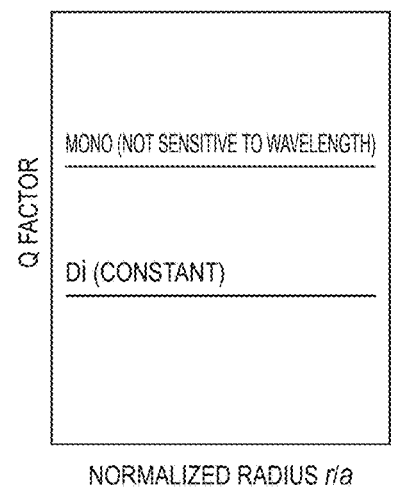

FIGS. 20A-20C show schematics illustrating optimization of one embodiment of an LLZIM by matching $\lambda_{di}$ and $\lambda_{mono}$ while maintaining a high Q. Since the Q of the Dipole mode is sensitive to $\lambda_{di}$, the Dirac-point with this $\lambda_{di}$ must be found. This may be achieved conveniently by only changing $\lambda_{mono}$ without changing $\lambda_{di}$. This operation is doable by changing two kinds of structural parameters properly. For example, $\lambda_{di}$ may be changed with the structural change for a and r. FIG. 20A illustrates changing both a and r simultaneously so as to change only $\lambda_{mono}$ while keeping $\lambda_{di}$ constant. FIG. 20B shows $\lambda_{di}$ and $\lambda_{mono}$ as a function of the radio of r and a (r/a), indicating that $\lambda_{di}$ remains substantially constant as $\lambda_{mono}$ changes. The intersection of the two curves corresponds to the r/a that would lead to a Dirac-cone at Γ point. FIG. 20C shows Q for the monopole mode and the dipole mode are substantially insensitive to parameter r/a, e.g., for values of r and a shown in FIG. 21C.

Figure 21A:
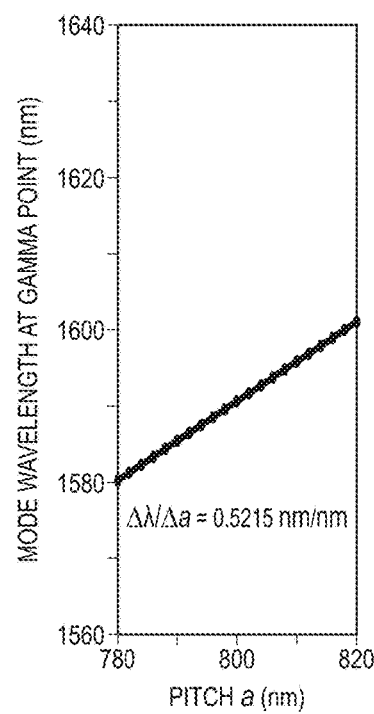
FIGS. 21A-21C show structural parameters for LLZIM optimization for one embodiment according to aspects of the present invention.
Figure 21B:
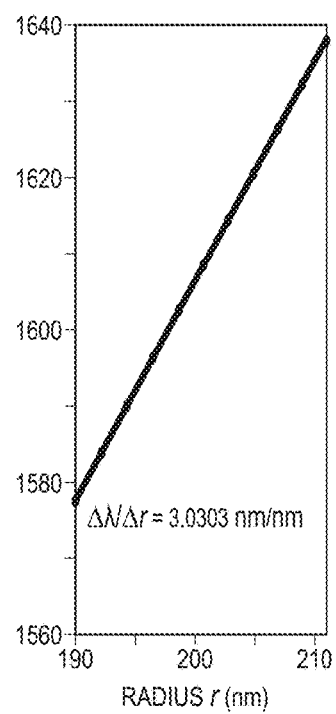
Figure 21C:
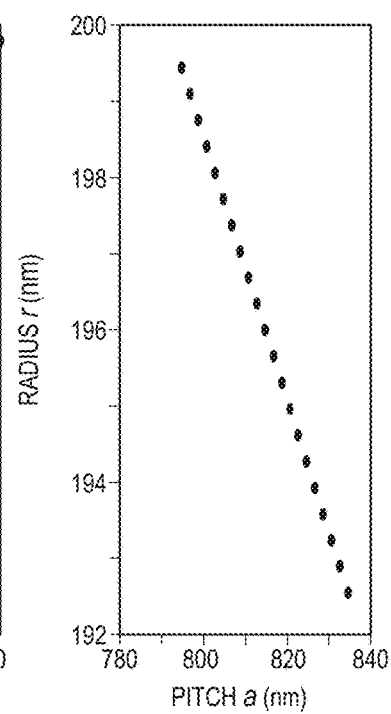

FIGS. 21A and 21B show $\lambda_{di}$ change with the structural change for a and r for an embodiment where $h_{Si}$=512 nm, $h_{SU-8}$=920 nm, $h_{Au}$=100 nm. Specifically, FIG. 21A shows $\lambda_{di}$ as a function of a. FIG. 21B shows $\lambda_{di}$ as a function of r. Both Figures show almost linear behavior, which can be approximated by linear functions. By fitting these curves with linear functions, slopes of $\Delta\lambda_{di}/\Delta a$~0.52 nm/nm and $\Delta\lambda_{di}/\Delta r$~3.03 nm/nm are obtained. According to the values of these slopes in FIGS. 21A and 21B, a series of different pairs of a and r can be obtained as shown in FIG. 21C that keep $\lambda_{di}$ constant. In other word, $\lambda_{di}$ can be kept constant by tuning both a and r. On the other hand, usually $\lambda_{mono}$ has different slopes compared to $\lambda_{di}$, so only $\lambda_{mono}$ can shift by applying these parameters.

Figure 22A:
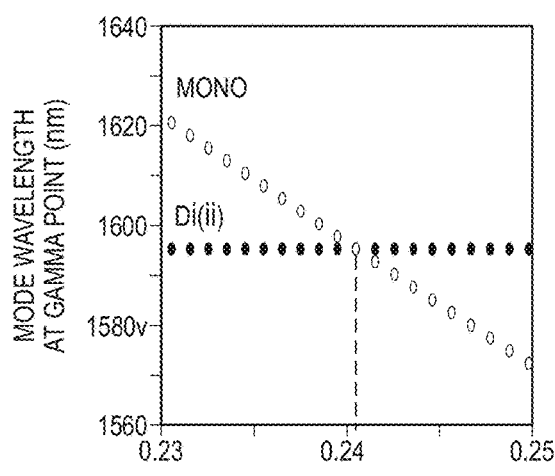
FIGS. 22A-22C show matching Dirac-point and high Q by applying the parameters in FIG. 21C, and simulated band structure around the Γ point with optimal parameters according to aspects of the present invention.
Figure 22B:
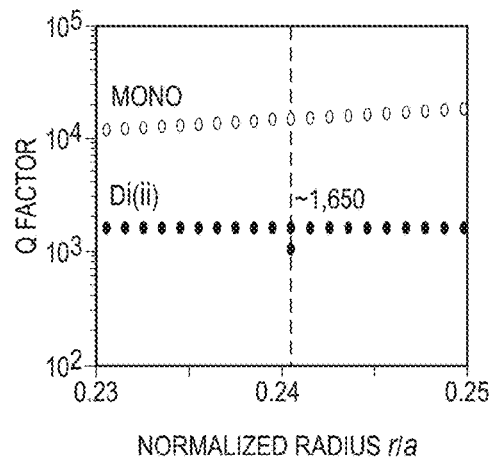
Figure 22C:
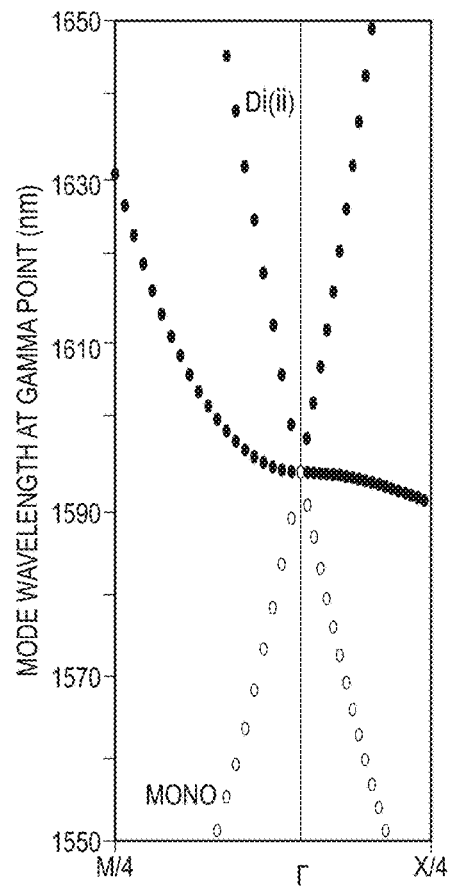
Figure 23:
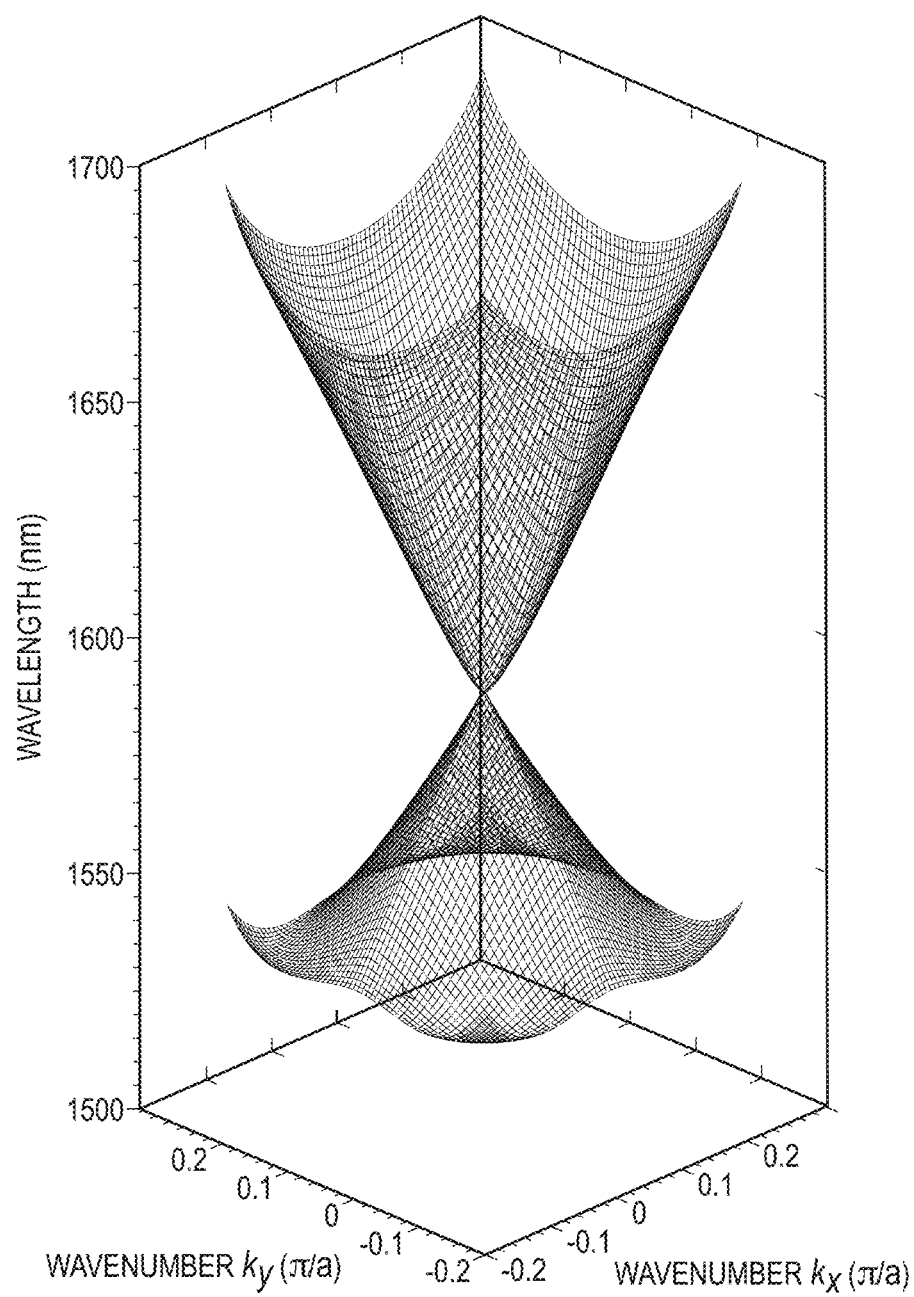
FIG. 23 shows simulated 3D dispersion surfaces of a PDC for an LLZIM with the same parameters as FIG. 22C according to aspects of the present invention.

FIGS. 22A-22C illustrate utilizing the parameters depicted in FIG. 21C to render the monopole mode and the dipole mode degenerate at Γ point while maintain a high Q. FIGS. 22A and 22B show the change of λ and Q for both modes when the parameters in FIG. 21C are applied. Therefore, the modes behave in the same way as shown and described above in relation with FIGS. 20A-20C—the Dipole mode's Q is constant since $\lambda_{di}$ is constant and only $\lambda_{mono}$ shifts with the parameters to find Dirac-point. Specifically, FIG. 22A shows λ as a function of r/a. The crossing point of both modes indicates obtaining a Dirac-point with high Q. FIG. 22B shows Q as a function of the normalized radius r/a. By this optimization, optimal parameters of a=815 nm, r=196 nm, $h_{SU-8}$=920 nm, $h_{Si}$=512 nm and $h_{Au}$=100 nm are obtained for an embodiment of LLZIM with a single gold mirror. FIG. 22C shows the simulated band structure around the Γ point with these optimal parameters. Additionally, FIG. 23 shows the simulated 3D dispersion surfaces of the Monopole mode and Dipole mode in the rage of $(k_r, k_y)$=([−X/4 X/4], [−M/4 M/4]) for the embodiment having the same parameters as FIG. 22C. FIG. 23 clearly shows a PDC, and the dispersion around the Γ point exhibits a more linear-like behavior compared to an embodiment of the ZIM with double mirrors. Thus, an LLZIM with 30 times higher Q has been obtained theoretically through the above simulations and optimizations.

In other embodiments, another dielectric multiple layer mirror may be used instead of gold, to realize an LLZIM with a lower loss. In such embodiments, the loss may only be limited by the scattering loss, e.g., due to fabrication imperfections.

As shown and described above in relation with FIG. 18C, another embodiment disclosed herein is an AD-ZIM. One advantage of AD-ZIMs is that in many embodiments they are robust against structural variations, for example due to fabrication errors, thus making them easier to fabricate for practical use. Robustness may be achieved even with simple AD-ZIM structures.

Figure 24A:
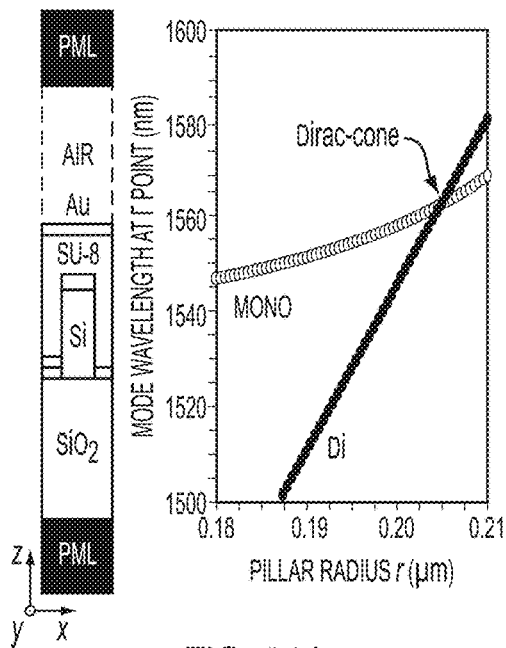
FIGS. 24A-24C show robustness of a ZIM having a double mirror and robustness of an AD-ZIM respectively, and simulated band structures around the Γ point for the AD-ZIM according to aspects of the present invention.
Figure 24B:
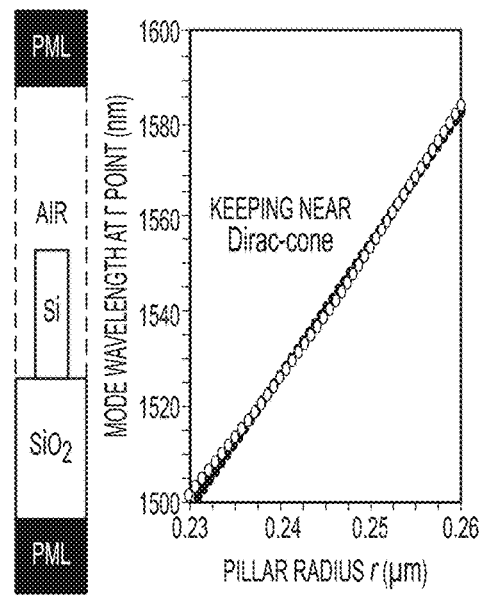
Figure 24C:
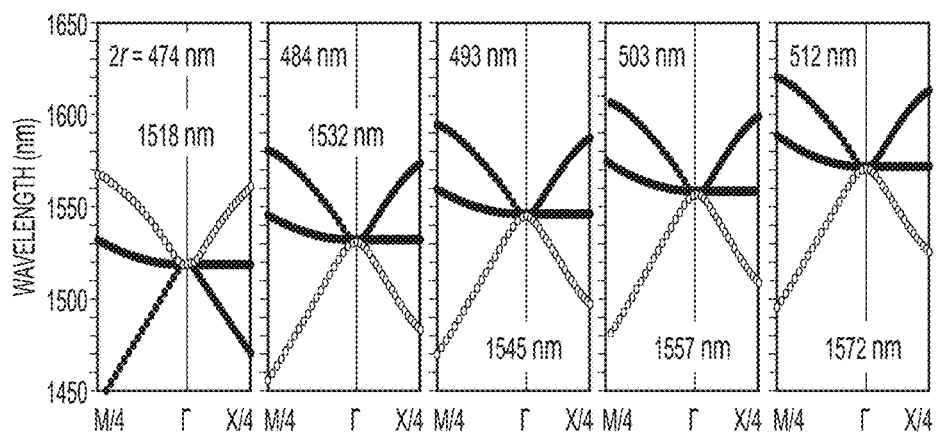

FIGS. 24A-24C schematically demonstrate robustness of an AD-ZIM according to an embodiment in comparison to a ZIM with a double mirror. FIG. 24A shows mode wavelength λ as a function of r for a ZIM having a double mirror, as shown for example in FIG. 18A, and having parameters a=690 nm, $h_{Si}$=512 nm, $h_{SU-8}$=1.25 mm, and $h_{Au}$=100 nm. As described above in relation with the LLZIM, both modes have different slopes Δλ/Δr, so the degeneracy never happens without having a proper value of r. In a typical fabrication process, the fabrication error associated with r is dominant more than those associated with a and $h_{Si}$, so this characteristic may degrade the robustness of a ZIM with double mirrors. On the other hand, FIG. 24B shows an AD-ZIM (See also FIG. 18C) with pillars ~59% taller than the pillars of the ZIM shown in FIG. 24A, with $h_{Si}$=815 nm, and a=879 nm. FIG. 24B further shows λ as a function of r for the AD-ZIM. Once the structural parameters are selected properly in ADZIM, both modes exhibit almost the same slope and the same λ for the same pillar radius, as shown in FIG. 24B. This behavior makes forming PDC more robust and stable. In some embodiments, the PDC need not be perfect, but may be near or substantially a PDC, having a narrow bandgap that is substantially zero. Near PDCs whose bandgap is substantially small exhibit useful behavior.

FIG. 24C shows the calculated band diagrams around the Γ point with five different sizes of 2r (2r=474 nm, 484 nm, 493 nm, 503 nm and 512 nm respectively) for the AD-ZIM of FIG. 24B. All of these implementations show near PDC behavior with a certain range of r. An aspect of robustness is that the λ of zero index may be tuned by changing r and keeping a constant. Thus, in some embodiments, further optimizations may not be necessary to connect AD-ZIMs with different λ of zero index in various applications.

Figure 25:
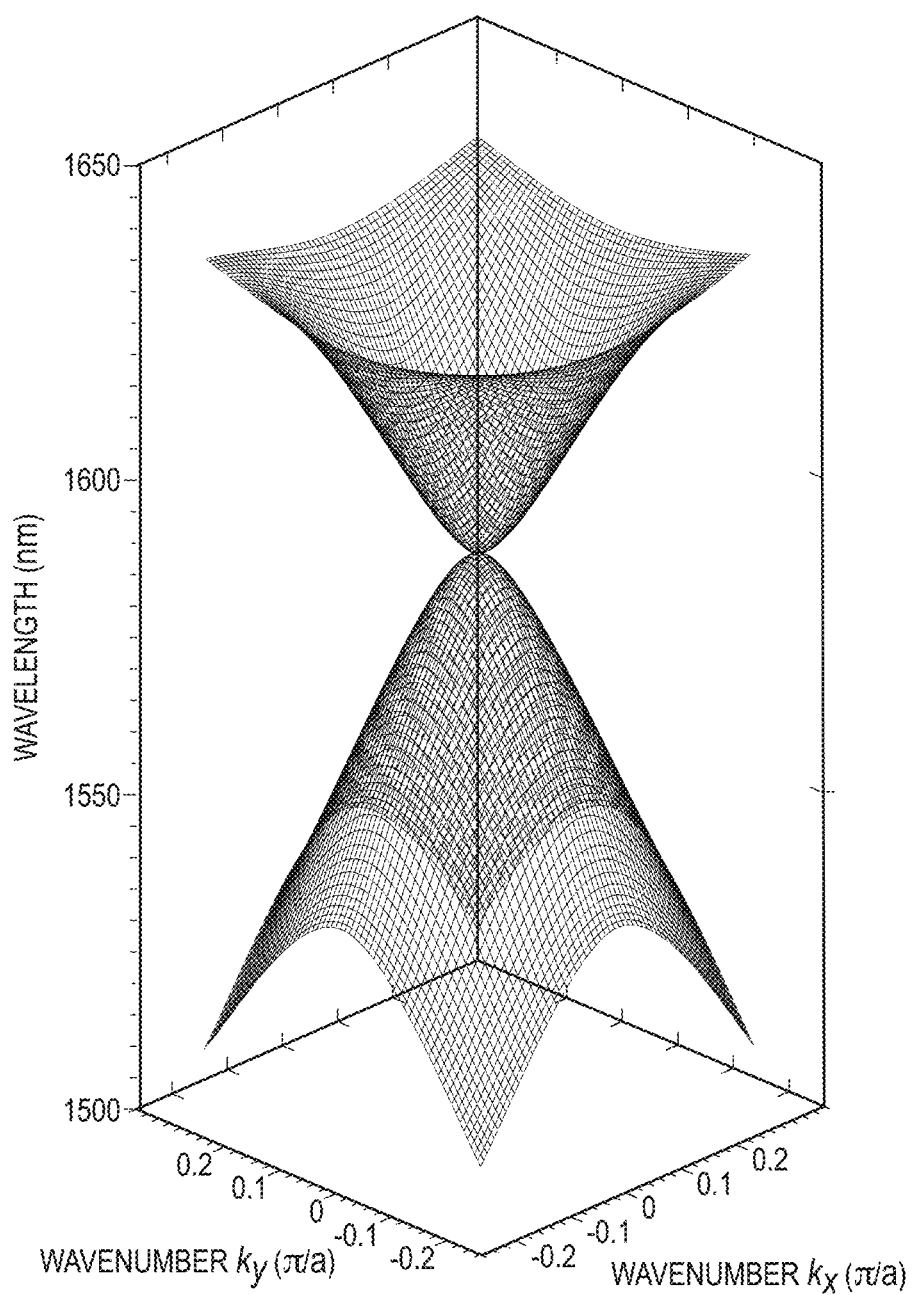
FIG. 25 shows simulated 3D dispersion surfaces of an AD-ZIM according to aspects of the present invention.

FIG. 25 shows calculated 3D dispersion surfaces of a robust AD-ZIM with a=918 nm, $h_{Si}$=850 nm, r=250 nm, and k vector ($k_x$, $k_y$) of ([−M/4 M/4], [−X/4 X/4]). In the case of some AD-ZIMs, the dispersion around the Γ point becomes more quadratic shaped in comparison to other ZIMs. Thus, in some embodiments, near zero index may be achieved even if k is slightly shifted from Γ.

In some embodiments, an effective refractive index of a unit cell of metamaterial according to the present teachings can be used to determine values for structural parameters of the metamaterial, e.g., the radius, and periodicity of the pillars. For example, a mode equivalent index $n_{eq}$ can be calculated using the following relationship of $n_{ea}^2=\Sigma_{m=1}^n \eta_m \eta_m^2$, where n is the index of each material part in a unit cell. Basically, the index sensitivity of the resonant mode is proportional to $n_{eq}^{-1}$. Thus, Δλ/Δr could also have a similar relationship with $n_{eq}^{-1}$ if the perturbation of r is substantially small.

Figure 26A:
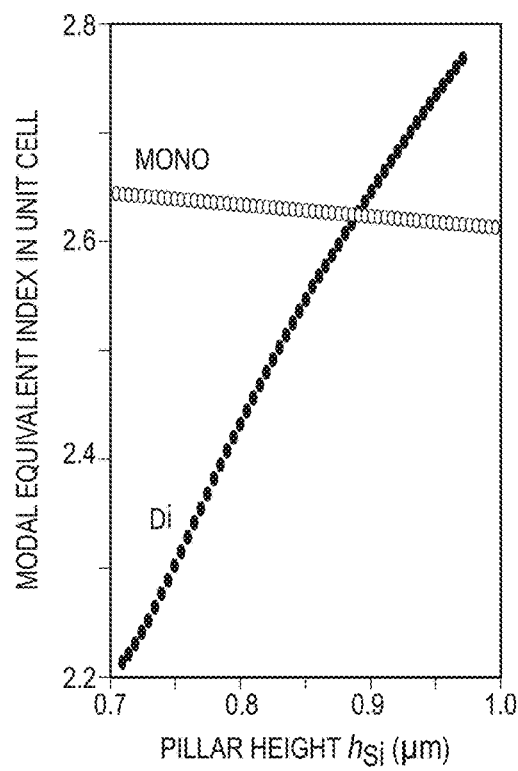
FIGS. 26A-26B show verification of the relationship between $n_{ew}$ and Δλ/Δr according to aspects of the present invention.
Figure 26B:
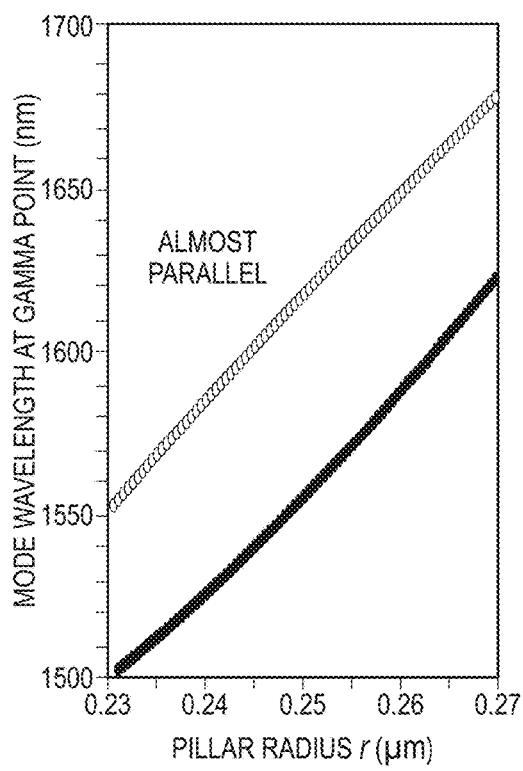

FIGS. 26A-26B show verification of the relationship between $n_{eq}$ and Δλ/Δr. To verify this relationship, $n_{eq}$ is calculated for both modes with different pillar heights $h_{Si}$ as shown in FIG. 26A, for an AD-ZIM embodiment having a=879 nm and r=256 nm, and where the material index of Si, $n_{Si}$=3.42, and of SiO$_2$, $n_{SiO2}$=1.45. The graph in FIG. 26A shows that the $n_{eq}$ of both modes are equal when $h_{Si}$=885 nm. FIG. 26B shows modal wavelength λ as a function of r for an embodiment where a=879 nm and $h_{Si}$=885 nm, which corresponds to the $n_{eq}$ of both modes being equal, resulting in equal or substantially equal slopes for both modes.

According to this simulation result, two constrains must be satisfied in some embodiments to design a robust ADZIM; 1) $\lambda_{mono}=\lambda_{di}$, and 2) $n_{eq\_mono}=n_{eq\_di}$. To satisfy these two conditions, Δλ/Δa, Δλ/Δ$h_{Si}$ and Δ$n_{eq}$/Δa, Δ$n_{eq}$/Δ$h_{Si}$ were investigated for both modes in order to design proper a and $h_{Si}$.

Figure 27A:
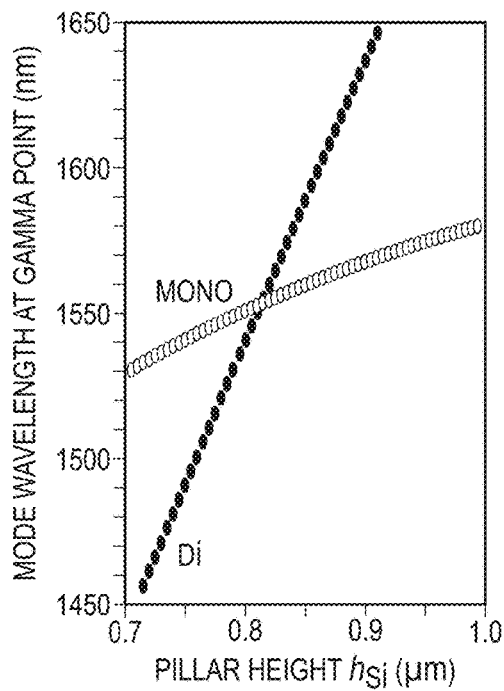
FIGS. 27A-27D show structural dependences of various modal parameters in an ADZIM according to aspects of the present invention.
Figure 27B:
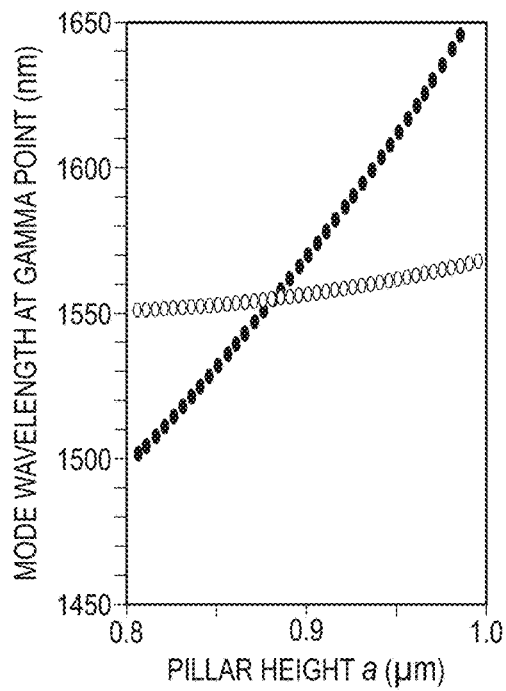
Figure 27C:
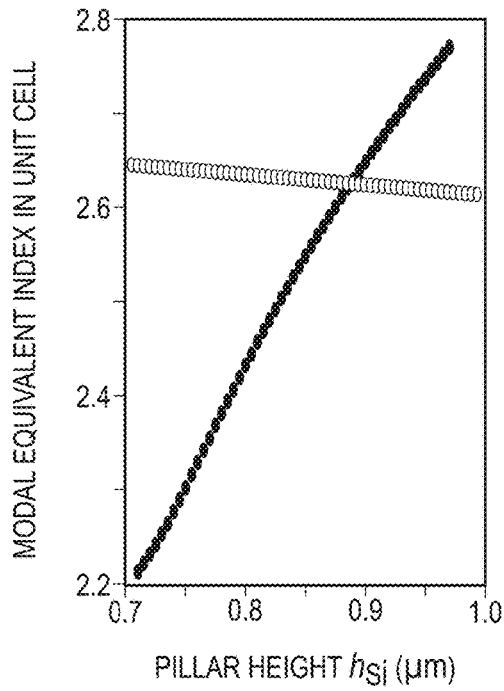
Figure 27D:
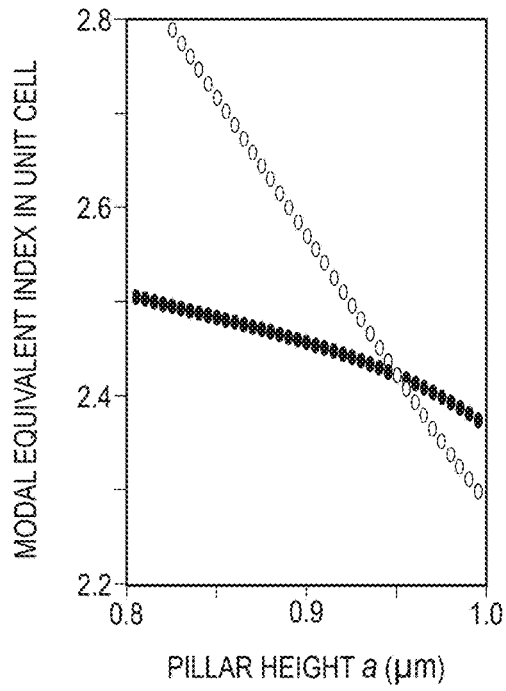

FIGS. 27A-27D show investigation of the dependences of modal wavelength and modal equivalent index on structural parameters to design a robust AD-ZIM. Specifically, FIG. 27A shows λ as a function of $h_{Si}$. FIG. 27B shows λ as a function of a. FIG. 27C shows $n_{eq}$ as a function of $h_{Si}$, and FIG. 27D shows $n_{eq}$ as a function of a. In one embodiment, linear approximations may be applied for all the curves. Thus, $\lambda_{mono}$, $\lambda_{di}$, $n_{eq\_mono}$ and $n_{eq\_di}$ may be expressed by using the coefficients of A, B, C, D, E, F, A', B', C', D', E', F':

$$\lambda_{mono}=Ah_{Si}+Ba+C,$$

$$\lambda_{di}=A'h_{Si}+B'a+C',$$

$$n_{eq\_mono}=Dh_{Si}+Ea+F,$$

$$n_{eq\_di}=D'h_{Si}+E'a+F'.$$

Figure 28A:
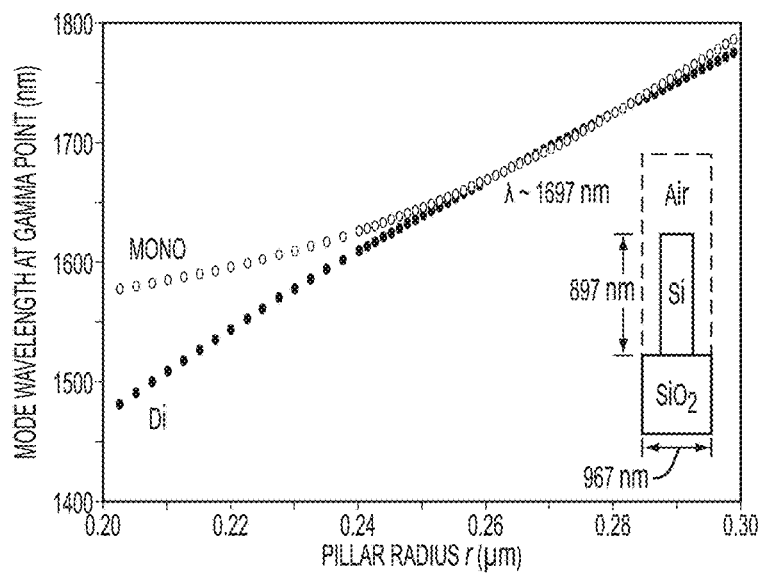
FIGS. 28A-28E show optimized robustness derived from the slopes in FIGS. 27A-27D and tuning with the scaling law according to aspects of the present invention.
Figures 28B, 28C, 28D, 28E:
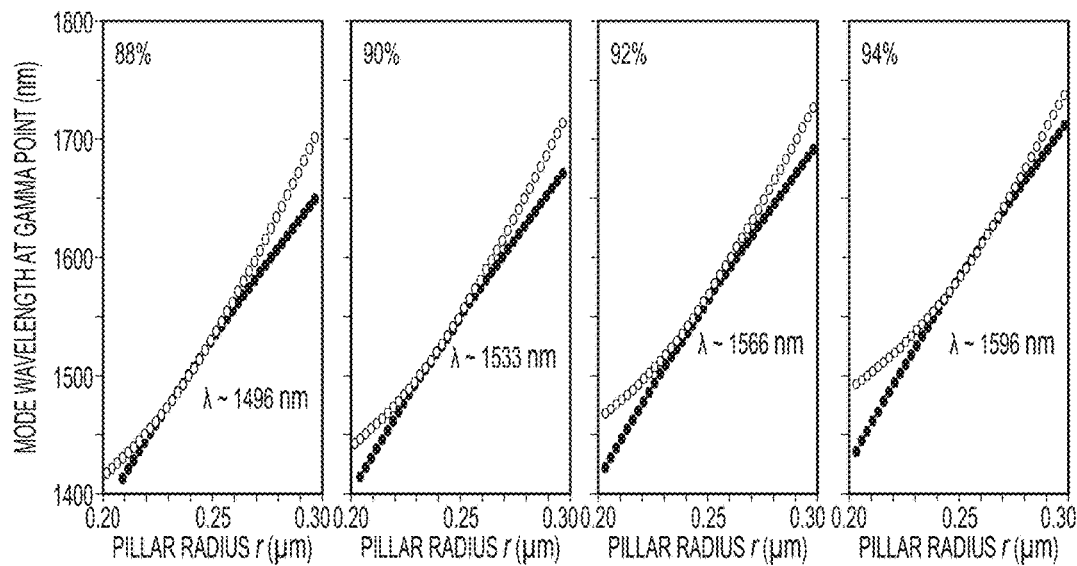

The coefficients may be derived from the approximated functions. By substituting the aforementioned two constrains $\lambda_{mono}=\lambda_{di}$ and $n_{eq\_mono}=n_{eq\_di}$ into these equations, a solution of a=967 nm and $h_{Si}$=897 nm may be obtained. By applying these solved parameters, the optimized robustness was confirmed within the range of r=0.24-0.30 as shown in FIG. 28A, which shows λ as a function of r with the solved parameters (a=967 nm, $h_{Si}$=897 nm, the inset also shows the same parameters). FIG. 28A shows that the modal wavelengths became equal at wavelengths larger than telecommunications wavelength. In various embodiments, λ may be affected by scaling up or down the radius of the pillars. FIGS. 28A to 28D show λ as a function of r with the scaling factor of 88%, 90%, 92%, and 94% respectively. This shows that λ can be tuned to a wavelength within the telecommunications regime by scaling the size of the pillars. Therefore, robustness is maintained with different λ, which means the robustness in an AD-ZIM follows the scaling law. Conveniently, this robustness is referred to herein as "super-robustness."

Figures 29A, 29B, 29C:
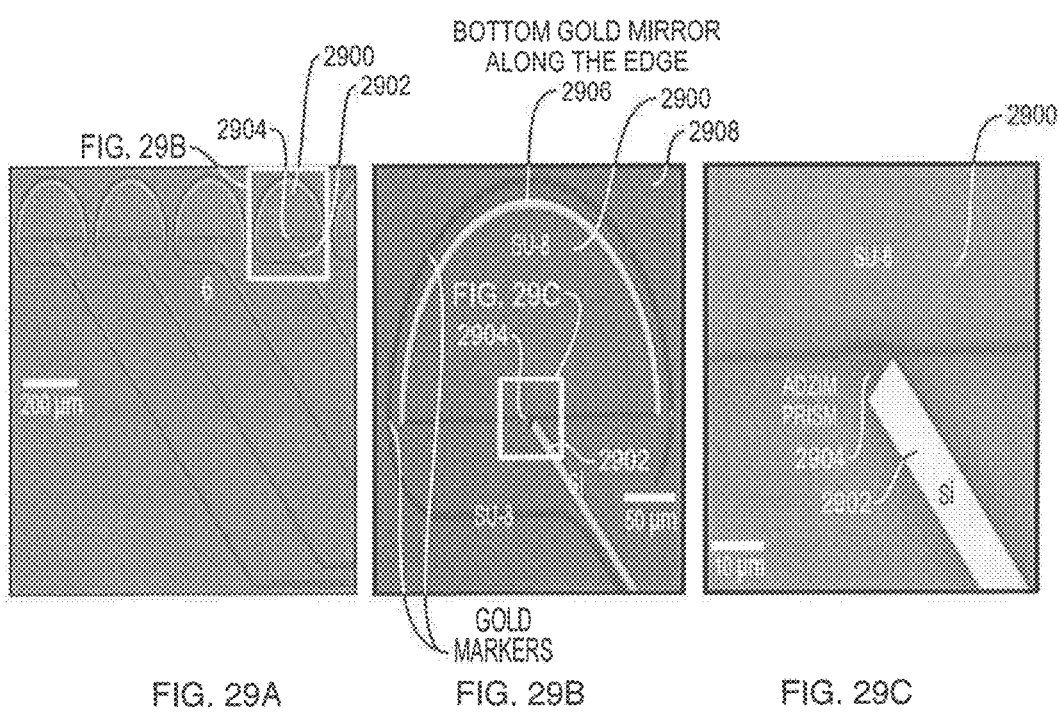
FIGS. 29A-29C show optical microscope images of one of embodiment of a fabricated on-chip AD-ZIM prism device according to aspects of the present invention.

FIGS. 29A-29C show optical microscope images of one embodiment of a fabricated on-chip super-robust AD-ZIM prism device as described above. Further, FIG. 30A shows SEM images of the same fabricated device with the optimized parameters shown and described in relation with FIGS. 29A-29C. Specifically, FIG. 29A shows a photonic chip showing waveguides 2900 and 2902, and AD-ZIM prisms 2904. FIG. 29B shows a zoomed image FIG. 29A, showing the fabricated prism 2904 with silicon waveguide 2902 and SU-8 slab waveguide 2900. FIG. 29C shows a zoomed image of FIG. 29B, showing the prism 2904, which is a right triangular array of all dielectric pillars. More than 20 prism devices with different r were fabricated on the same chip, and each of them was connected to a Si tapered waveguide exciting a plane wave for the input and a semicircular SU-8 slab waveguide to observe the refracted beam output from the prism. To make the scattered light at the edge of the SU-8 slab waveguide more visible, semicircular gold bottom mirrors 2906 were also deposited at the bottom along the SU-8 slab waveguide, as shown in FIG. 29B. Another SU-8 waveguide 2908 surrounding the SU-8 slab waveguide 2900 was used, as shown in FIG. 29B, to observe the scattering light from the gold markers (the relative positions along the SU-8 slab waveguide at −90°, −45°, 45°, and 90°) which indicate the accurate position of the prism for image processing and finding the refracted angle φ as shown in FIG. 30A.

AD-ZIM devices may be fabricated, for example, by a method similar to the method described above in relation to FIG. 7. In one embodiment, AD-ZIM prisms and devices may be fabricated through clean room processes consisting of e-beam lithography and ICP-RIE dry etching, in a manner similar to the methods of fabrication for a ZIM with double mirrors discussed above. But the fabrication steps may be simpler compared to those used for fabricating a ZIM with double mirrors. In one embodiment, a silicon-on-insulator (SOI) wafer may be used with a Si layer of ~850 nm, which is obtained by Si regrown on SOI (e.g., the original thickness of Si layer can be 512 nm). The robustness for this new thickness may be reoptimized, and by using a=918 nm, the robustness satisfying the criteria of near PDC can be obtained in the range of r=240 nm-275 nm with the operation λ being around 1600 nm. FIGS. 29A-29C show optical microscope images and FIG. 30A shows SEM images of the fabricated device with the optimized parameters.

FIG. 30B shows one example of the near field pattern of the scattered light along the edge of the SU-8 slab waveguide 2900, where the white dotted line denotes the edge of the SU-8 slab waveguide 2900. The image was obtained using a near infrared camera, showing scattered light around the prism device with 2r=459 nm when 1570 nm laser light was input from the Si tapered waveguide 2902. Since the prism is not covered by any metal mirrors, the scattering light at the prism is stronger, and the scattered light coming from the refracted beam of the prism is clearly observed at the edge of the SU-8 slab waveguide.

FIG. 30C shows the angular intensity distribution along the edge of the SU-8 slab waveguide 2900 with different λ input from 1480 nm-1 nm, and for different devices having 2r=459 nm, 485 nm and 503 nm respectively. These distributions show that the refraction angle φ changes linearly and gradually around 1500 nm-1650 nm, and it also crosses at zero degree with ~1560 nm, indicating that AD-ZIM is obtained at that λ. Moreover, other prisms with different 2r have also been measured, and show similar behavior with different λ regimes. To quantify φ for each prism with different λ input, 2D Gaussian fitting may be applied to the near field patterns to obtain the estimated $n_{eff}$ with error bars, as shown in FIG. 30D. Based on these results, the zero index λ becomes longer when 2r becomes larger, which is consistent with the simulation results as shown and described above in relation with FIG. 7C. These results show that super-robustness of the designed AD-ZIM is achieved.

Accordingly, various embodiments disclosed herein include ZIMs with double mirrors, LLZIMs and super-robust AD-ZIMs with more simplified structures than ZIMs with double mirrors. Various embodiments of LLZIMs have structures which provide zero index with 30 times better loss by phase destructive interference of the Dipole mode with a proper mirror spacing. Various embodiments of AD-ZIMs and methods of designing super-robust AD-ZIMs are also disclosed. Super-robust AD-ZIMs have been fabricated, and measured on-chip prism devices have demonstrated zero index operation. Robustness allows an on-chip ZIM platform for any operational λ which can be useful for achieving practical applications.

Figure 31:
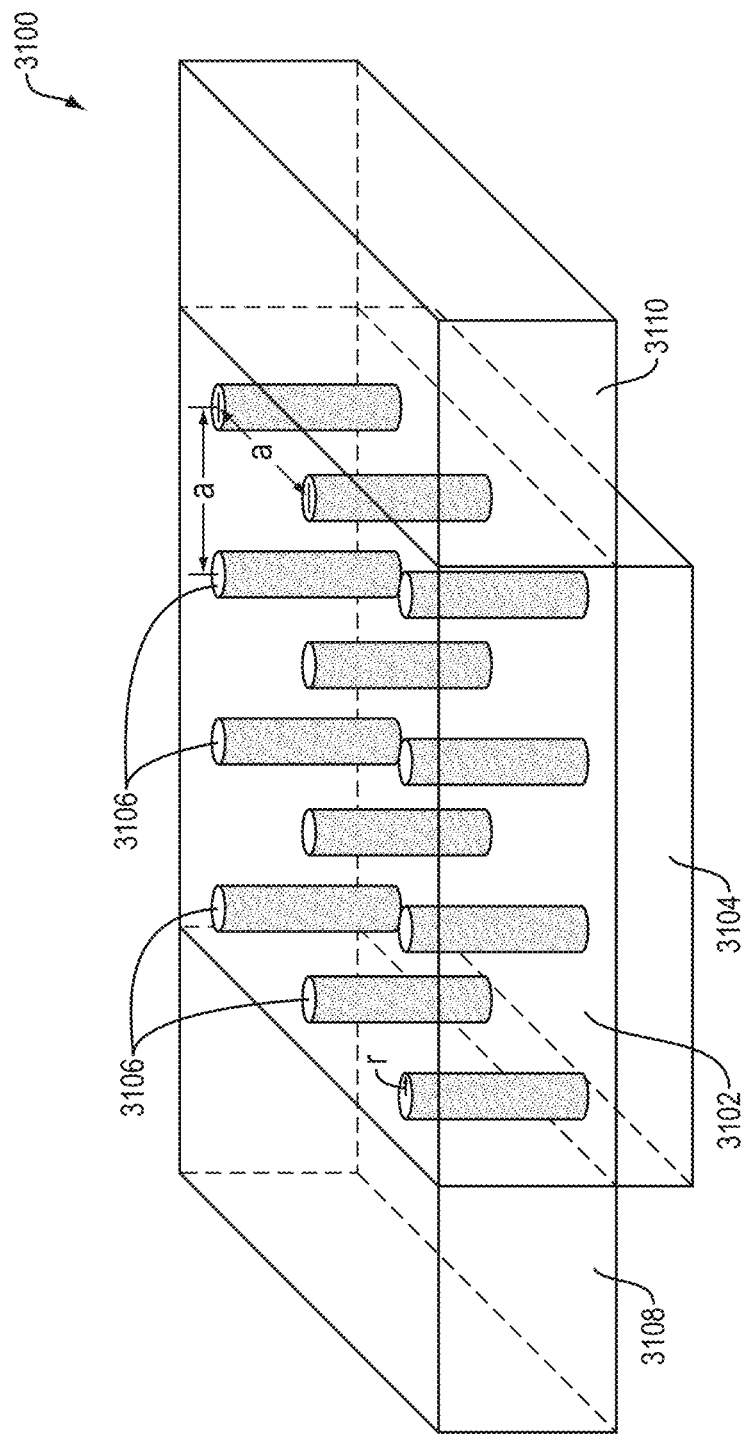

FIG. 31 schematically depicts a photonic structure 3100 according to another aspect of the present teachings, which includes a substrate 3102 disposed on an underlying substrate 3104. A plurality of cavities 3106 are distributed throughout the substrate 3102 according to a two-dimensional or a three-dimensional periodic pattern so as to form a photonic crystal that exhibits a substantially vanishing refractive index for at least one wavelength of electromagnetic radiation propagating through the substrate, e.g., for a wavelength in a range of about 400 nm to about 100 microns. More specifically, in this embodiment, the cavities have substantially cylindrical shapes with a uniform radius (r) and they are distributed within the substrate to form a square lattice characterized by a lattice constant (a). The radius (r) and the lattice constant (a) are selected such that the substrate 3102 having the cavities 3106 is a photonic crystal exhibiting a Dirac cone or near Dirac cone at the center of the Brillouin zone of its reciprocal lattice. As discussed above, such a Dirac cone or near Dirac cone can lead to a substantially vanishing refractive index at a frequency (wavelength) associated with k=0 and a finite impedance. Although in this embodiment the cavities 3106 are distributed so as to form a square lattice, in other embodiments the cavities can be distributed according to other periodic patterns. For example, the cavities can be distributed to form orthorhombic, monoclinic, triclinic, tetragonal, trigonal, or hexagonal lattices. Further, in some embodiments, the cavities can have different shapes. For example, a unit cell can have an irregular shape designed, e.g., by an design method discussed below two cylinders with different radii.

In some embodiments, each cavity can extend from a top surface of the upper substrate 3102 to a bottom surface thereof (i.e., the surface of the substrate 3102 that is in contact with the underlying substrate 3104). Alternatively, at least some of the cavities can extend from the top surface of the upper substrate 3102 partially into that substrate. Further, in some embodiments, at least some, or all of the cavities, can be formed below the top surface of the upper substrate 3102.

In this embodiment, the upper substrate 3102 supporting the cavities 3106 is a silicon layer having a thickness, e.g., in a range of about 100 nm to about 2 micrometers, and the underlying substrate 3104 is an $SiO_2$ layer having a thickness, e.g., in range of about 1 micron to a few microns. In other embodiments, the upper substrate 3102 and the underlying layer 3104 can be formed of other materials. For example, the substrate 3102 can be formed of any suitable dielectric material. In some cases, the substrate 3102 can be a semiconductor. Some examples of suitable materials for forming the substrate 3102 include, without limitation, silicon, diamond, $TiO_2$, aluminum oxide, silicon nitride ($Si_3N_4$), InGaAsP, GaN, and InGaN. Similarly, the underlying layer 3104 can be formed of a variety of different materials. Some examples include, without limitation, $SiO_2$ and other oxides, such as $TiO_2$. Further, in this embodiment, the cavities are filled with air, though in other embodiments, they may be filled with another gas.

With continued reference to FIG. 31, in this exemplary embodiment, the lattice constant (a) and the radius of the cylindrical cavities (r) are selected such that the substrate would exhibit a substantially vanishing refractive index for at least one wavelength of the electromagnetic radiation. By way of example, in some embodiments, the lattice constant (a) can be in a range of about λ/10 to about λ and the radius (r) of the cavities can be in a range of about λ/20 to about λ/2.

With continued reference to FIG. 31, the photonic structure 3100 can include an input waveguide 3108 for coupling radiation into the substrate 3102 and an output waveguide 3110 for coupling the radiation out of that substrate.

Figure 32:
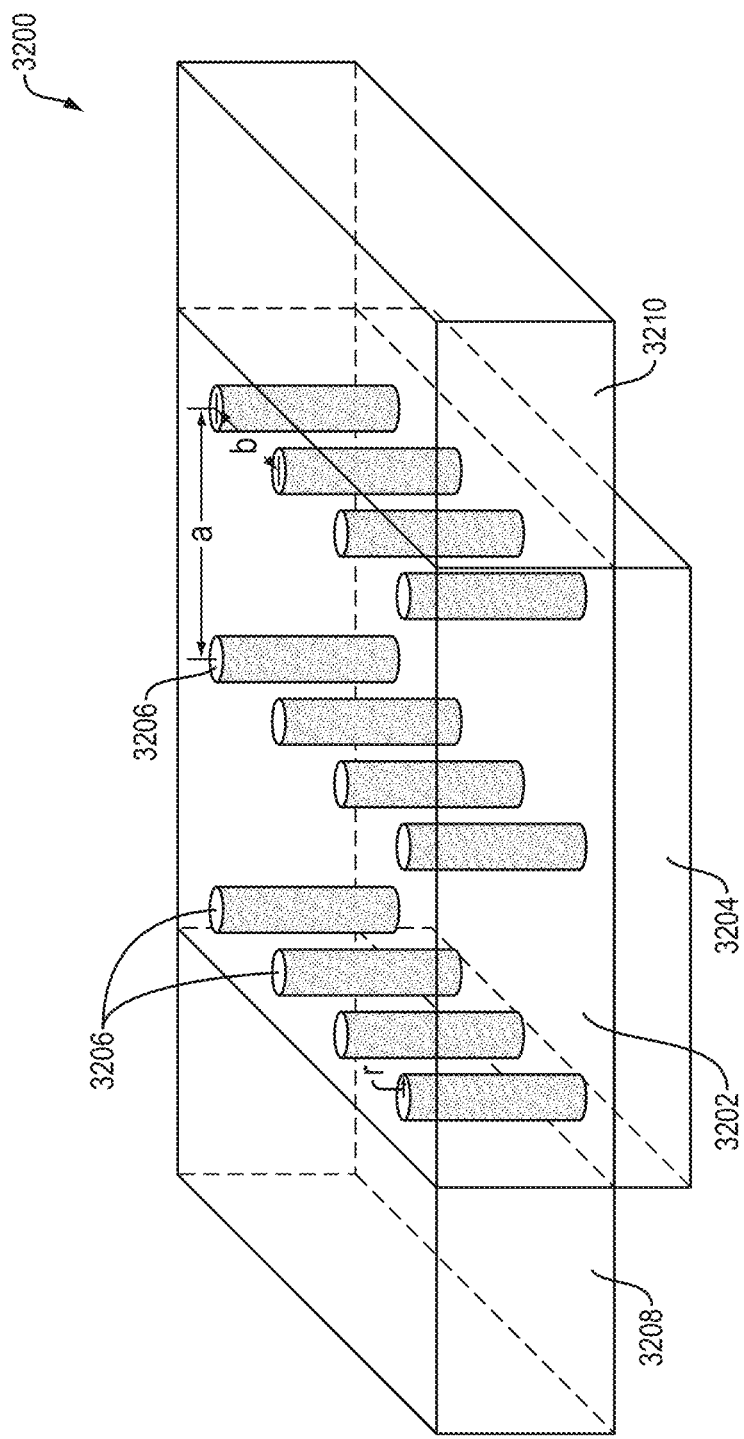

The cavities can be distributed in the substrate to form a lattice other than a cubic lattice. By way of example, FIG. 32 schematically depicts a photonic structure 3200 according to another embodiment, which includes a substrate 3202 in which a plurality of cavities 3204 are distributed. In this embodiment, the cavities are distributed within the substrate as a three-dimensional lattice characterized by two lattice constants (a) and (b). Similar to the previous embodiments, the cavities are cylindrically-shaped with a uniform radius (r). The parameters (a), (b), and (r) are selected, e.g., by employing a method discussed below, such that the photonic structure 3200 would exhibit a substantially vanishing refractive index for at least one wavelength of the electromagnetic radiation propagating through the substrate, e.g., a wavelength in a range of about 400 nm to about 100 microns. Similar to the previous embodiment, the photonic structure 3200 can have an input waveguide 3208 and an output waveguide 3210.

In the above exemplary embodiments, the cavities have a generally cylindrical shape. In other embodiments, the cavities can have other shapes. By way of example, the cavities can have an ovoid shape, a cylindrical shape, or any other regular or irregular shape suitable for practicing the teachings of the invention.

Figure 33A:
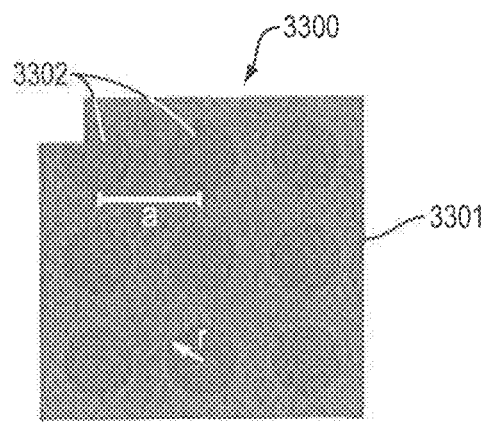
FIG. 33B shows calculated band structure for the two-dimensional structure of FIG. 33A with a=582.8 nm and r=182.0 nm.
FIGS. 33C-33E show calculated out-of-plane component of the H-field ($H_z$) for three degenerate modes that intersect at the Γ-point.
Figure 33B:
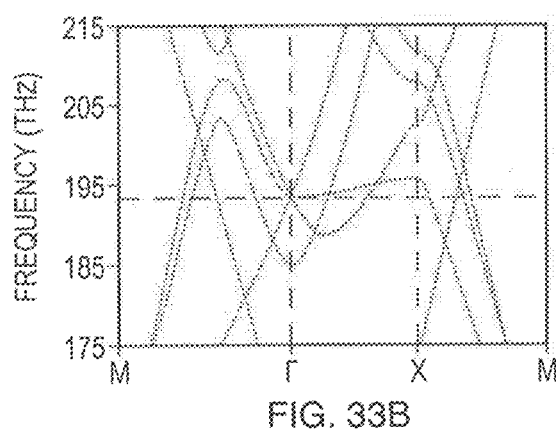
Figure 33C:
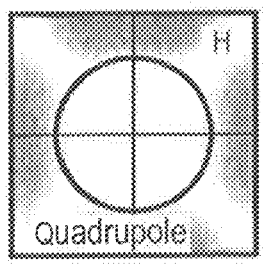
Figure 33D:
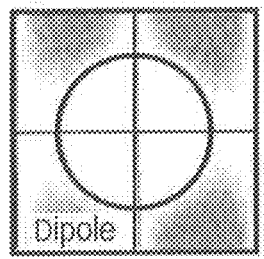
Figure 33E:
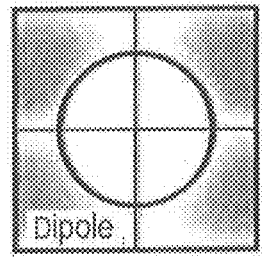

By way of further illustration, FIG. 33A schematically shows a hypothetical two-dimensional photonic structure 3300 comprising a bulk silicon substrate 3301 (n=3.48), which includes a two-dimensional square array of holes 3302 with a lattice constant (a) and a radius (r). These parameters were theoretically tuned until a Dirac cone was formed at the Γ-point at f=193.4 THz (i.e., λ=1550 nm). FIG. 33B shows the calculated resulting band structure for TE-polarized excitation (i.e., the magnetic field pointing out-of-plane of the array) for an array with a pitch of a=582.8 nm and a hole radius of r=182.0 nm. The bands that form the cone intersect linearly, thus fulfilling the condition for zero-index operation. At shorter frequencies, a photonic band-gap appears in the Γ-X direction. In FIGS. 33C, 33D and 33D, the calculated field profiles of three degenerate modes at the Γ-point are depicted. These degenerate modes include two dipole modes and a quadrupole mode. The two dipole modes can be combined to form a mode that points towards any arbitrary direction in the xy-plane.

Figure 34A:
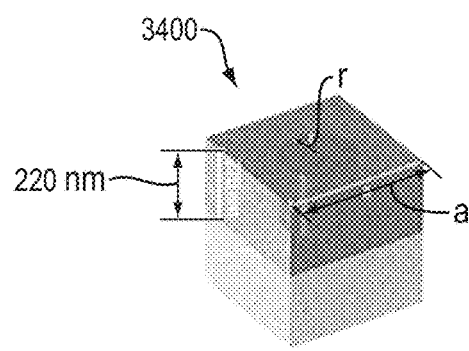
FIG. 34A shows a unit cell of a hypothetical photonic structure comprising a plurality of airholes formed in a 220-nm tall Si-on-SiO$_2$ film.
Figure 34B:
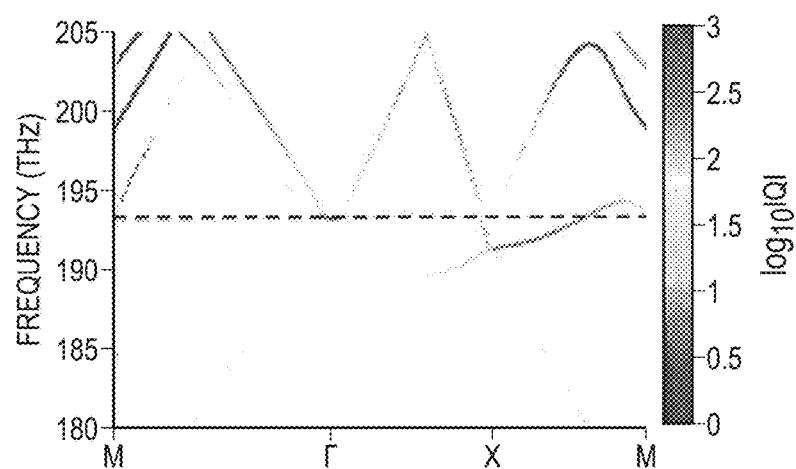
FIG. 34B shows the calculated band structure for a two-dimensional square array of the unit cell shown in FIG. 34A with a pitch a=728 nm and a radius r=222 nm.
Figure 34C:
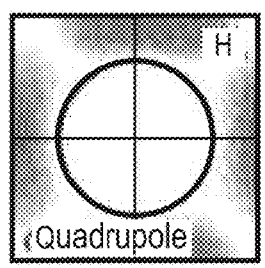
FIGS. 34C-34E show calculated out-of-plane component of the H-field (H$_z$) of three degenerate modes that intersect at the Γ-point.
Figure 34D:
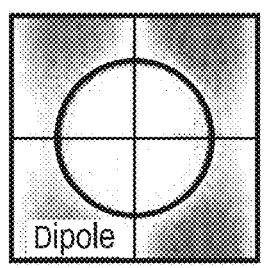
Figure 34E:
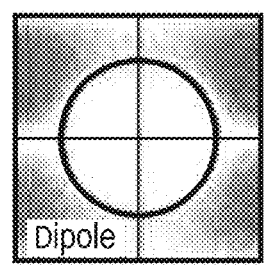
Figure 35:
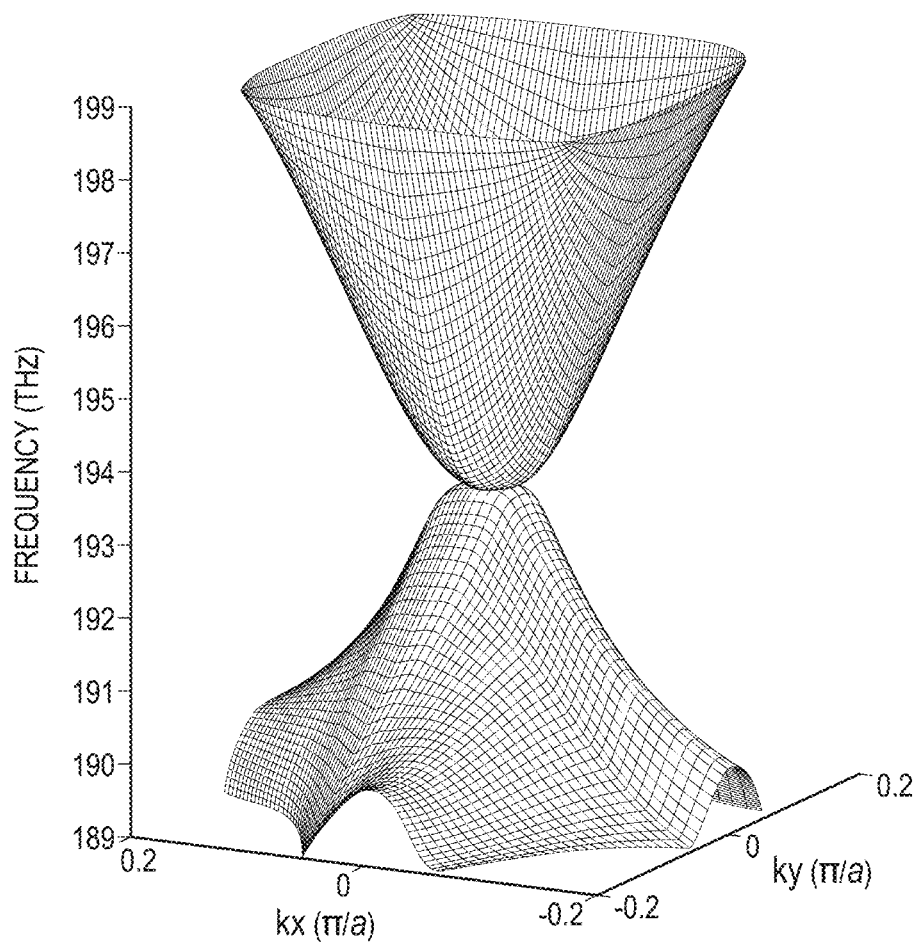
FIG. 35 is a plot of the complete dispersion surface for the modes that form the Dirac cone for the photonic structure associated with the unit cell of FIG. 34A, FIGS. 36A and 36B show equifrequency contours for the dispersion surface depicted in FIG. 35.

By way of another example and with reference to FIGS. 34A, 34B, 34C, 34D, and 34E, a hypothetical three-dimensional photonic structure 3400 was theoretically analyzed, where the photonic structure was assumed to include a 220-nm tall Si-on-SiO$_2$ film in which a square array of airhole structures were distributed. The film thickness was selected for its compatibility with CMOS fabrication processes and because of the well-established single-mode condition for the TE-polarized light. For a square array of airhole structures with a pitch of a=728 nm and a radius r=222 nm, the band structure shown in FIG. 34B was calculated, which shows three modes intersecting at the Γ point, forming a photonic Dirac cone at f=193.4 THz. Similar to the previous case, two of the modes have dipole field profiles and the third has a quadrupole field profile, as depicted in FIGS. 34C, 34D, and 34E. Further, the calculated band structure shows that the three modes intersect linearly. FIG. 35 shows a calculated dispersion surface for the modes that form the Dirac cone, demonstrating the finely-tuned degeneracy between the modes of interest at the selected zero-index frequency (i.e., 193 THz in this case).

Figure 36A:
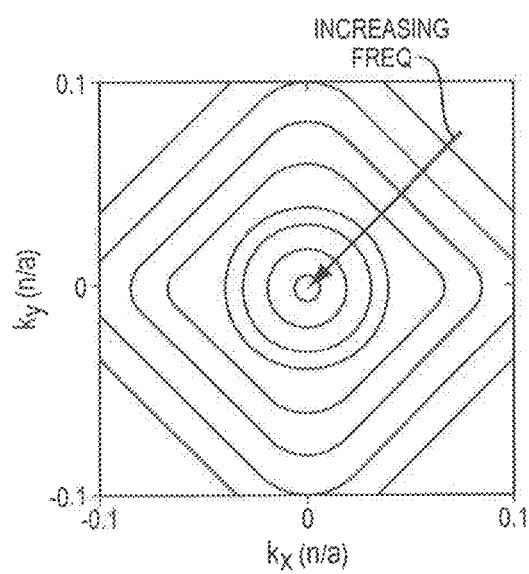
FIG. 36C shows the radius of the equifrequency contours of FIGS. 36A, 36B as a function of frequency.
FIG. 36D shows the order of the supercircles of the equifrequency contours as a function of frequency.
Figure 36B:
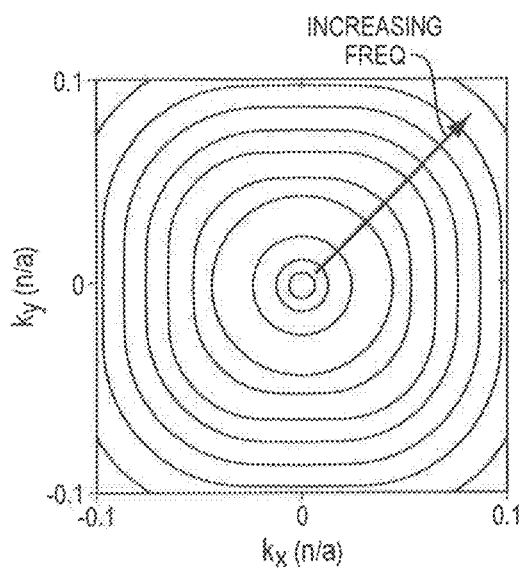
Figure 36C:
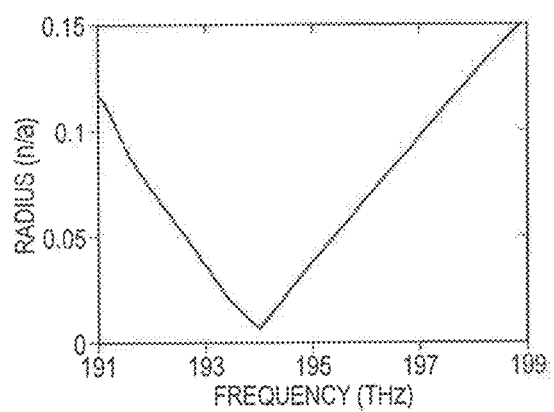
Figure 36D:
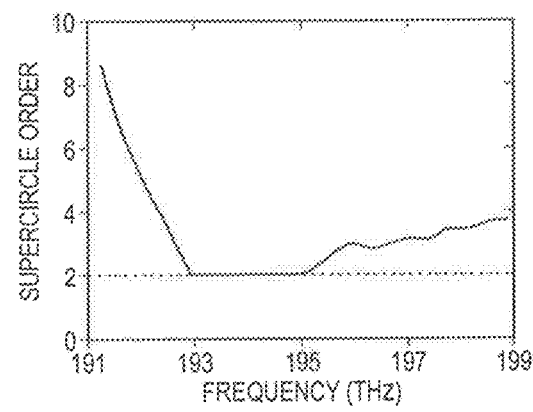

As the operating frequency deviates from the zero-index frequency, the modes supported by this structure form perfect circles in the Brillouin zone. At larger deviations, the circles gradually relax into supercircles, which obey the relation: $x^n + y^n = r^n$. Such supercircles can be illustrated more clearly by slicing the cone into its equifrequency contours, as shown in FIGS. 36A and 36B. Each contour can be fitted to a supercircle, and the extracted radii r and supercircle orders n can be plotted as shown in FIGS. 36C-36D. The equifrequency contours that fit to perfect circles for n=2 indicate that the associated modes are isotropically distributed around the Γ-point. In particular, FIG. 36D shows that the photonic structure behaves like an isotropic metamaterial for the frequencies between f=192.9-195.2 THz, corresponding to a bandwidth of greater than 18 nm about the center wavelength: λ=1550 nm. In FIG. 36C, the extracted supercircle radii first decrease and then increase as a function of frequency, both with a very linear trend ($R^2$=0.99), further exhibiting that the photonic structure behaves like an isotropic metamaterial.

Figure 37A:
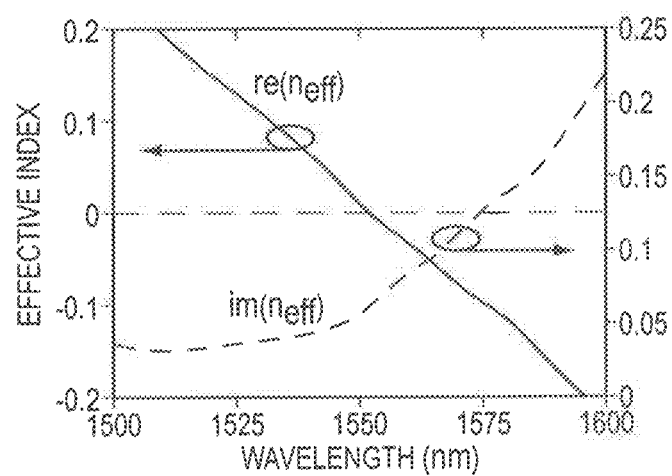
FIG. 37A shows retrieved real and imaginary components of the calculated effective refractive index of the photonic structure formed from the unit cell shown in FIG. 34A, indicating a zero-index at a wavelength of 1550 nm.
Figure 37B:
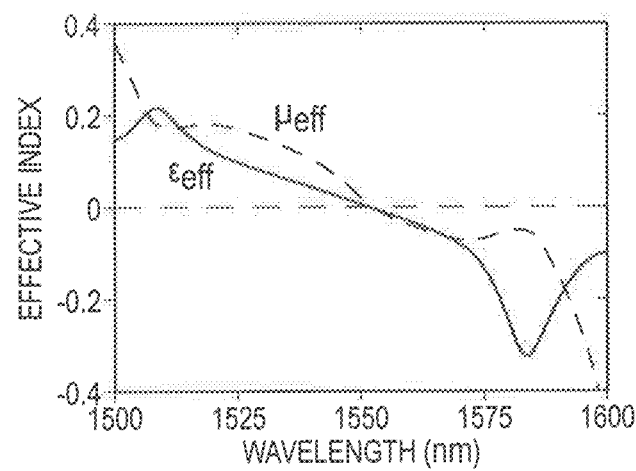
FIG. 37B shows the real components of the effective permittivity $\varepsilon_{eff}$ and effective permeability $\mu_{eff}$ associated with the refractive index shown in FIG. 37A, indicating that both permittivity and permeability cross zero at the wavelength of 1550 nm.

By way of further illustration, the transmission of the fundamental TE-polarized mode (i.e., the H-field's dominant component pointing out of the plane) of a 2D-slab in which a row of airhole unit cells were distributed was simulated. The pitch and radius of this airhole structure were: a=728 nm and r=222 nm. The transmitted and reflected fields were monitored and a parameter retrieval on the scattered fields was performed. This procedure yielded complex values for the effective permittivities and permeabilities, or alternatively, the effective refractive index and impedance. FIG. 37A shows plots of the calculated real and imaginary components of the effective refractive index, indicating that the real part of the index decreases smoothly and linearly from positive values towards negative values, with an effective index of zero near λ=1550 nm. The imaginary component of the refractive index at this wavelength is Im[$n_{eff}$]=0.054. As the wavelength increases from this point, the imaginary component of the index increases drastically, which is due to the appearance of a photonic band gap, as illustrated in FIG. 34B. It is noteworthy that at the zero-index frequency, the real components of the retrieved effective permittivity $\varepsilon_{eff}$ and permeability $\mu_{eff}$ both simultaneously cross zero as shown in FIG. 37B, thus resulting in an impedance-matched "double-zero" material.

Figure 38A:
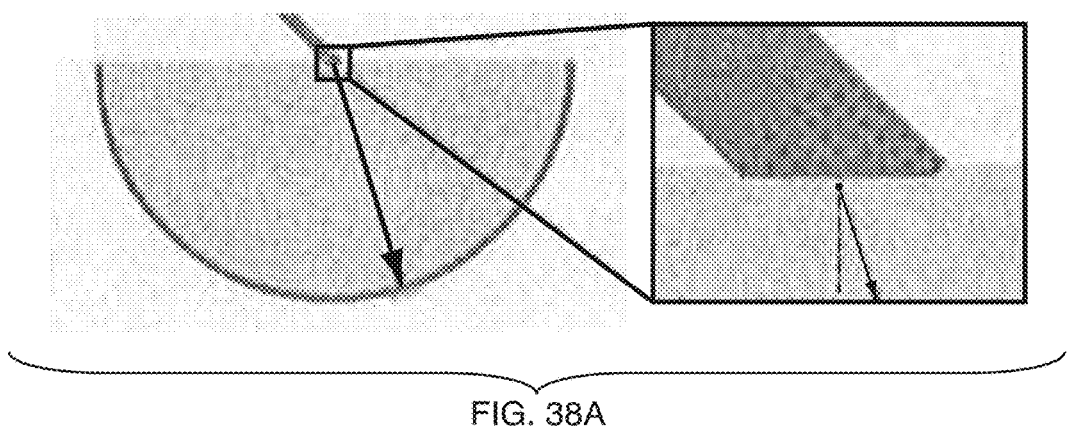
FIG. 38A shows a fabricated chip having a photonic structure in the form of a right-angled prism formed of 20×20 unit cells according to an embodiment of the invention, which includes a plurality of regularly-positioned holes in a substrate.

By way of further illustration and with reference to FIG. 38A, a right-angled prism having a 20×20 cell array of airholes was fabricated using standard photonics fabrication process. More specifically, a patterned layer of a negative-tone resist (XR 6%) was formed on a 220-nm thick silicon-on-insulator (SOI) wafer in a single step of electron-beam lithography. The sample was then subjected to inductively-coupled plasma reactive ion etching (ICP RIE) in a SF$_6$:C$_4$F$_8$ atmosphere at a ratio of 13:8 until the pattern was completely transferred into the silicon device layer. A TE-polarized input beam was introduced onto one face of the prism using a silicon waveguide having a width that was the same as the width of the input face of the prism. At the zero-index frequency, it is expected that the light would exit the prism at an angle α that is normal to all of its faces (α→0°), regardless of the index of the surrounding medium. This conditioned is derived from Snell's law:

$$\sin(\alpha) = \frac{n_1 \sin(45°)}{n_2},$$

$$n_1 = 0 \rightarrow \alpha = 0$$

Figure 38B:
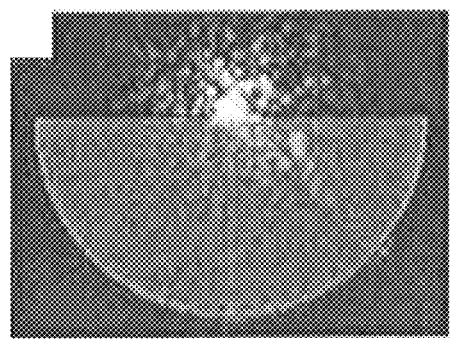
FIG. 38B shows an image of unpolarized light at a wavelength of 1674 nm after passage through the photonic structure of FIG. 38A showing a beam at α=0, confirming that the prism has an effective refractive index of zero at that wavelength.
Figure 39A:
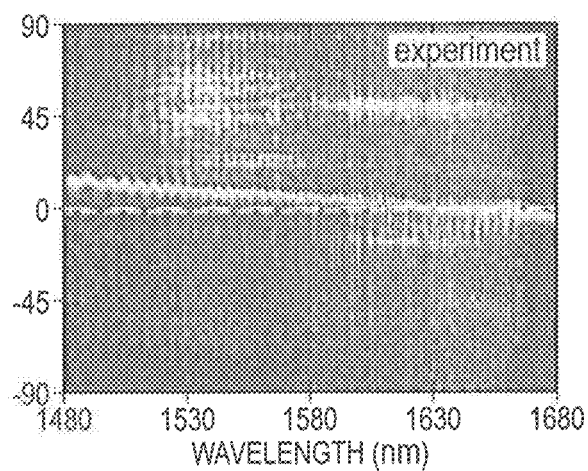
FIG. 39A shows experimental far-field pattern for light passing through the right-angled prism depicted in FIG. 38A.
Figure 39B:
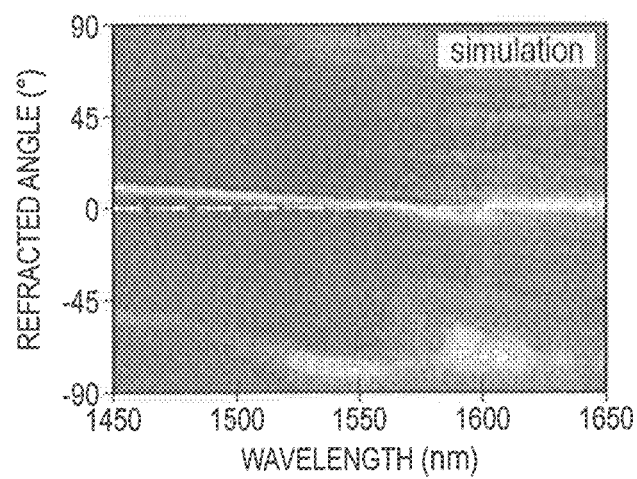
FIG. 39B shows simulated far-field pattern for light passing through the right-angled prism depicted in FIG. 38A.

The output light from the prism was collected in a 1.5-μm tall SU-8 slab waveguide shaped like a semicircle with a diameter of 1 mm. A silicon ring designed to scatter light into an imaging objective above the chip was placed under the output face of the slab waveguide. FIG. 38B shows the resulting image at λ=1640 nm. This wavelength is about 5% larger than the designated operating wavelength, within the expected fabrication tolerances of e-beam lithography. A beam appeared at α=0°, corresponding to refraction through a prism with a refractive index of zero. A secondary beam appeared at α=45°, which corresponds to the output beam for TM-polarized input, in agreement with simulations. This beam can be eliminated by using a polarizer at the input of the prism and by polishing the input facet to prevent polarization scrambling. The measurement was repeated by sweeping the wavelengths from λ=1480 to λ=1680 nm at an interval of Δλ=1 nm. The intensity of the outer scattering ring is plotted as a function of wavelength in FIG. 39A. This figures shows that the beam angle decreases smoothly from positive angles at shorter wavelengths to negative angles at longer wavelengths, crossing α=0° at around λ=1640 nm. This data can be interpreted to mean that the prism possesses a small positive effective refractive index at shorter wavelengths, an index of 0 around λ=1640 nm, and a small negative index at larger wavelengths. This trend agrees qualitatively with the retrieved index in FIG. 37A. FIG. 39B shows simulated angle of the output beam as a function of wavelength, indicating excellent agreement with the measured far-field patterns.

As noted above, in many embodiments, a zero-index metamaterial according to the present teachings exhibits a monopole mode (or alternatively, a quadrupole mode) and two dipole modes at the center of the Brillouin zone (i.e., the gamma point). By designing a lattice where these two modes become degenerate (that is, where their two eigenfrequencies coincide) at the gamma point, a lattice can be formed that would exhibit a substantially vanishing, and preferably a zero refractive index.

Figure 40:
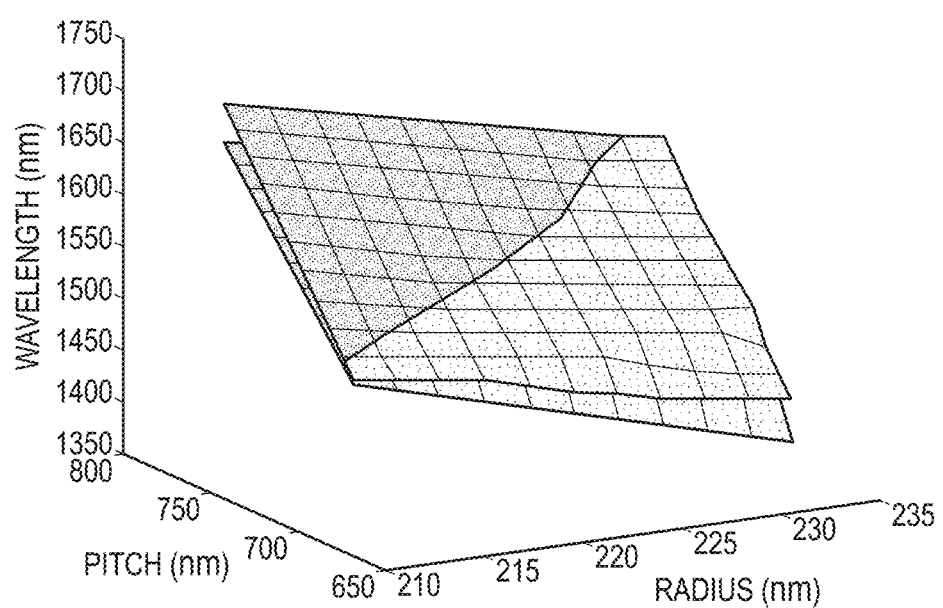
FIG. 40 shows calculated wavelengths of the dipole modes and the quadrupole mode for a square lattice of airholes as a function of the pitch and hole radius.

In some embodiments, a method for designing a zero-index metamaterial according to the present teachings, which includes a plurality of cavities formed as a regular lattice in a substrate, involves using a finite-element methods solver (e.g., COMSOL Multiphysics software marketed by COMSOL, Inc. of Massachusetts, U.S.A.) to construct a single unit cell of a lattice that can exhibit the modal degeneracies noted above. The lateral boundary conditions can be set to be Bloch (or Floquet) boundary conditions with a k-vector of 0. For example, a square lattice of circular holes in a 220-nm-thick silicon film on a $SiO_2$ substrate can be modeled. The modes of such a structure can be solved for a variety of lattice parameters to locate the dipole and quadrupole modes. Due to symmetry, the two dipole modes have identical eigenfrequencies at the gamma point. FIG. 40 is a plot of the eigenfrequencies of these modes (dipole mode and the quadrupole mode) at the gamma point for a large set of pitches and radii for a square lattice of airholes. A zero-index operation is expected wherever these two modes intersect.

Figure 41:
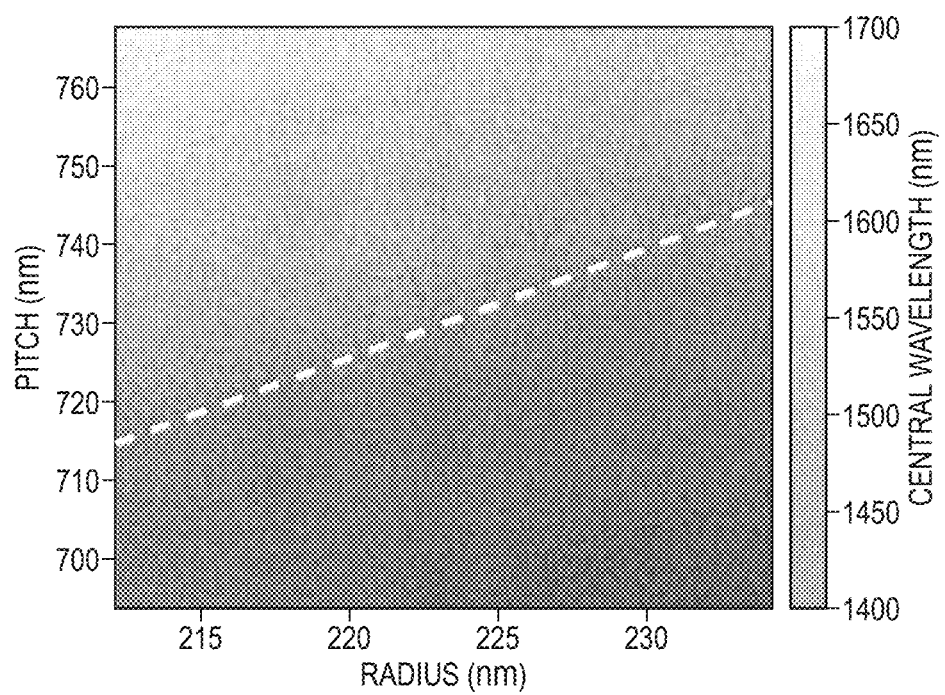
FIG. 41 shows calculated central wavelength between the two modes (i.e., between the dipole and quadrupole modes) associated with the data presented in FIG. 40 as a function of lattice parameters (the design wavelength of 1550 nm is indicated by the dashed line)
Figure 42:
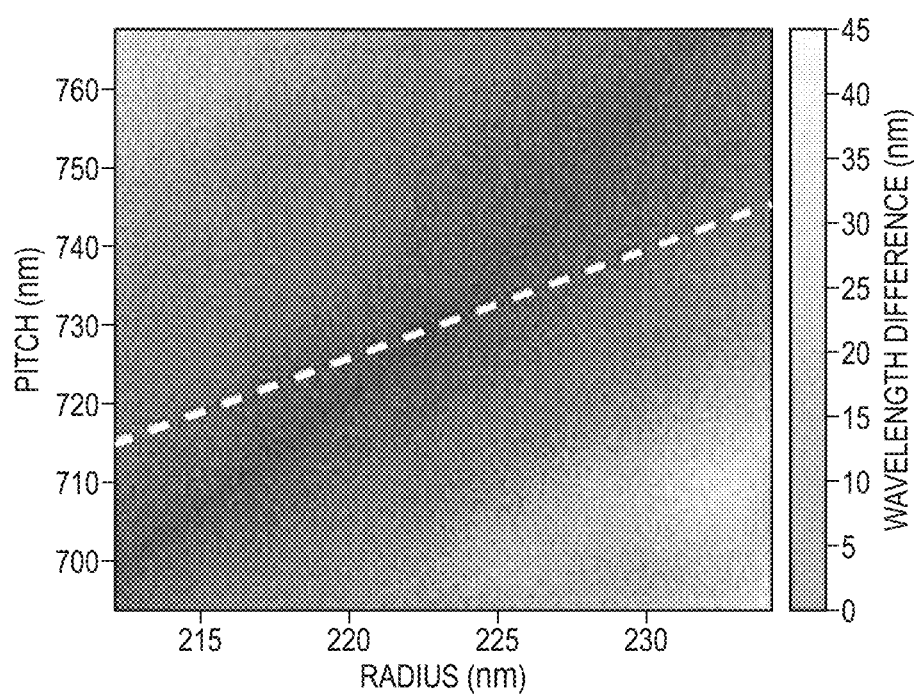
FIG. 42 shows the absolute difference between the wavelengths of the two modes associated with the data presented in FIGS. 40 and 41 as a function of lattice parameters, and FIG. 43 schematically shows various stages in processing a substrate to form a zero-index metamaterial according to the present teachings.

To locate the optimal lattice parameters for achieving zero-index operation at a given design wavelength (e.g., at a wavelength of 1550 nm), average mode wavelength between the modes (between the dipole mode and the quadrupole mode) as a function lattice parameters is extracted from the dataset shown in FIG. 40. FIG. 41 is a plot of the central wavelength between the modes as a function of lattice parameters (the dashed line indicates the design wavelength). Subsequently, the absolute wavelength (or frequency) difference between the two modes can be plotted to find structures that exhibit modal degeneracy, as shown in FIG. 42 in which the dashed line corresponds to the design wavelength of 1550 nm. The optimal pitch and radius of the lattice of the airholes correspond to the intersection of the design frequency (wavelength) with the area in the parameter space associated with the modal degeneracy. In this example, the intersection corresponds to a lattice pitch of 730.4 nm and a hole radius of 223.3 nm. With these parameters, a perfect degeneracy of the three modes (two dipole modes and a quadrupole mode) at the design wavelength of 1550 nm can be achieved.

Figure 43:
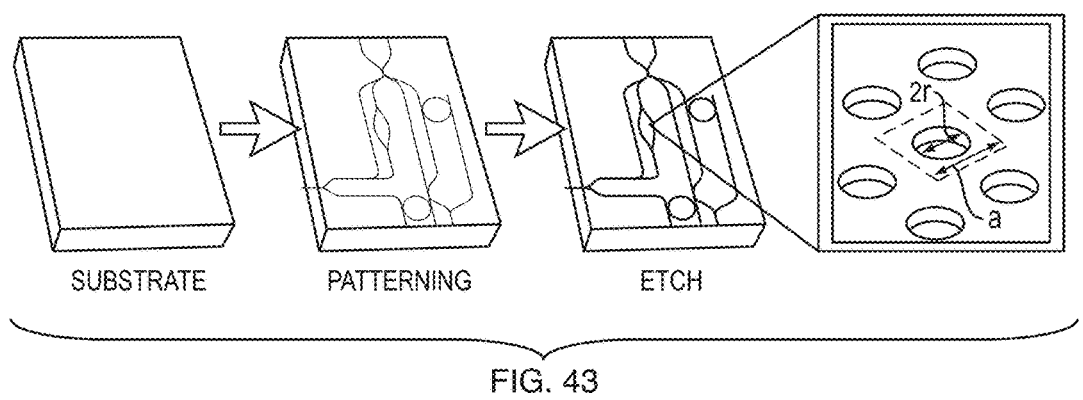

The known photonics manufacturing techniques can be employed to fabricate photonic structures according to the present teachings, which include a lattice of cavities formed in a substrate. By way of example and with reference to FIG. 43, such a metamaterial can be fabricated using a silicon-on-insulator (SOI) wafer, e.g., with a top silicon layer having a thickness of 220 nm. A negative-tone resist (e.g., XR-1541 6%, Dow Corning) disposed on a top surface of the silicon layer can be patterned to define the areas corresponding to the airhole matrix of cavities, input waveguides, and silicon "lip," which will be ultimately beneath the outside edge of the SU-8 slab waveguide, using electron-beam lithography (EBL). Inductively coupled plasma reactive ion etching (ICP-RIE) can then be used to remove silicon from the volumes corresponding to the airholes so as to generate the airholes and to remove silicon surrounding the waveguides. The remaining negative-tone resist can then be removed using, e.g., 7:1 Buffered Oxide Etch (BOE). A 1.5-μm thick SU-8 layer can be spin-coated and patterned using EBL to form the output slab waveguide, and then cured. Finally, a 2-m thick SU-8 can be fabricated using the same method to form a calibration waveguide used to align images taken with an near infrared (NIR) camera.

Those having ordinary skill in the art will appreciate that various changes can be made to the above embodiments without departing from the scope of the invention.

All of the publications disclosed herein are incorporated by reference in their entirety.

The invention claimed is:

1. A photonic crystal, comprising:
a plurality of periodically repeating structures, said structures being configured and arranged relative to one another such as to form a band structure providing at least two substantially degenerate states at the center of the Brillouin zone of a reciprocal lattice of the photonic crystal for at least one wavelength in the optical regime,
a metal layer, and
a distributed Bragg reflector,
wherein said plurality of periodically repeating structures are sandwiched between said metal layer and said distributed Bragg reflector for confining electromagnetic radiation entering said repeating structures within a plane of said structures.

2. The photonic crystal of claim 1, wherein said repeating structures comprise a plurality of pillars.

3. The photonic crystal of claim 1, wherein said pillars comprise a dielectric material exhibiting a real refractive index contrast relative to a material surrounding the pillars that is greater than about 1.

4. The photonic crystal of claim 1, wherein said pillars have substantially cylindrical shapes with a radius of about ⅛ of said at least one wavelength.

5. The photonic crystal of claim 3, wherein said pillars have a maximum height of about ⅓ of said at least one wavelength.

6. A photonic structure, comprising:
a substrate,
a plurality of periodically repeating cavities formed in said substrate, said cavities being sized and arranged relative to one another such that said photonic structure exhibits a substantially vanishing refractive index for at least one wavelength of electromagnetic radiation propagating through said photonic structure,
at least one metal layer disposed on top or bottom of said repeating structures for confining electromagnetic radiation entering said repeating structures within a plane of said structures,
wherein said photonic structure exhibits a finite real impedance at said at least one wavelength.

7. The photonic structure of claim 6, wherein said photonic structure exhibits an imaginary refractive index less than about 0.05 for said at least one wavelength.

8. The photonic structure of claim 6 wherein said at least one wavelength of the electromagnetic radiation is in a range of about 400 nm to about 100 microns.

9. The photonic structure of claim 6, wherein said substrate has a thickness in a range of about 100 nm to about 2 microns.

10. The photonic structure of claim 6, wherein said cavities are substantially cylindrical.

11. The photonic structure of claim 9, wherein said cylindrical cavities have a radius in a range of about $\lambda/20$ to about $\lambda/2$, where $\lambda$ is the operating wavelength.

12. The photonic structure of claim 6, wherein said cavities form any of a two-dimensional or a three-dimensional lattice.

13. The photonic structure of claim 6, wherein said cavities are filled with a gas.

* * * * *